(12) United States Patent
Han et al.

(10) Patent No.: US 9,824,726 B2
(45) Date of Patent: Nov. 21, 2017

(54) SEMICONDUCTOR DEVICE HAVING AIR-GAP

(71) Applicant: SAMSUNG ELECTRONICS CO., LTD., Suwon-Si, Gyeonggi-Do (KR)

(72) Inventors: Jung-Hoon Han, Hwaseong-si (KR); Dong-Wan Kim, Hwaseong-si (KR); Ju-Ik Lee, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/164,442

(22) Filed: May 25, 2016

(65) Prior Publication Data

US 2016/0267949 A1 Sep. 15, 2016

Related U.S. Application Data

(62) Division of application No. 14/554,113, filed on Nov. 26, 2014, now Pat. No. 9,379,002.

(30) Foreign Application Priority Data

Mar. 17, 2014 (KR) ........................ 10-2014-0031080

(51) Int. Cl.
  *H01L 21/00* (2006.01)
  *G11C 5/06* (2006.01)
  *H01L 21/764* (2006.01)
  *H01L 27/108* (2006.01)
  *H01L 23/528* (2006.01)
  *H01L 23/535* (2006.01)
  *H01L 27/105* (2006.01)
  (Continued)

(52) U.S. Cl.
  CPC ............ *G11C 5/063* (2013.01); *H01L 21/764* (2013.01); *H01L 23/528* (2013.01); *H01L 23/535* (2013.01); *H01L 23/5329* (2013.01); *H01L 27/105* (2013.01); *H01L 27/10885* (2013.01); *H01L 27/10888* (2013.01); *G11C 7/18* (2013.01); *H01L 23/53295* (2013.01); *H01L 2924/0002* (2013.01)

(58) Field of Classification Search
  CPC .. H01L 23/5329; H01L 23/528; H01L 27/105
  See application file for complete search history.

(56) References Cited

U.S. PATENT DOCUMENTS 8,198,189 B2 6/2012 Kim et al.
9,099,343 B2 * 8/2015 Kim .................. H01L 27/10855
(Continued)

FOREIGN PATENT DOCUMENTS

KR 10-2013-0022872 A 3/2013
KR 20150108194 A * 9/2015 ........... H01L 21/764

*Primary Examiner* — Laura Menz
(74) *Attorney, Agent, or Firm* — Volentine & Whitt, PLLC

(57) ABSTRACT

A semiconductor device includes a bit line structure located on a semiconductor substrate, an outer bit line spacer located on a first side surface of the bit line structure, an inner bit line spacer including a first part located between the bit line structure and the outer bit line spacer and a second part located between the semiconductor substrate and the outer bit line spacer, and a block bit line spacer located between the outer bit line spacer and the second part of the inner bit line spacer. A first air-gap is defined by the outer bit line spacer, the inner bit line spacer, and the block bit line spacer.

14 Claims, 90 Drawing Sheets

(51) Int. Cl.
  *H01L 23/532* (2006.01)
  *G11C 7/18* (2006.01)

(56) References Cited

U.S. PATENT DOCUMENTS

| | | | |
|---|---|---|---|
| 9,214,382 B2* | 12/2015 | Lee | H01L 21/764 |
| 2012/0168899 A1* | 7/2012 | Kim | H01L 21/7682 |
| | | | 257/522 |
| 2013/0093093 A1 | 4/2013 | Lee | |
| 2013/0320550 A1* | 12/2013 | Kim | H01L 21/76897 |
| | | | 257/773 |
| 2014/0054659 A1* | 2/2014 | Seo | H01L 29/41775 |
| | | | 257/288 |
| 2014/0110816 A1* | 4/2014 | Kim | H01L 27/10855 |
| | | | 257/499 |
| 2014/0291804 A1* | 10/2014 | Kim | G11C 11/4099 |
| | | | 257/532 |
| 2015/0056801 A1* | 2/2015 | Park | H01L 21/76814 |
| | | | 438/655 |
| 2015/0061134 A1* | 3/2015 | Lee | H01L 21/764 |
| | | | 257/751 |
| 2015/0126013 A1* | 5/2015 | Hwang | H01L 27/10888 |
| | | | 438/381 |
| 2015/0179651 A1* | 6/2015 | Park | H01L 27/10885 |
| | | | 257/296 |
| 2015/0228754 A1* | 8/2015 | Sung | H01L 29/6656 |
| | | | 438/595 |
| 2015/0255466 A1* | 9/2015 | Hwang | H01L 21/02164 |
| | | | 438/586 |
| 2015/0262625 A1* | 9/2015 | Han | H01L 21/764 |
| | | | 257/773 |
| 2015/0333071 A1* | 11/2015 | Kim | H01L 27/10855 |
| | | | 438/510 |
| 2016/0267949 A1* | 9/2016 | Han | H01L 21/764 |

* cited by examiner

SEMICONDUCTOR DEVICE HAVING AIR-GAP

CROSS-REFERENCE TO RELATED APPLICATION

This is a Divisional of U.S. application Ser. No. 14/554,113, filed Nov. 26, 2014, which makes a claim of priority under 35 U.S.C. §119 to Korean Patent Application No. 10-2014-0031080 filed on Mar. 17, 2014, the disclosure of which is hereby incorporated by reference in its entirety.

BACKGROUND

Embodiments of the inventive concepts relate to a semiconductor device including a bit line structure, and more particularly, to a semiconductor device including a bit line structure an air-gap near the bit line structure.

A semiconductor device includes a bit line structure. Air-gaps may be formed on side surfaces of the bit line structure. Electrical isolation can be provided, at least in part, by bit line air gaps that are elongated in a column direction. Various studies are being conducted which are aimed at preventing defects caused by a process of forming air-gaps on side surfaces of a bit line structure in a semiconductor device.

SUMMARY

In accordance with an aspect of the inventive concept, a semiconductor device includes a bit line structure located on a semiconductor substrate, an outer bit line spacer located on a first side surface of the bit line structure, an inner bit line spacer including a first part located between the bit line structure and the outer bit line spacer and a second part located between the semiconductor substrate and the outer bit line spacer, a block bit line spacer located between the outer bit line spacer and the second part of the inner bit line spacer, and a first air-gap located between the outer bit line spacer and the inner bit line spacer, and the block bit line spacer.

A horizontal length of the block bit line spacer may be smaller than a horizontal length of a lower surface of the outer bit line spacer.

The block bit line spacer may include a first side surface facing the first part of the inner bit line spacer, and a second side surface opposite the first side surface. The second side surface of the block bit line spacer may be vertically aligned with a side surface of the outer bit line spacer.

A side surface of the second part of the inner bit line spacer may be vertically aligned with the second side surface of the block bit line spacer.

A vertical length of the block bit line spacer may be the same as a horizontal length of the first air-gap disposed between the outer bit line spacer and the first part of the inner bit line spacer.

An upper surface of the block bit line spacer may be in contact with the outer bit line spacer. A lower surface of the block bit line spacer may be in contact with the second part of the inner bit line spacer.

The semiconductor device may further include a second air-gap located on the second side surface of the bit line structure opposite the first side surface of the bit line structure. A highest level of the second air-gap may be the same as a highest level of the first air-gap.

The shape of the second air-gap may be symmetrical to the shape of the first air-gap with respect to the bit line structure.

The highest level of the first air-gap may be lower than a highest level of the bit line structure.

The outer bit line spacer may be in contact with the first part of the inner bit line spacer on a side surface of the bit line structure. The lowest level of an interface between the outer bit line spacer and the first part of the inner bit line spacer may be the same as the highest level of the first air-gap.

In accordance with another aspect of the inventive concept, a semiconductor device includes a bit line structure extending in a first direction, an inner bit line spacer extending in the first direction and located on a side surface of the bit line structure, a block bit line spacer extending in the first direction and spaced apart from the inner bit line spacer in a second direction perpendicular to the first direction, and an air-gap located between the inner bit line spacer and the block bit line spacer. A profile of a first side surface of the block bit line spacer facing the inner bit line spacer is different from a profile of a second side surface of the block bit line spacer opposite the first side surface of the block bit line spacer.

The second side surface of the block bit line spacer may be parallel to a side surface of the inner bit line spacer facing the first side surface of the block bit line spacer.

The semiconductor device may further include a storage contact plug located on the second side surface of the block bit line spacer, and a plug isolation pattern located on the second side surface of the block bit line spacer and aligned with the storage contact plug in the first direction. A horizontal length of a first part of the block bit line spacer located between the air-gap and the storage contact plug in the second direction may be greater than a horizontal length of a second part of the block bit line spacer located between the air-gap and the plug isolation pattern in the second direction.

A horizontal length of the air-gap disposed between the inner bit line spacer and the first part of the block bit line spacer in the second direction may be smaller than a horizontal length of the air-gap disposed between the inner bit line spacer and the second part of the block bit line spacer in the second direction.

The horizontal length of the first part of the block bit line spacer in the second direction may be smaller than the horizontal length of the air-gap disposed between the inner bit line spacer and the first part of the block bit line spacer in the second direction.

A semiconductor device according to an exemplary embodiment includes a bit line structure disposed on a first gate structure, the bit line structure including a bit line electrode and a bit line capping pattern, an upper surface of the bit line structure disposed above an area between the first gate structure and a second gate structure being positioned higher than an upper surface of the bit line structure disposed above the first gate structure, and an interlayer insulating layer surrounding side surfaces of upper portions of the bit line capping pattern, a storage contact plug located between the bit line structure and another bit line structure, wherein the storage contact plug is formed to extend onto an upper surface of an adjacent bit line capping pattern such that no electrical connection is formed between adjacent storage contact plugs.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings:

FIGS. 4A to 32A and FIGS. 4B to 32B are cross-sectional views showing a method of forming a semiconductor device in accordance with an embodiment of the inventive concept;

FIGS. 33A to 43A and FIGS. 33B to 43B are cross-sectional views showing a method of forming a semiconductor device in accordance with another embodiment of the inventive concept;

DETAILED DESCRIPTION OF THE EMBODIMENTS

Figure 1:
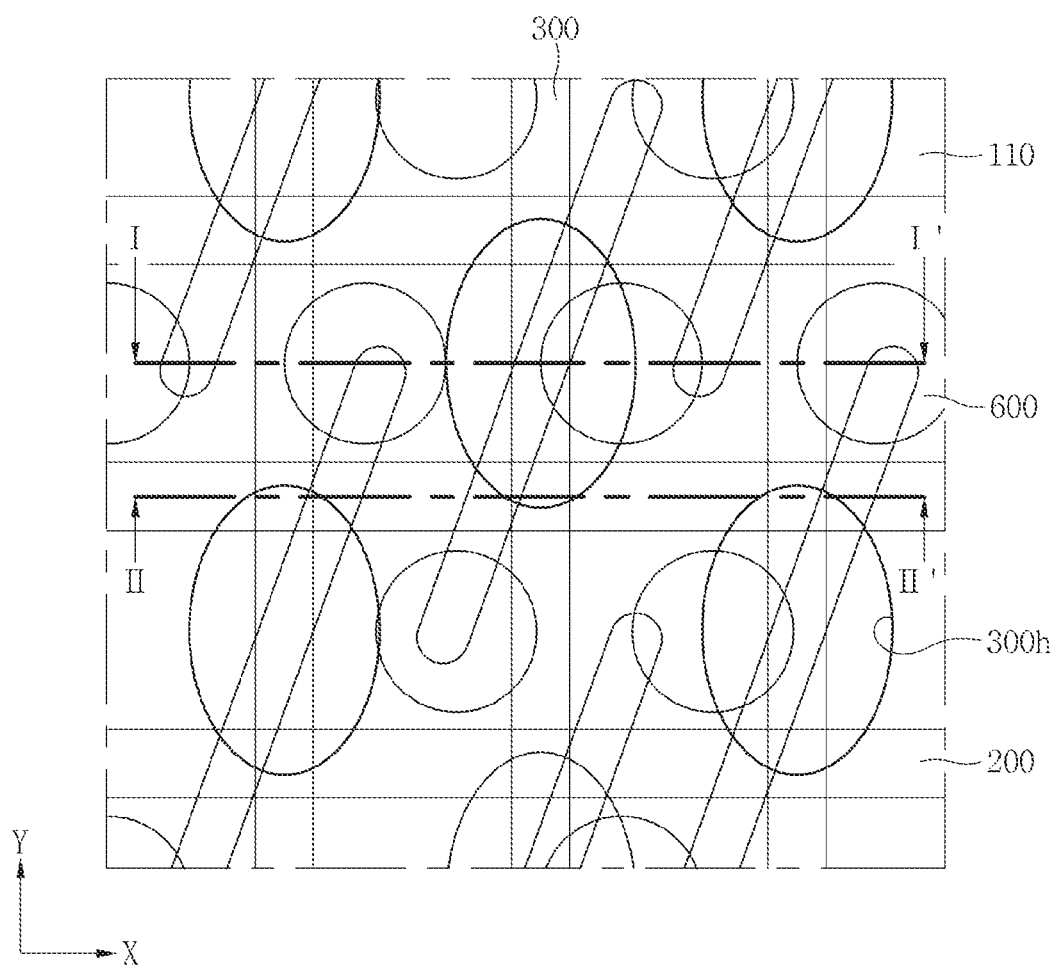
FIG. 1 is a layout view showing a semiconductor device in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art.

Like numerals refer to like elements throughout the specification. In the drawings, the lengths and thicknesses of layers and regions may be exaggerated for clarity. In addition, it will be understood that when a first element is referred to as being "on" a second element, the first element may be directly on the second element, or a third element may be interposed between the first element and the second element.

It will be understood that, although the terms "first," "second," etc. may be used herein to describe various elements, these elements should not be limited by these terms. These terms are only used to distinguish one element from another. Therefore, a first element, a first component, or a first section could be termed a second element, a second component, or a second section within the scope of the inventive concepts.

The terminology used herein to describe embodiments of the inventive concepts is not intended to limit the scope of the inventive concepts. The use of the singular form in the present document should not preclude the presence of more than one referent. In other words, elements of the inventive concepts referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 2A:
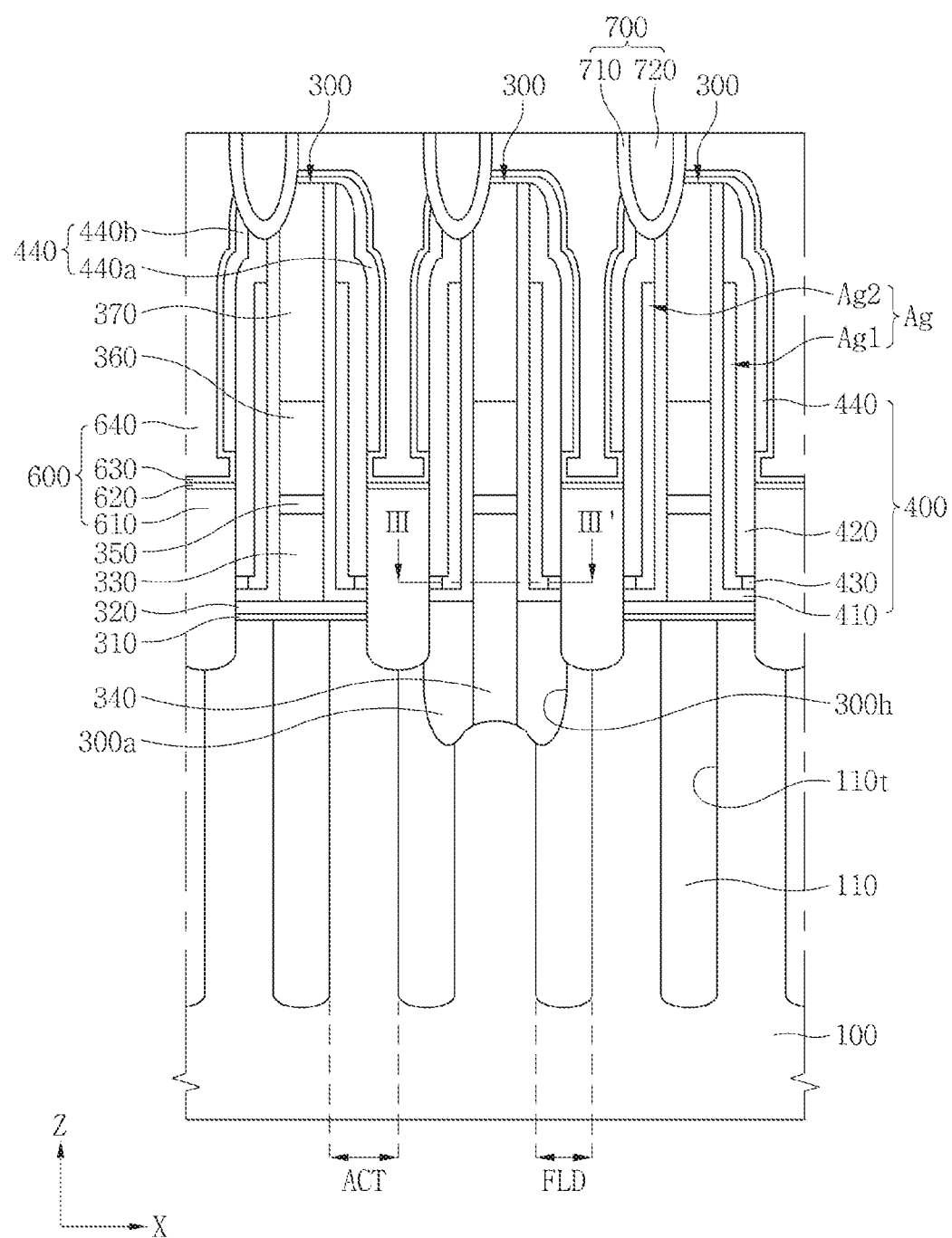
FIG. 2A is a cross-sectional view taken along the line I-I' of FIG. 1 according to an embodiment.
Figure 2B:
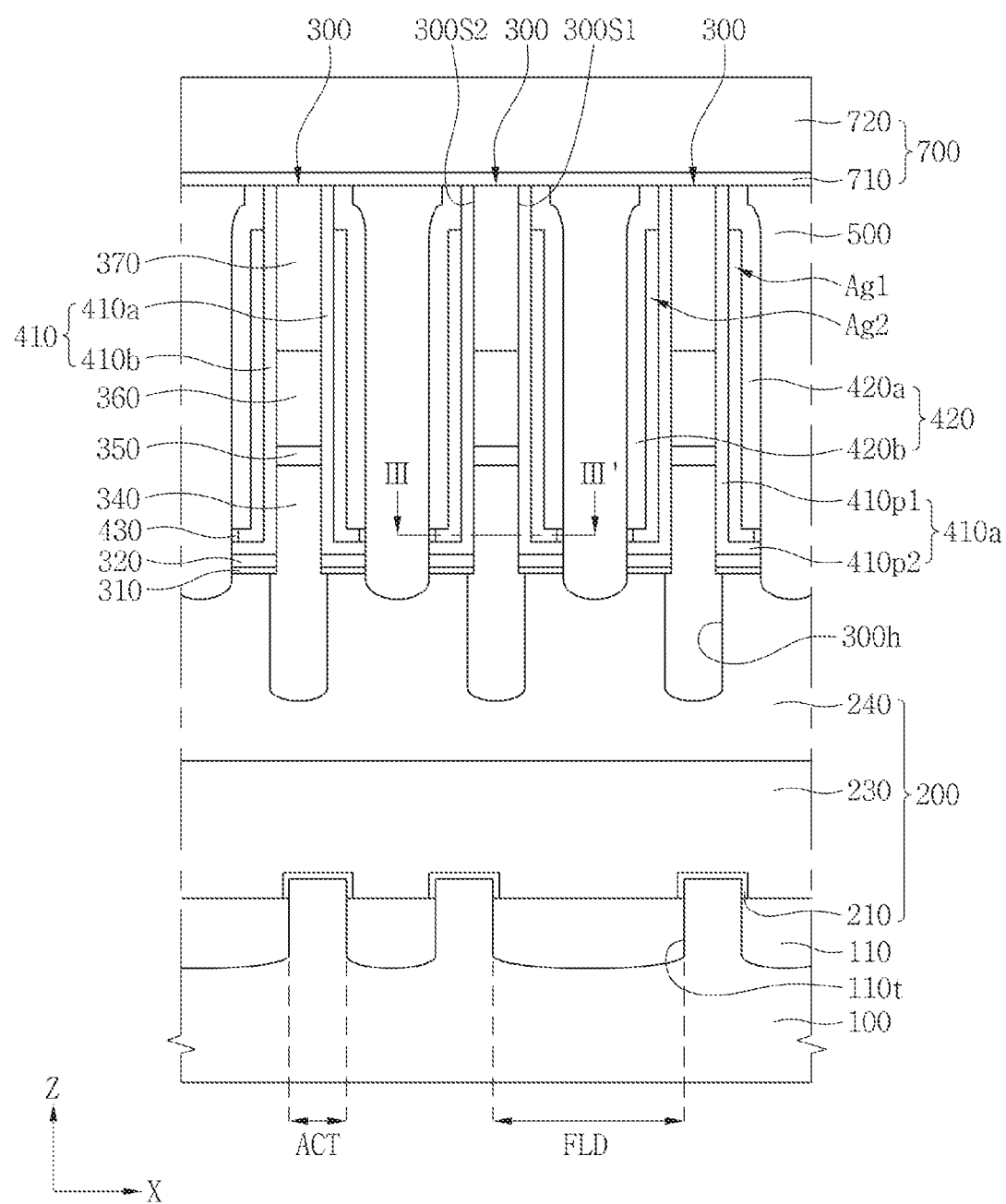
FIG. 2B is a cross-sectional view taken along the line II-II' of FIG. 1 according to an embodiment.
Figure 2C:
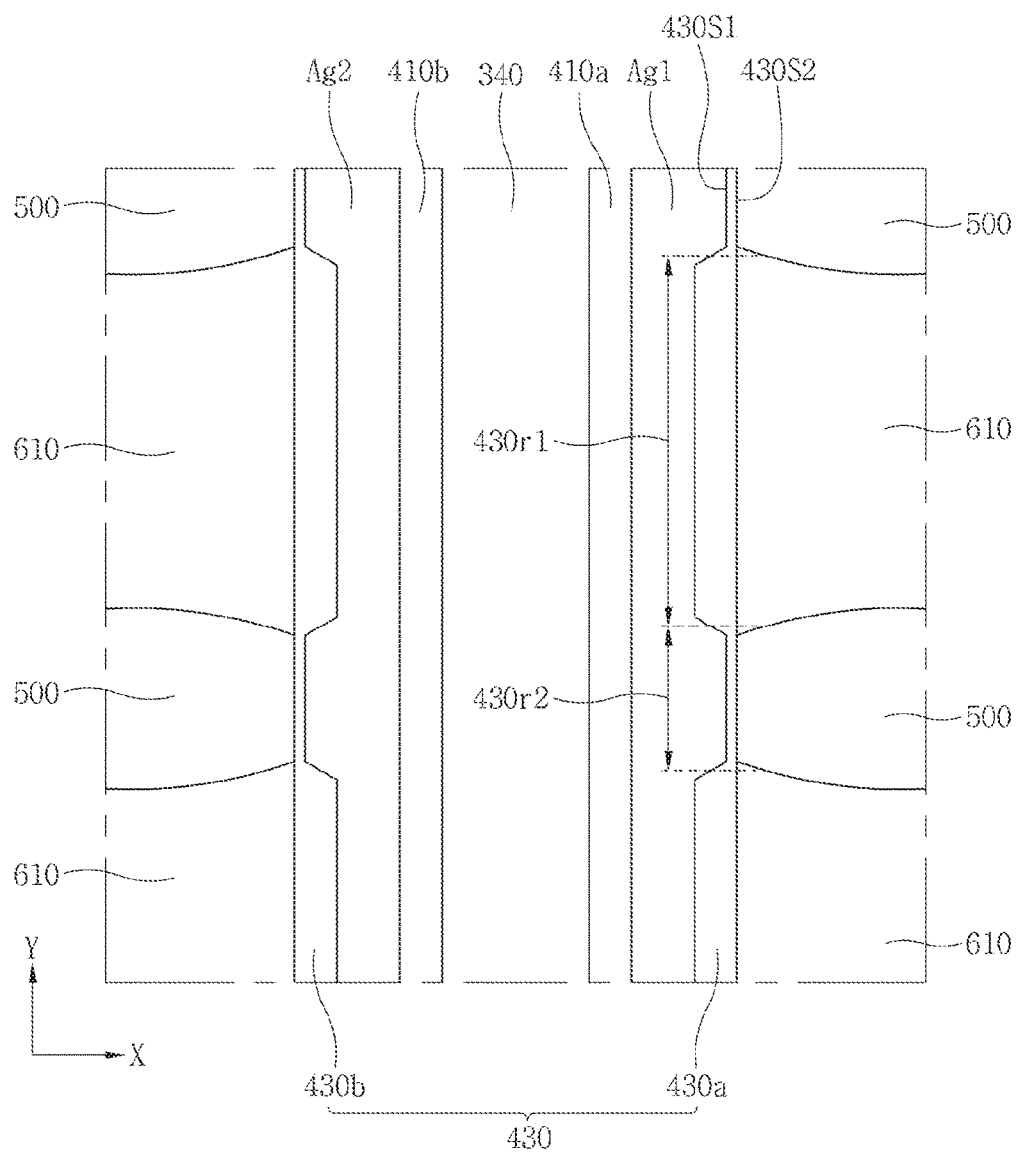
FIG. 2C is a plan view taken along the line of FIGS. 2A and 2B according to an embodiment.

FIG. 1 is a layout view showing a semiconductor device in accordance with an embodiment of the inventive concept. FIG. 2A is a cross-sectional view taken along line I-I' of FIG. 1. FIG. 2B is a cross-sectional view taken along line II-II' of FIG. 1. FIG. 2C is a plan view taken along line of FIGS. 2A and 2B.

Referring to FIG. 1 and FIGS. 2A to 2C, a semiconductor device in accordance with an embodiment of the inventive concept may include a semiconductor substrate 100, gate structures 200, bit line structures 300, bit line spacers 400, air-gaps Ag, plug isolation patterns 500, storage contact plugs 600, and an interlayer insulating layer 700.

The semiconductor substrate 100 may include a silicon substrate or a silicon-on-insulator (SOI) substrate. The semiconductor substrate 100 may include an active region ACT and a field region FLD.

The active region ACT may be defined by the field region FLD. The field region FLD may surround the active region ACT. The field region FLD may include a field trench 110t and a field insulating material 110.

The field trench 110t may extend in a Z-axis direction from an upper surface of the semiconductor substrate 100. The field insulating material 110 may be located in the field trench 110t. A level of an upper surface of the field insulating material 110 may be the same as a level of the upper surface of the semiconductor substrate 100. The field insulating material 110 may include an insulating material. For example, the field insulating material 110 may include silicon oxide.

The gate structures 200 may be located in the semiconductor substrate 100. The gate structures 200 may extend in an X-axis direction. Each of the gate structures 200 may be spaced apart from an adjacent gate structure 200 in a Y-axis direction. Each of the gate structures 200 may be parallel with the adjacent gate structure 200.

The lowest level of the gate structures 200 may be higher than the lowest level of the field trench 110t. Each of the gate structures 200 may cross the active region ACT and the field region FLD.

Each of the gate structures 200 may include a gate insulating layer 210, a gate electrode 230, and a gate capping layer 240.

The gate insulating layer 210 may be located on the active region ACT. The gate insulating layer 210 may be in direct contact with the active region ACT intersecting a corresponding gate structure 200.

The gate insulating layer 210 may include an insulating material. For example, the gate insulating layer 210 may include silicon oxide.

The gate electrode 230 may be located on the gate insulating layer 210. The gate electrode 230 may extend in the X-axis direction. The gate insulating layer 210 may be disposed between the active region ACT and the gate electrode 230.

The gate electrode 230 may include a conductive material. For example, the gate electrode 230 may include a metal or polysilicon. The gate electrode 230 may further include a metal oxide or a metal nitride. For example, the gate electrode 230 may be a multilayered structure.

The gate capping layer 240 may be located on the gate electrode 230. The gate capping layer 240 may extend in the X-axis direction. A level of an upper surface of the gate capping layer 240 may be the same as the level of the upper surface of the semiconductor substrate 100.

The gate capping layer 240 may include an insulating material. For example, the gate capping layer 240 may include silicon nitride.

The bit line structures 300 may be located on the semiconductor substrate 100. The bit line structures 300 may extend in the Y-axis direction. Each of the bit line structures 300 may be spaced apart from an adjacent bit line structure 300 in the X-axis direction. Each of the bit line structures 300 may be parallel with the adjacent bit line structure 300.

Each of the bit line structures 300 may intersect the gate structures 200. Each of the bit line structures 300 may intersect the active region ACT and the field region FLD. For example, the shape of the active region ACT may be a bar extending in a diagonal direction based on the X-axis direction and the Y-axis direction.

Each of the bit line structures 300 may include a lower bit line barrier pattern 310, an upper bit line barrier pattern 320, a lower bit line electrode 330, a DC plug 340, an intermediate bit line pattern 350, an upper bit line electrode 360 and a bit line capping pattern 370.

The lower bit line barrier pattern 310 may be disposed near the upper surface of the semiconductor substrate 100. The lower bit line barrier pattern 310 may extend in the Y-axis direction. The lower bit line barrier pattern 310 may include an insulating material. For example, the lower bit line barrier pattern 310 may include silicon oxide.

The upper bit line barrier pattern 320 may be located on the lower bit line barrier pattern 310. The upper bit line barrier pattern 320 may include an insulating material. An etch rate of the upper bit line barrier pattern 320 may be different from an etch rate of the lower bit line barrier pattern 310. For example, the upper bit line barrier pattern 320 may include silicon nitride.

The lower bit line electrode 330 may be located on the upper bit line barrier pattern 320. The lower bit line electrode 330 may include a conductive material. For example, the lower bit line electrode 330 may include polysilicon.

The DC plug 340 may be located on the active region ACT intersecting a corresponding bit line structure 300. The DC plug 340 may be in direct contact with the active region ACT. For example, the lowest level of the DC plug 340 may be lower than the level of the upper surface of the semiconductor substrate 100.

A level of an upper surface of the DC plug 340 may be the same as a level of an upper surface of the lower bit line electrode 330. The DC plug 340 may penetrate the lower bit line barrier pattern 310, the upper bit line barrier pattern 320, and the lower bit line electrode 330.

The DC plug 340 may include a conductive material. For example, the DC plug 340 may include polysilicon.

The intermediate bit line pattern 350 may be located on the lower bit line electrode 330. The intermediate bit line pattern 350 may be disposed on the DC plug 340. The intermediate bit line pattern 350 may extend in the Y-axis direction.

The intermediate bit line pattern 350 may include a conductive material. For example, the intermediate bit line pattern 350 may include a metal silicide.

The upper bit line electrode 360 may be located on the intermediate bit line pattern 350. The upper bit line electrode 360 may include a conductive material. For example, the upper bit line electrode 360 may include a metal.

The bit line capping pattern 370 may be located on the upper bit line electrode 360. The bit line capping pattern 370 may extend in the Y-axis direction.

A profile of an upper surface of the bit line capping pattern 370 may be different from a profile of a lower surface of the bit line capping pattern 370. For example, the highest level of the bit line capping pattern 370 disposed above the gate structures 200 may be lower than the highest level of the bit line capping pattern 370 disposed above an area between the gate structures 200.

The bit line capping pattern 370 may include an insulating material. For example, the bit line capping pattern 370 may include silicon nitride.

In the semiconductor device in accordance with the embodiment of the inventive concept, it is explained that upper surfaces of the bit line structures 300 disposed above an areas between the gate structures 200 are higher than upper surfaces of the bit line structures 300 disposed above the gate structures 200. Thus, in the semiconductor device in accordance with the embodiment of the inventive concept, the interlayer insulating layer 700 may surround side surfaces of upper portions of the bit line capping patterns 370. In the semiconductor device in accordance with the embodiment of the inventive concept, each of the storage contact plugs 600 may be formed to extend onto an upper surface of an adjacent bit line capping pattern 370. Accordingly, in the semiconductor device in accordance with the embodiment of the inventive concept, an electrical connection between the adjacent storage contact plugs 600 may be prevented.

The bit line spacers 400 may be located on the bit line structures 300. The bit line spacers 400 may extend in the Y-axis direction. Each of the bit line spacers 400 may be spaced apart from an adjacent bit line spacer 400 in the X-axis direction.

Each of the bit line spacers 400 may include an inner bit line spacer 410, an outer bit line spacer 420, and a block bit line spacer 430.

The inner bit line spacer 410 may be disposed near side surfaces of a corresponding bit line structure 300. Side surfaces of each bit line structure 300 may be in direct contact with a corresponding inner bit line spacer 410.

The inner bit line spacer 410 may include a first inner bit line spacer 410a and a second inner bit line spacer 410b.

The first inner bit line spacer 410a may be located on a first side surface 300S1 of the corresponding bit line structure 300. The first inner bit line spacer 410a may include a first part 410p1 and a second part 410p2. The first part 410p1 of the first inner bit line spacer 410a may extend along the first side surface 300S1 of the corresponding bit line structure 300. The second part 410p2 of the first inner bit line spacer 410a may extend along the upper surface of the semiconductor substrate 100. The second part 410p2 of the first inner bit line spacer 410a may extend from a lower portion of the first part 410p1 of the first inner bit line spacer 410a. The upper surface of the semiconductor substrate 100 disposed near the first side surface 300S1 of each bit line structure 300 may be covered by a second part 410p2 of a corresponding first inner bit line spacer 410a. For example, the shape of the first inner bit line spacer 410a may be an 'L' shape.

The first inner bit line spacer 410a may include an insulating material. For example, the first inner bit line spacer 410a may include silicon nitride.

The second inner bit line spacer 410b may be located on a second side surface 300S2 of the corresponding bit line structure 300. The second side surface 300S2 of each bit line structure 300 may be opposite the first side surface 300S 1 of the corresponding bit line structure 300.

The second inner bit line spacer 410b may extend along the second side surface 300S2 of the corresponding bit line structure 300. The second inner bit line spacer 410b may cover the upper surface of the semiconductor substrate 100 disposed near the second side surface 300S2 of the corresponding bit line structure 300. For example, the shape of the second inner bit line spacer 410b may have a reverse 1' shape. The second inner bit line spacer 410b may include a vertical part like as a first part 410p1 of the first inner bit line spacer 410a, and a horizontal part like as a second part 410p2 of the first inner bit line spacer 410a.

The second inner bit line spacer 410b may include an insulating material. An etch rate of the second inner bit line spacer 410b may be the same as an etch rate of the first inner bit line spacer 410a. For example, the second inner bit line spacer 410b may include silicon nitride.

The outer bit line spacer 420 may be located on the inner bit line spacer 410. The outer bit line spacer 420 may include a first outer bit line spacer 420a and a second outer bit line spacer 420b.

The first outer bit line spacer 420a may be located on an upper surface of the second part 410p2 of the first inner bit line spacer 410a. The first outer bit line spacer 420a may be spaced apart from the second part 410p2 of the first inner bit line spacer 410a. A level of a lower surface of the first outer bit line spacer 420a may be higher than a level of the upper surface of the second part 410p2 of the first inner bit line spacer 410a.

The first outer bit line spacer 420a may be partly spaced apart from the first part 410p1 of the first inner bit line spacer 410a. For example, a lower portion of the first outer bit line spacer 420a may be spaced apart from the first part 410p1 of the first inner bit line spacer 410a. A separation distance between the first part 410p1 of the first inner bit line spacer 410a and the lower portion of the first outer bit line spacer 420a in the X-axis direction may be the same as a separation distance between the lower portion of the first outer bit line spacer 420a and the second part 410p2 of the first inner bit line spacer 410a in the Z-axis direction.

An upper portion of the first outer bit line spacer 420a may be in direct contact with the first part 410p1 of the first inner bit line spacer 410a. For example, the first outer bit line spacer 420a may be in direct contact with the first part 410p1 of the first inner bit line spacer 410a on the first side surface 300S1 of the bit line capping pattern 370 of the corresponding bit line structure 300. A lowest level of an interface between the first part 410p1 of the first inner bit line spacer 410a and the first outer bit line spacer 420a may be higher than a level of an upper surface of the upper bit line electrode 360 of the corresponding bit line structure 300.

The first outer bit line spacer 420a may include an insulating material. An etch rate of the first outer bit line spacer 420a may be the same as an etch rate of the first inner bit line spacer 410a. For example, the first outer bit line spacer 420a may include silicon nitride.

The second outer bit line spacer 420b may be located on the second inner bit line spacer 410b. A lower portion of the second outer bit line spacer 420b may be spaced apart from the second inner bit line spacer 410b. An upper portion of the second outer bit line spacer 420b may be in direct contact with the second inner bit line spacer 410b on a second side surface 300S2 of the bit line capping pattern 370 of the corresponding bit line structure 300. The lowest level of an interface between the second inner bit line spacer 410b and the second outer bit line spacer 420b may be the same as a lowest level of an interface between the first part 410p1 of the first inner bit line spacer 410a and the first outer bit line spacer 420a.

The second outer bit line spacer 420b may include an insulating material. An etch rate of the second outer bit line spacer 420b may be the same as the etch rate of the first outer bit line spacer 420a. For example, the second outer bit line spacer 420b may include silicon nitride.

The block bit line spacer 430 may be located between a lower surface of the outer bit line spacer 420 and the inner bit line spacer 410. The block bit line spacer 430 may include a first block bit line spacer 430a and a second block bit line spacer 430b.

The first block bit line spacer 430a may be located on the upper surface of the second part 410p2 of the first inner bit line spacer 410a. The first block bit line spacer 430a may be in direct contact with the upper surface of the second part 410p2 of the first inner bit line spacer 410a.

The first block bit line spacer 430a may be in direct contact with the lower surface of the first outer bit line spacer 420a. A vertical length of the first block bit line spacer 430a in the Z-axis direction may be the same as the separation distance between the second part 410p2 of the first inner bit line spacer 410a and the first outer bit line spacer 420a in the Z-axis direction. The vertical length of the first block bit line spacer 430a in the Z-axis direction may be the same as the separation distance between the first part 410p1 of the first inner bit line spacer 410a and the first outer bit line spacer 420a in the X-axis direction.

The first block bit line spacer 430a may include first areas 430r1 and second areas 430r2. A horizontal length of each second area 430r2 of the first block bit line spacer 430a in the X-axis direction may be smaller than a horizontal length of each first area 430r1 of the first block bit line spacer 430a in the X-axis direction.

Each second area 430r2 of the first block bit line spacer 430a may be located between the first areas 430r1 of the first block bit line spacer 430a. For example, the first areas 430r1 of the first block bit line spacer 430a may alternate with the second areas 430r2 of the first block bit line spacer 430a in the Y-axis direction.

The first areas 430r1 and the second areas 430r2 of the first block bit line spacer 430a may be spaced apart from the first part 410p1 of the first inner bit line spacer 410a in the X-axis direction. A separation distance between the first part 410p1 of the first inner bit line spacer 410a and the second areas 430r2 of the first block bit line spacer 430a in the X-axis direction may be greater than a separation distance between the first part 410p1 of the first inner bit line spacer 410a and the first areas 430r1 of the first block bit line spacer 430a in the X-axis direction. For example, a profile of a first side surface 430S 1 of the first block bit line spacer 430a facing the first part 410p1 of the first inner bit line spacer 410a may have an uneven shape.

A profile of a second side surface 430S2 of the first block bit line spacer 430a may be different from the profile of a first side surface 430S1 of the first block bit line spacer 430a.

The second side surface 430S2 of the first block bit line spacer 430a may be opposite the first side surface 430S1 of the first block bit line spacer 430a. For example, the second side surface 430S2 of the first block bit line spacer 430a may be parallel with a side surface of the first part 410p1 of the first inner bit line spacer 410a facing the first side surface 430S1 of first block bit line spacer 430a.

The second side surface 430S2 of the first block bit line spacer 430a may be vertically aligned with a side surface of the first outer bit line spacer 420a. A side surface of the second part 410p2 of the first inner bit line spacer 410a may be vertically aligned with the second side surface 430S2 of first block bit line spacer 430a.

A horizontal length of each first area 430r1 of the first block bit line spacer 430a in the X-axis direction may be smaller than a horizontal length of a lower surface of the first outer bit line spacer 420a in the X-axis direction. A separation distance between the first part 410p1 of the first inner bit line spacer 410a and the first areas 430r1 of the first block bit line spacer 430a in the X-axis direction may be greater than the separation distance between the first part 410p1 of the first inner bit line spacer 410a and the lower portion of the first outer bit line spacer 420a in the X-axis direction.

The first block bit line spacer 430a may include an insulating material. For example, the first block bit line spacer 430a may include silicon oxide or silicon nitride.

The second block bit line spacer 430b may be located on the second inner bit line spacer 410b. The second block bit line spacer 430b may be symmetrical to the first block bit line spacer 430a with respect to the corresponding bit line structure 300. For example, a space between the horizontal part of the second inner bit line spacer 410b and a lower surface of the second outer bit line spacer 420b may be partially filled with the second block bit line spacer 430b.

The second block bit line spacer 430b may include an insulating material. An etch rate of the second block bit line spacer 430b may be the same as that of the first block bit line spacer 430a. For example, the second block bit line spacer 430b may include silicon oxide or silicon nitride.

Each of the bit line spacers 400 of the semiconductor device in accordance with the embodiment of the inventive concept may further include cover bit line spacers 440. The cover bit line spacers 440 may be located on the outer bit line spacer 420. The cover bit line spacers 440 may be disposed above the areas between the gate structures 200. Each of the cover bit line spacers 440 may be spaced apart from an adjacent cover bit line spacer 440 in the Y-axis direction.

Each of the cover bit line spacers 440 may include a first cover bit line spacer 440a and a second cover bit line spacer 440b.

The first cover bit line spacer 440a may be located on the first outer bit line spacer 420a. The first cover bit line spacer 440a may extend along an upper surface of the corresponding bit line structure 300. An upper surface of each bit line structure 300 may be covered with a corresponding first cover bit line spacer 440a.

The first cover bit line spacer 440a may be spaced apart from the first block bit line spacer 430a. A level of a lower surface of the first cover bit line spacer 440a may be higher than a level of an upper surface of the first block bit line spacer 430a. The level of the lower surface of the first cover bit line spacer 440a may be higher than a level of the lower surface of the first outer bit line spacer 420a.

The first cover bit line spacer 440a may include an insulating material. An etch rate of the first cover bit line spacer 440a may be the same as that of the first outer bit line spacer 420a. For example, the first cover bit line spacer 440a may include silicon nitride.

The second cover bit line spacer 440b may be located on the second outer bit line spacer 420b. The second cover bit line spacer 440b may be spaced apart from the second block bit line spacer 430b. For example, a level of a lower surface of the second cover bit line spacer 440b may be the same as the level of the lower surface of the first cover bit line spacer 440a.

The second cover bit line spacer 440b may include an insulating material. An etch rate of the second cover bit line spacer 440b may be the same as that of the first cover bit line spacer 440a. For example, the second cover bit line spacer 440b may include silicon nitride.

The air-gaps Ag may be located between the bit line spacers 400. Each of the air-gaps Ag may be an empty space surrounded by the inner bit line spacer 410, the outer bit line spacer 420, and the block bit line spacer 430.

Each of the air-gaps Ag may include a first air gap Ag1 and a second air gap Ag2.

The first air gap Ag1 may be located on the first side surface 300S1 of a corresponding bit line structure 300. The first air gap Ag1 may be disposed among the first inner bit line spacer 410a, the first outer bit line spacer 420a and the first block bit line spacer 430a.

The highest level of the first air gap Ag1 may be the same as the lowest level of an interface between the first part 410p1 of the first inner bit line spacer 410a and the first outer bit line spacer 420a.

The second air gap Ag2 may be located on the second side surface 300S2 of the corresponding bit line structure 300. The second air gap Ag2 may be disposed among the second inner bit line spacer 410b, the second outer bit line spacer 420b and the second block bit line spacer 430b.

The highest level of the second air gap Ag2 may be the same as the lowest level of an interface between the second inner bit line spacer 410b and the second outer bit line spacer 420b. For example, the highest level of the second air gap Ag2 may be the same as the highest level of the first air gap Ag1.

In the semiconductor device in accordance with the embodiment of the inventive concept, the air-gaps Ag may be surrounded by the bit line spacers 400. Accordingly, in the semiconductor device in accordance with the embodiment of the inventive concept, penetration by an adjacent storage contact plug 600 into the air-gaps Ag can be prevented.

The plug isolation patterns 500 may be located between the bit line structures 300. The plug isolation patterns 500 may be located between the bit line spacers 400. The plug isolation patterns 500 may be disposed above the gate structures 200. Each of the plug isolation patterns 500 may be spaced apart from an adjacent plug isolation pattern 500 in the Y-axis direction.

Each of the plug isolation patterns 500 may be in direct contact with adjacent bit line spacers 400. A space between the adjacent bit line spacers 400 disposed above the gate structures 200 may be filled with a corresponding plug isolation pattern 500.

The highest level of the plug isolation patterns 500 may be the same as the highest level of an adjacent bit line structure 300. The highest level of the plug isolation patterns 500 may be the same as the highest level of the bit line capping pattern 370 of each bit line structure 300 on the gate structures 200.

The plug isolation patterns 500 may include an insulating material. An etch rate of the plug isolation patterns 500 may be the same as that of the outer bit line spacer 420 of the bit line spacer 400. For example, the plug isolation patterns 500 may include silicon nitride.

The storage contact plugs 600 may be located between the bit line structures 300. The storage contact plugs 600 may be located between the bit line spacers 400. The storage contact plugs 600 may be located between the gate structures 200. Each of the storage contact plugs 600 may be located between the plug isolation patterns 500. The storage contact plugs 600 may alternate with the plug isolation patterns 500 in the Y-axis direction.

The storage contact plugs 600 may be in direct contact with the bit line spacers 400.

The storage contact plugs 600 may be in direct contact with the plug isolation patterns 500. The storage contact plugs 600 may be defined by the bit line spacers 400 and the plug isolation patterns 500.

Each of the storage contact plugs 600 may include a lower plug pad 610, an intermediate plug pattern 620, a plug barrier pattern 630, and an upper contact plug 640.

The lower plug pad 610 may be disposed near the semiconductor substrate 100. The lower plug pad 610 may be in direct contact with the active region ACT of the semiconductor substrate 100.

The lowest level of the lower plug pad 610 may be lower than a level of an upper surface of the semiconductor substrate 100. The lowest level of the lower plug pad 610 may be higher than the lowest level of the DC contact hole 300h.

The highest level of the lower plug pad 610 may be lower than the highest level of the bit line structures 300. For example, the highest level of the lower plug pad 610 may be lower than the highest level of the air-gaps Ag. The highest level of the lower plug pad 610 may be higher than the highest level of the block bit line spacers 430. The lower plug pad 610 may be in direct contact with adjacent block bit line spacers 430.

The lower plug pad 610 may include a conductive material. For example, the lower plug pad 610 may include polysilicon.

The intermediate plug pattern 620 may be located on the lower plug pad 610. An upper surface of the lower plug pad 610 may be fully covered by the intermediate plug pattern 620.

The intermediate plug pattern 620 may include a conductive material. For example, the intermediate plug pattern 620 may include a metal silicide.

The plug barrier pattern 630 may be located on the intermediate plug pattern 620. The plug barrier pattern 630 may extend along adjacent bit line spacers 400. For example, the plug barrier pattern 630 may extend to an upper surface of a corresponding bit line structure 300 along the second side surface 300S2 of the bit line structures 300.

The plug barrier pattern 630 may include a metal nitride.

The upper contact plug 640 may be located on the plug barrier pattern 630. The highest level of the upper contact plug 640 may be higher than the highest level of adjacent bit line structures 300. For example, the highest level of the upper contact plug 640 may be higher than the highest level of the bit line capping patterns 370 between the gate structures 200.

The upper contact plug 640 may include a conductive material. For example, the upper contact plug 640 may include a metal.

The interlayer insulating layer 700 may be located on the bit line structures 300. The interlayer insulating layer 700 may be located between the upper contact plugs 640.

The highest level of the interlayer insulating layer 700 may be the same as the highest level of the storage contact plugs 600. The interlayer insulating layer 700 may surround side surfaces of the upper contact plug 640 of each storage contact plug 600. The upper contact plug 640 of each storage contact plug 600 may be insulated from an adjacent upper contact plug 640 by the interlayer insulating layer 700.

The lowest level of the interlayer insulating layer 700 may be the same as the highest level of the bit line structures 300 on the gate structures 200. A side surface of the interlayer insulating layer 700 between the gate structures 200 may be in direct contact with the bit line capping pattern 370 of each bit line structure 300.

The interlayer insulating layer 700 may be located on the second side surface 300S2 of each bit line structure 300. The highest level of the second side surface 300S2 of each bit line structure 300 may be the same as the lowest level of the interlayer insulating layer 700. The highest level of the second side surface 300S2 of each bit line structure 300 may be lower than the highest level of the first side surface 300S1 of a corresponding bit line structure 300.

The interlayer insulating layer 700 may include a lower interlayer insulating layer 710 and an upper interlayer insulating layer 720.

The lower interlayer insulating layer 710 may be disposed near the bit line structures 300. The lower interlayer insulating layer 710 may be in direct contact with the bit line capping pattern 370 of each bit line structure 300. The lower interlayer insulating layer 710 may be in direct contact with the upper contact plug 640 of each storage contact plug 600.

The lower interlayer insulating layer 710 may include an insulating material. For example, the lower interlayer insulating layer 710 may include silicon nitride.

The upper interlayer insulating layer 720 may be located on the lower interlayer insulating layer 710. The upper interlayer insulating layer 720 may fully fill a space disposed between vertical portions of the lower interlayer insulating layer 710.

The upper interlayer insulating layer 720 may include an insulating material. Gap-fill characteristics of the upper interlayer insulating layer 720 may be better than gap-fill characteristics of the lower interlayer insulating layer 710.

Figure 3A:
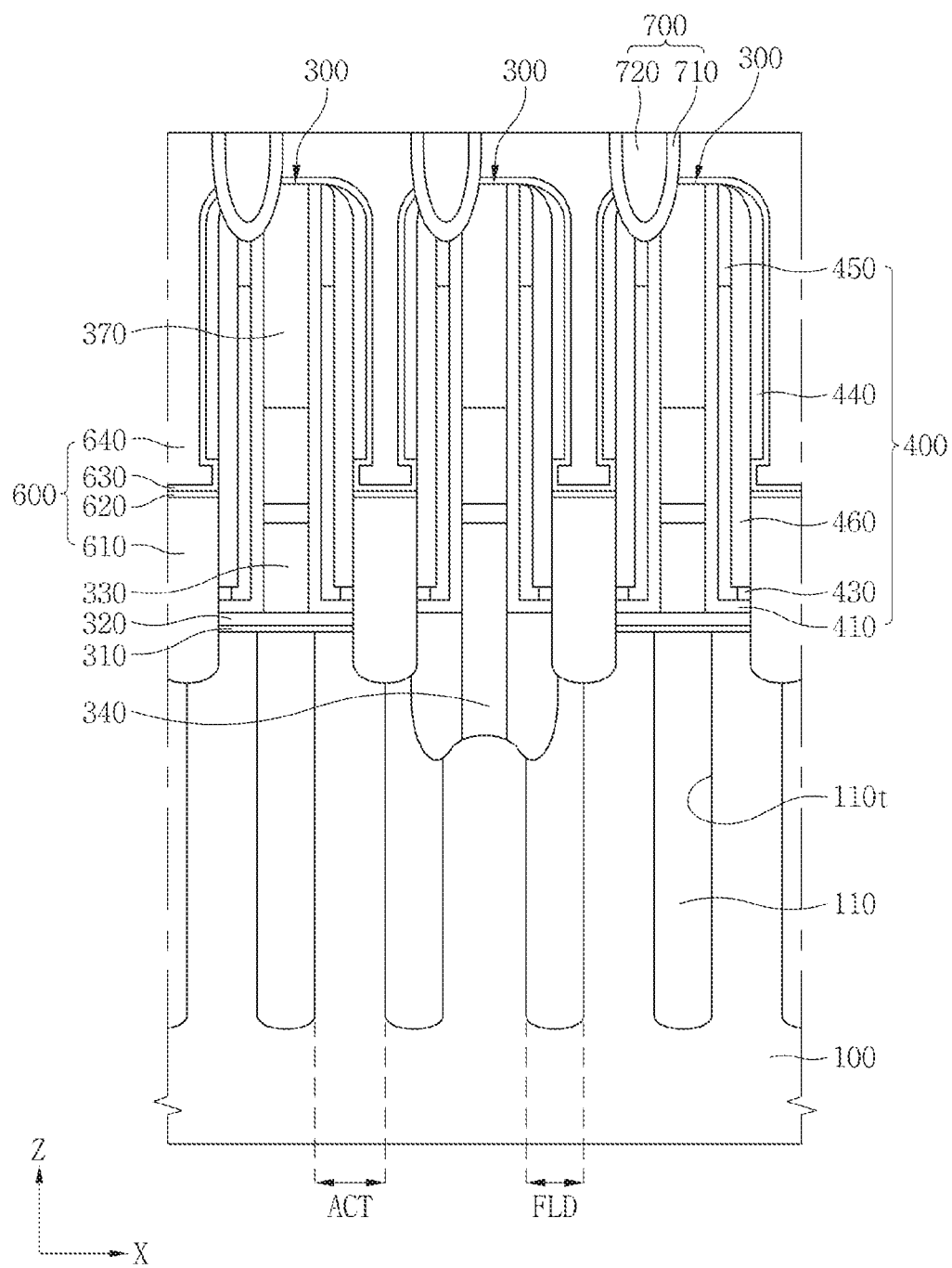
FIGS. 3A and 3B are cross-sectional views showing a semiconductor device in accordance with another embodiment of the inventive concept.
Figure 3B:
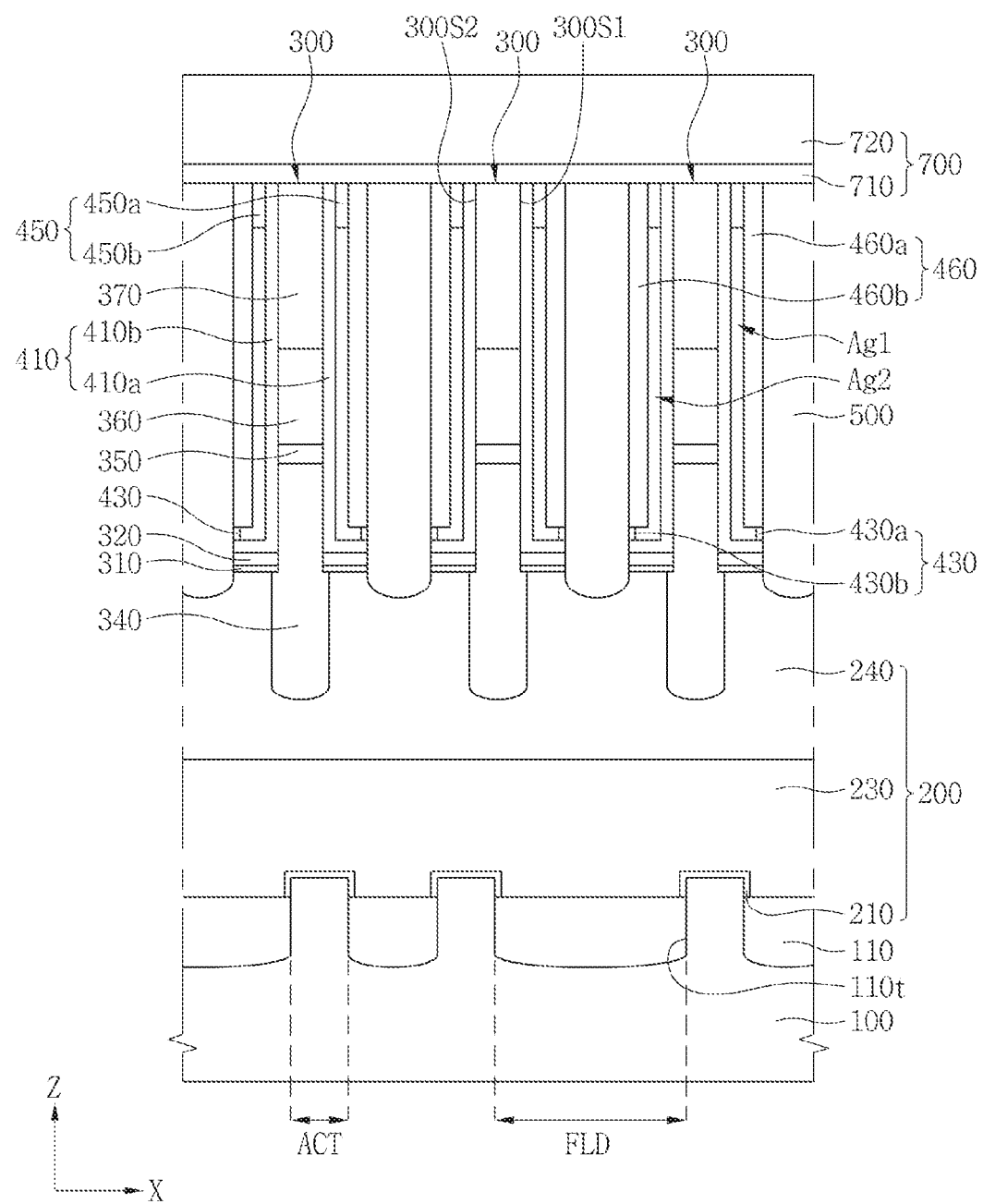
Figure 4A:
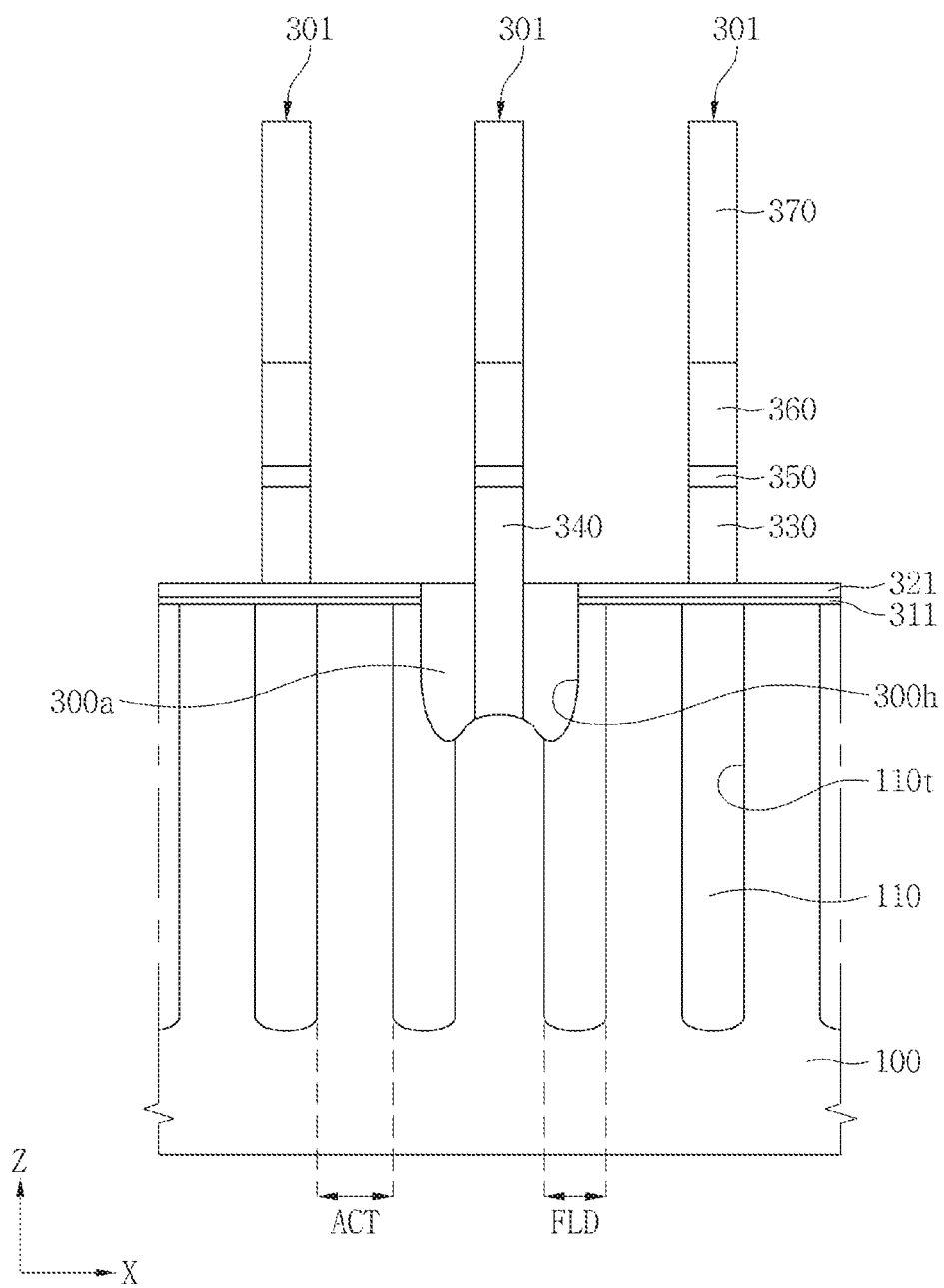
Figure 4B:
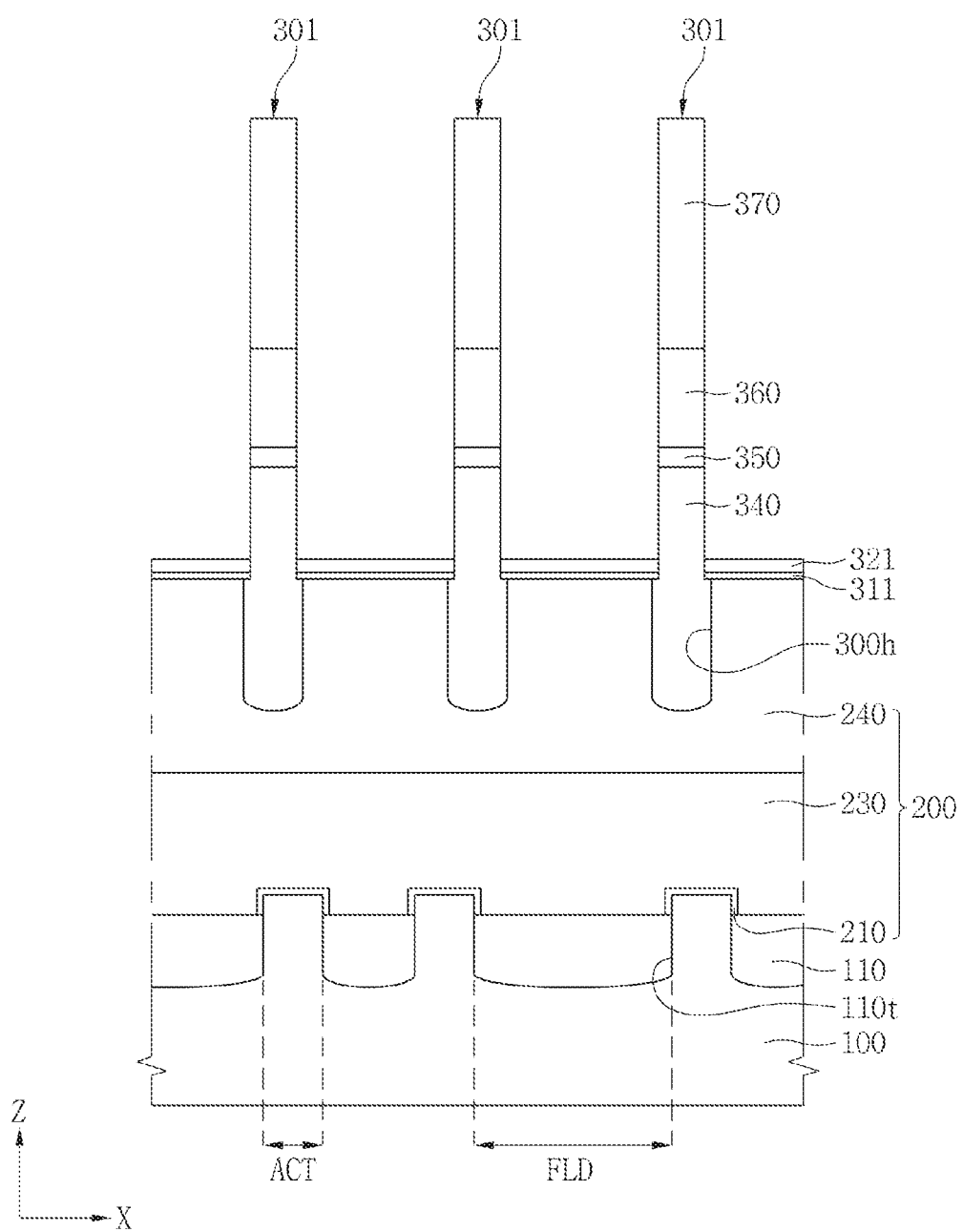

FIGS. 3A and 3B are cross-sectional views showing a semiconductor device in accordance with an embodiment of the inventive concept.

Referring to FIGS. 3A and 3B, the semiconductor device in accordance with the embodiment of the inventive concept may include a semiconductor substrate 100, a gate structure 200, bit line structures 300, bit line spacers 400, air-gaps Ag, plug isolation patterns 500, storage contact plugs 600, and an interlayer insulating layer 700.

The semiconductor substrate 100 may include an active region ACT and a field region FLD. The field region FLD may include a field trench 110t and a field insulating material 110.

The gate structure 200 may include a gate insulating layer 210, a gate electrode 230, and a gate capping layer 240.

Each of the bit line structures 300 may include a lower bit line barrier pattern 310, an upper bit line barrier pattern 320, a lower bit line electrode 330, a DC plug 340, an intermediate bit line pattern 350, an upper bit line electrode 360, and a bit line capping pattern 370.

The bit line spacers 400 may be located on the bit line structures 300. Each of the bit line spacers 400 may include an inner bit line spacer 410, an outer bit line spacer 460, a block bit line spacer 430, and an upper bit line spacer 450.

The inner bit line spacer 410 may be located adjacent to a corresponding bit line structure 300. The inner bit line spacer 410 may include a first inner bit line spacer 410a and a second inner bit line spacer 410b.

The first inner bit line spacer 410a may be located on a first side surface 300S1 of the corresponding bit line structure 300. The second inner bit line spacer 410b may be located on a second side surface 300S2 of the corresponding bit line structure 300. The second side surface 300S2 of each bit line structure 300 may be opposite the first side surface 300S1 of the corresponding bit line structure 300.

The outer bit line spacer 460 may be located on the inner bit line spacer 410. The outer bit line spacer 460 may include a first outer bit line spacer 460a and a second outer bit line spacer 460b.

The first outer bit line spacer 460a may be located on the first inner bit line spacer 410a. The first outer bit line spacer 460a may be spaced apart from the first inner bit line spacer 410a. For example, a side surface of the first outer bit line spacer 460a may be parallel to a side surface of the first inner bit line spacer 410a facing the first outer bit line spacer 460a.

The second outer bit line spacer 460b may be located on the second inner bit line spacer 410b. The second outer bit line spacer 460b may be spaced apart from the second inner bit line spacer 410b. For example, a side surface of the second outer bit line spacer 460b may be parallel to a side surface of the second inner bit line spacer 410b facing the second outer bit line spacer 460b. For example, the side surface of the second outer bit line spacer 460b may be symmetrical to the side surface of the first outer bit line spacer 460a with respect to the corresponding bit line structure 300.

The block bit line spacer 430 may be located between a lower surface of the outer bit line spacer 460 and the inner bit line spacer 410. The block bit line spacer 430 may include a first block bit line spacer 430a and a second block bit line spacer 430b.

The first block bit line spacer 430a may be located between a lower surface of the first outer bit line spacer 460a and the first inner bit line spacer 410a. The highest level of the first block bit line spacer 430a may be lower than the level of the lower surface of the intermediate bit line pattern 350 of the corresponding bit line structure 300.

The second block bit line spacer 430b may be located between a lower surface of the second outer bit line spacer 460b and the second inner bit line spacer 410b. The second block bit line spacer 430b may be symmetrical to the first block bit line spacer 430a with respect to the corresponding bit line structure 300. For example, the highest level of the second block bit line spacer 430b may be the same as the highest level of the first block bit line spacer 430a.

The upper bit line spacer 450 may be located between a side surface of the inner bit line spacer 410 and a side surface of the outer bit line spacer 460. The upper bit line spacer 450 may include a first upper bit line spacer 450a and second upper bit line spacer 450b.

The first upper bit line spacer 450a may be located between an upper portion of the first inner bit line spacer 410a and an upper portion of the first outer bit line spacer 460a. The first upper bit line spacer 450a may be spaced apart from the first block bit line spacer 430a. For example, a level of a lower surface of the first upper bit line spacer 450a may be higher than a level of a lower surface of the bit line capping pattern 370 of the corresponding bit line structure 300.

The highest level of the first upper bit line spacer 450a may be the same as the highest level of the bit line capping pattern 370. For example, the highest level of the first upper bit line spacer 450a on the gate structures 200 may be lower than the highest level of the first upper bit line spacer 450a between the gate structures 200.

The first upper bit line spacer 450a may include an insulating material. An etch rate of the first upper bit line spacer 450a may be the same as that of the first outer bit line spacer 460a. For example, the first upper bit line spacer 450a may include silicon nitride.

The second upper bit line spacer 450b may be located between an upper portion of the second inner bit line spacer 410b and an upper portion of the second outer bit line spacer 460b. A level of a lower surface of the second upper bit line spacer 450b may be the same as a level of the lower surface of the first upper bit line spacer 450a. For example, the level of the lower surface of the second upper bit line spacer 450b may be higher than the level of the lower surface of the bit line capping pattern 370 of the corresponding bit line structure 300.

The second upper bit line spacer 450b may include an insulating material. An etch rate of the second upper bit line spacer 450b may be the same as that of the first upper bit line spacer 450a. For example, the second upper bit line spacer 450b may include silicon nitride.

In the semiconductor device in accordance with the embodiment of the inventive concept, the bit line spacers 400 may further include a cover bit line spacer 440. The cover bit line spacer 440 may be located on the outer bit line spacer 460. The cover bit line spacer 440 may include a first cover bit line spacer 440a and a second cover bit line spacer 440b.

The first cover bit line spacer 440a may be located on the first outer bit line spacer 460a. A level of a lower surface of the first cover bit line spacer 440a may be higher than a level of a lower surface of the first outer bit line spacer 460a. The first cover bit line spacer 440a may cover an upper surface of the corresponding bit line structure 300.

The second cover bit line spacer 440b may be located on the second outer bit line spacer 460b. A level of a lower surface of the second cover bit line spacer 440b may be the same as the level of the lower surface of the first cover bit line spacer 440a. For example, the level of the lower surface of the second cover bit line spacer 440b may be higher than the level of the lower surface of the first cover bit line spacer 440a.

The air-gaps Ag may be located between the bit line spacers 400. For example, the air-gaps Ag may be located between the inner bit line spacer 410, the block bit line spacer 430, the upper bit line spacer 450, and the outer bit line spacer 460.

Each of the air-gaps Ag may include a first air gap Ag1 and a second air gap Ag2.

The first air gap Ag1 may be located on the first side surface 300S1 of the corresponding bit line structure 300. The first air gap Ag1 may be surrounded by the first inner bit line spacer 410a, the first block bit line spacer 430a, the first upper bit line spacer 450a, and the first outer bit line spacer 460a.

The first air gap Ag1 may be located on the lower surface of the first upper bit line spacer 450a. The highest level of the first air gap Ag1 may be defined by the first upper bit line spacer 450a.

The second air gap Ag2 may be located on the second side surface 300S2 of the corresponding bit line structure 300. The second inner bit line spacer 410b, the second block bit line spacer 430b, the second upper bit line spacer 450b, and the second outer bit line spacer 460b may define the second air gap Ag2.

The highest level of the second air gap Ag2 may be the same as the level of the lower surface of the second upper bit line spacer 450b. For example, the highest level of the second air gap Ag2 may be the same as the highest level of the first air gap Ag1.

In the semiconductor device in accordance with the embodiment of the inventive concept, the upper bit line spacer 450 of the bit line spacers 400 may be located on each air-gap Ag. Accordingly, in the semiconductor device in accordance with the embodiment of the inventive concept, due to the air-gaps Ag, a defect of the storage contact plug 600 may be prevented.

Each of the storage contact plugs 600 may include a lower plug pad 610, an intermediate plug pattern 620, a plug barrier pattern 630, and an upper contact plug 640.

The interlayer insulating layer 700 may include a lower interlayer insulating layer 710 and an upper interlayer insulating layer 720.

FIGS. 4A to 32A and FIGS. 4B to 32B are cross-sectional views sequentially showing a method of forming a semiconductor device in accordance with an embodiment of the inventive concept. FIG. 19C is a plan view taken along line C-C' of FIGS. 19A and 19B.

A method of forming a semiconductor device in accordance with the embodiment of the inventive concept will be described with reference to FIGS. 1, 2A to 2C, 4A to 32A, 4B to 32B, and 19C. First, referring to FIGS. 1, 4A, and 4B, the method of forming a semiconductor device in accordance with the embodiment of the inventive concept may include a process of preparing a semiconductor substrate 100 on which first preliminary bit line structures 301 are formed.

The process of preparing the semiconductor substrate 100 on which the first preliminary bit line structures 301 are formed may include a process of preparing the semiconductor substrate 100 which includes an active region ACT and a field region FLD, a process of forming gate structures 200 crossing the active region ACT and the field region FLD in the semiconductor substrate 100, and a process of forming the first preliminary bit line structures 301 intersecting the gate structures 200 on the semiconductor substrate 100.

The process of preparing the semiconductor substrate 100 including the active region ACT and the field region FLD may include a process of forming a field trench 110t in the semiconductor substrate 100 and a process of forming a field insulating material 110 in the field trench 110t.

The process of forming the gate structures 200 may include a process of forming gate trenches extending in an X-axis direction in the semiconductor substrate 100, a process of forming gate insulating layers 210 in the gate trenches, a process of forming gate electrodes 230 on the gate insulating layers 210, and a process of forming gate capping layers 240 on the gate electrodes 230.

The process of forming the first preliminary bit line structures 301 may include a process of forming a lower bit line barrier layer 311 on the semiconductor substrate 100, a process of forming an upper bit line barrier layer 321 on the lower bit line barrier layer 311, a process of forming lower bit line electrodes 330 extending in a Y-axis direction on the upper bit line barrier layer 321, a process of forming DC plugs 340 sequentially passing through the lower bit line barrier layer 311, the upper bit line barrier layer 321, and the lower bit line electrodes 330, a process of forming intermediate bit line patterns 350 on the lower bit line electrodes 330 and the DC plugs 340, a process of forming upper bit line electrodes 360 on the intermediate bit line patterns 350, and a process of forming bit line capping patterns 370 on the upper bit line electrodes 360. For example, the process of forming the first preliminary bit line structures 301 may include a process of forming a lower bit line conductive layer on the upper bit line barrier layer 321, a process of forming a DC contact hole 300h by etching the semiconductor substrate 100, the lower bit line barrier layer 311, the upper bit line barrier layer 321, and the lower bit line conductive layer, a process of forming a DC conductive layer filling the DC contact hole 300h, a process of forming a bit line intermediate layer on the lower bit line conductive layer and the DC conductive layer, a process of forming an upper bit line conductive layer on the bit line intermediate layer, a process of forming a bit line capping layer on the upper bit line conductive layer, a process of patterning the lower bit line conductive layer, the DC conductive layer, the bit line intermediate layer, the upper bit line conductive layer, and the bit line capping layer in the Y-axis direction, and a process of forming a DC insulating layer 300a in the DC contact hole 300h.

Figure 5A:
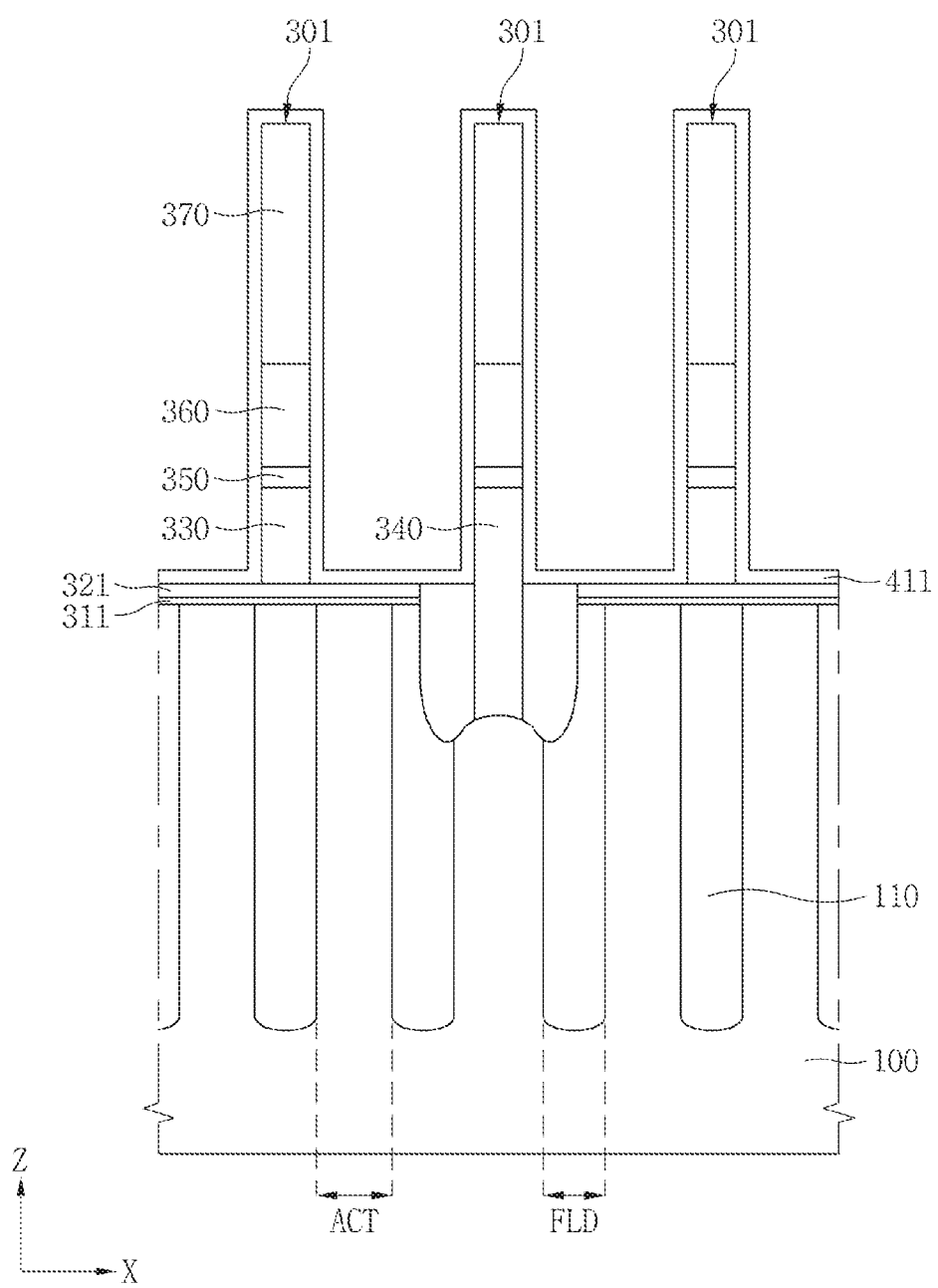
Figure 5B:
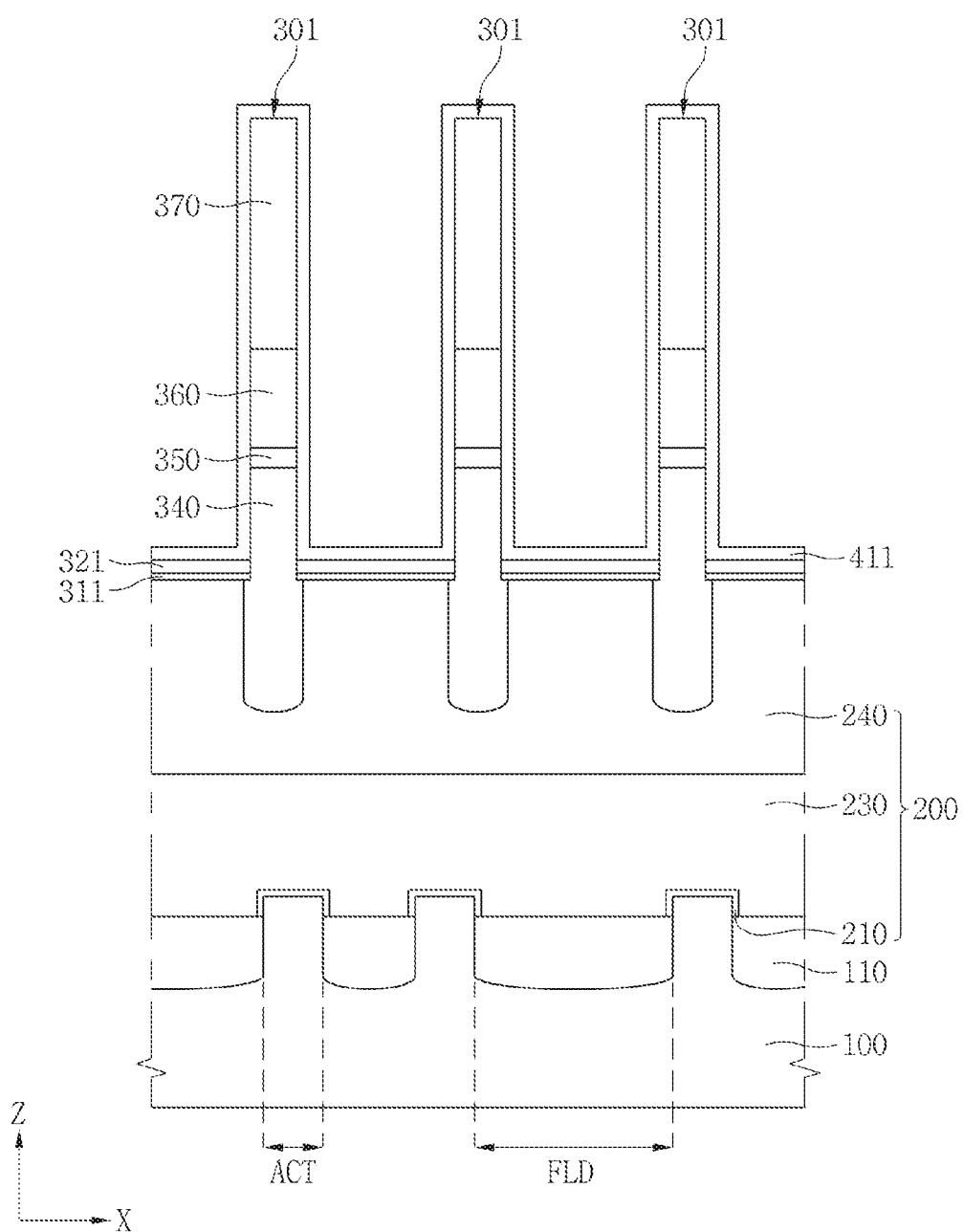

Referring to FIGS. 5A and 5B, the method of forming a semiconductor device in accordance with the embodiment of the inventive concept may include a process of forming an inner spacer insulating layer 411 on the first preliminary bit line structures 301.

The process of forming the inner spacer insulating layer 411 may include a process of depositing an insulating material on the semiconductor substrate 100 including the first preliminary bit line structures 301. For example, the process of forming the inner spacer insulating layer 411 may include a process of depositing silicon nitride on the semiconductor substrate 100 including the first preliminary bit line structures 301.

Figure 6A:
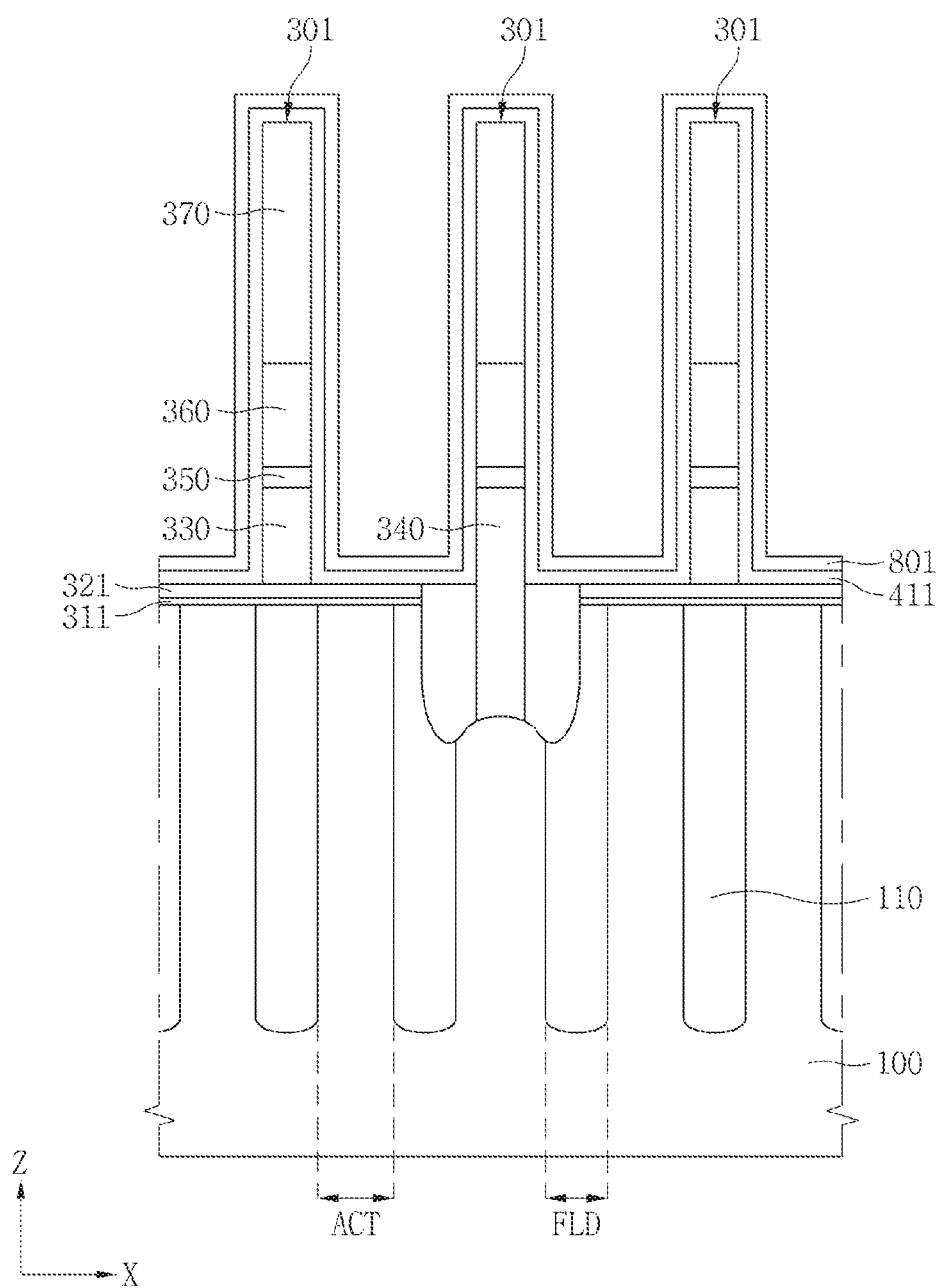
Figure 6B:
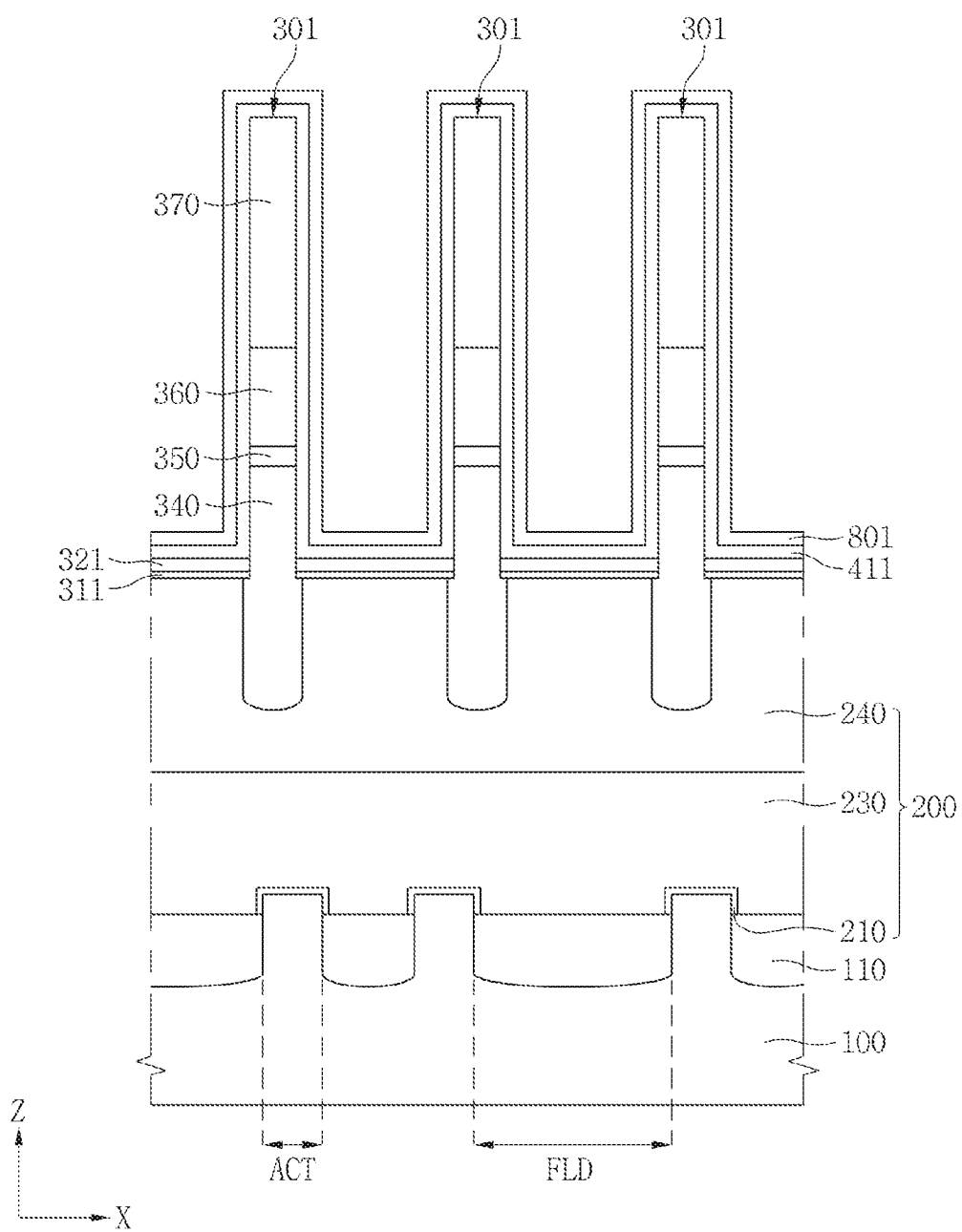

Referring to FIGS. 6A and 6B, the method of forming a semiconductor device in accordance with the embodiment of the inventive concept may include a process of forming a sacrificial spacer insulating layer 801 on the inner spacer insulating layer 411.

The process of forming the sacrificial spacer insulating layer 801 may include a process of depositing an insulating material on the inner spacer insulating layer 411. The process of forming the sacrificial spacer insulating layer 801 may include a process of depositing an insulating material having an etch selectivity with respect to the inner spacer insulating layer 411. For example, the process of forming the sacrificial spacer insulating layer 801 may include a process of depositing silicon oxide on the inner spacer insulating layer 411.

Figure 7A:
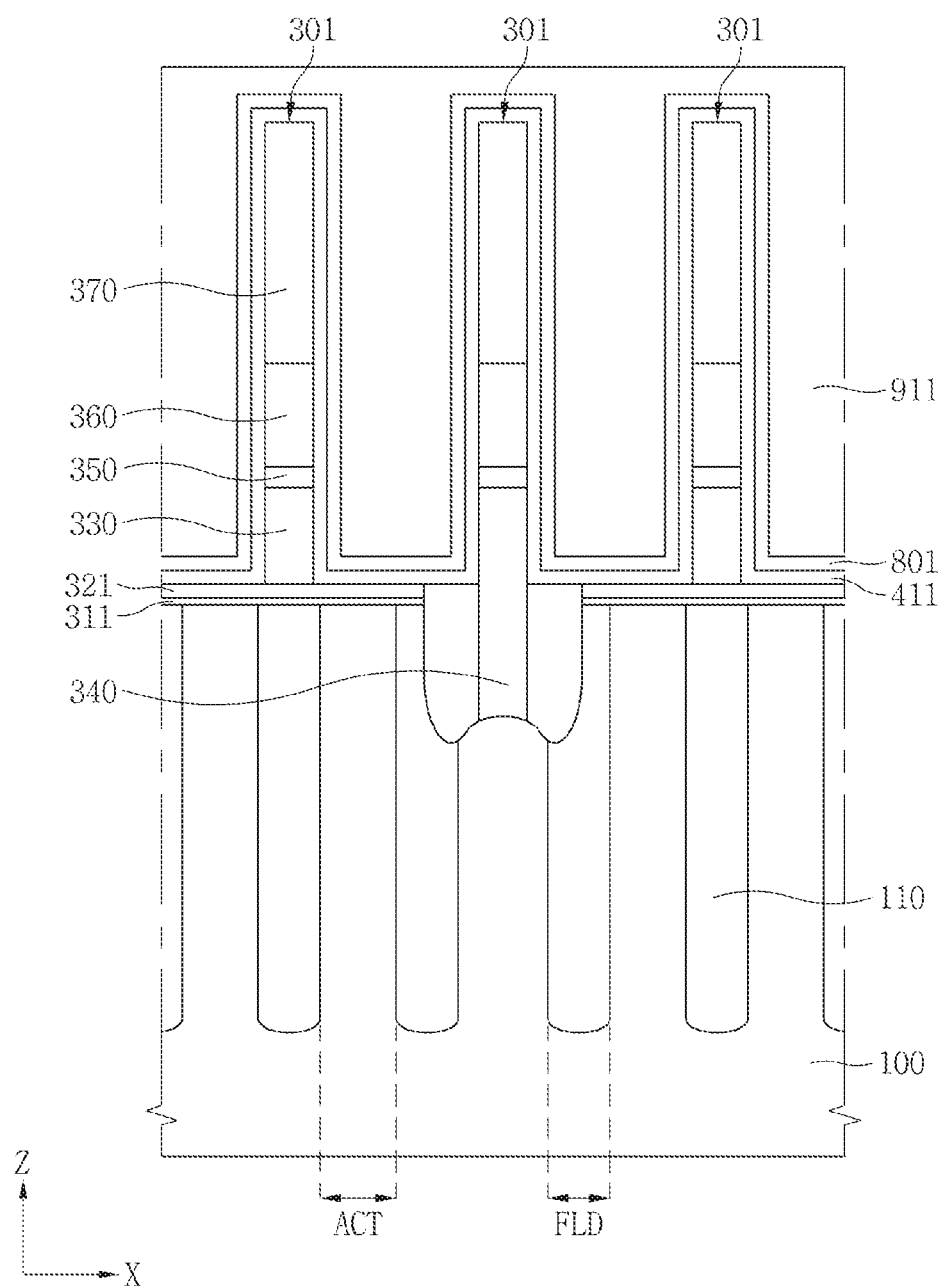
Figure 7B:
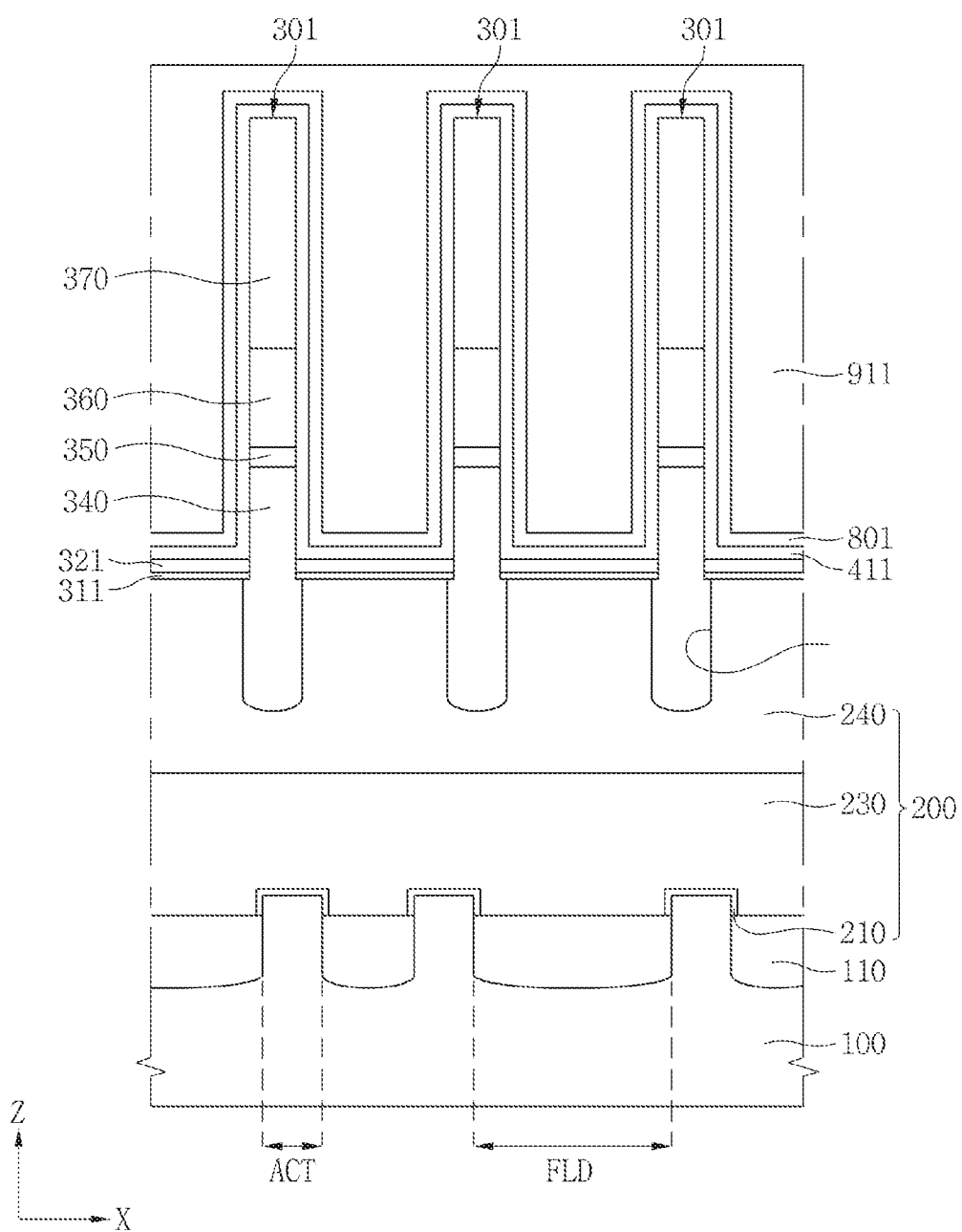

Referring to FIGS. 7A and 7B, the method of forming a semiconductor device in accordance with the embodiment of the inventive concept may include a process of forming a first molding insulating layer 911 on the sacrificial spacer insulating layer 801.

The process of forming the first molding insulating layer 911 may include a process of depositing an insulating material on the sacrificial spacer insulating layer 801. The process of forming the first molding insulating layer 911 may include a process of filling between the sacrificial spacer insulating layers 801 with an insulating material. For example, the process of forming the first molding insulating layer 911 may include a process of forming a spin-on-hardmask (SOH) layer on the sacrificial spacer insulating layer 801.

Figure 8A:
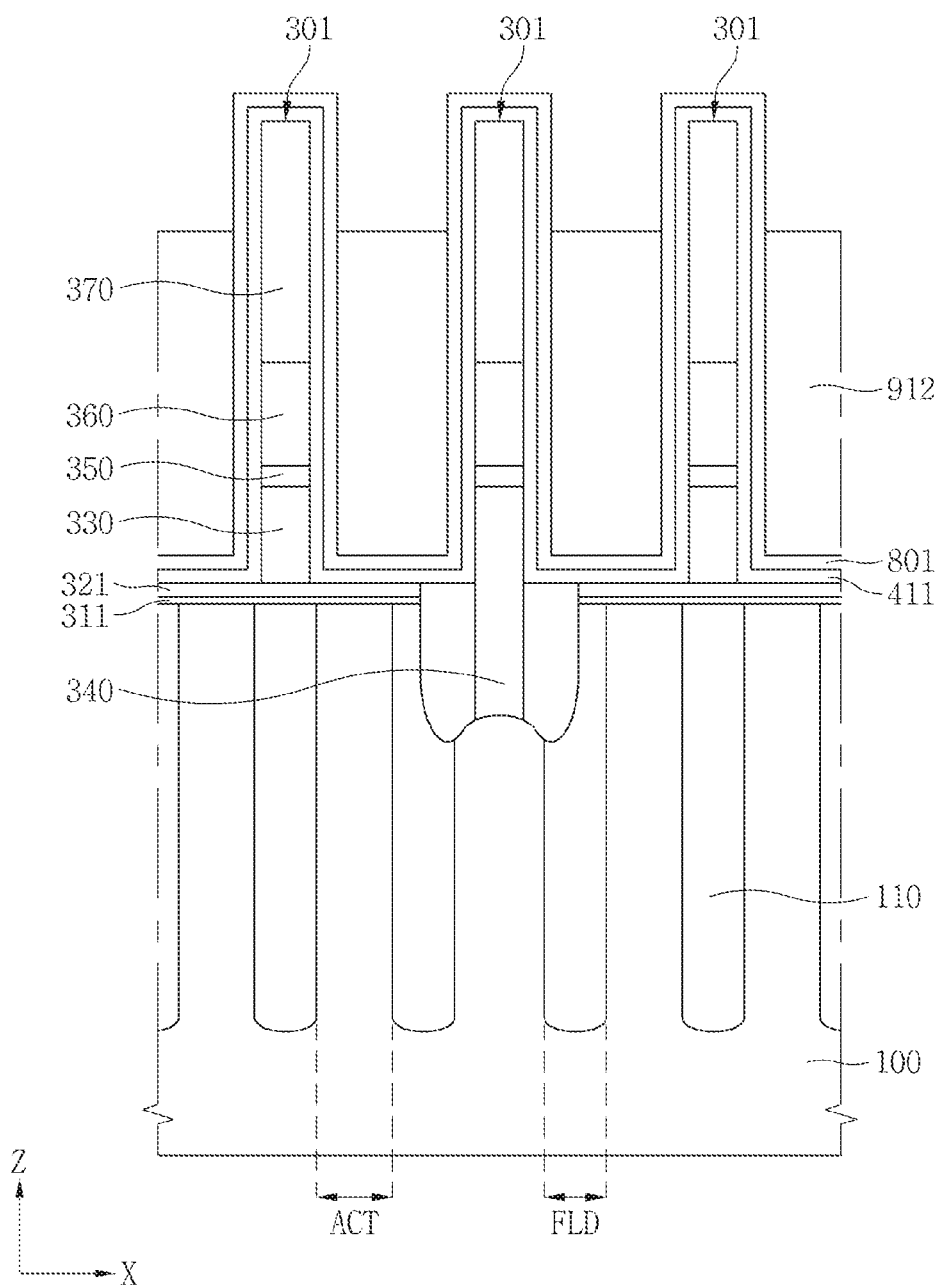
Figure 8B:
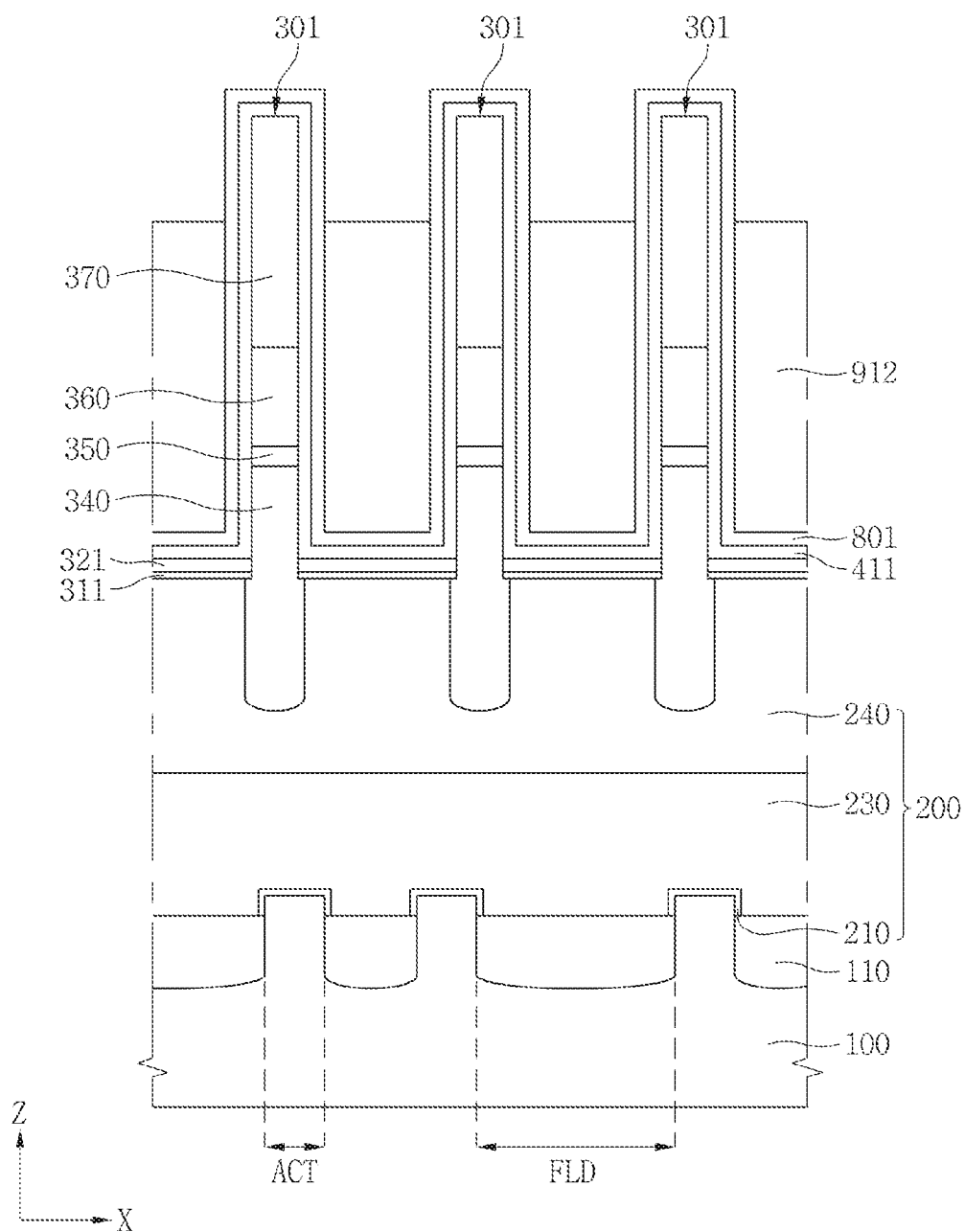

Referring to FIGS. 8A and 8B, the method of forming a semiconductor device in accordance with the embodiment of the inventive concept may include a process of forming first molding insulating patterns 912 between vertical regions of the sacrificial spacer insulating layer 801.

The process of forming the first molding insulating patterns 912 may include a process of performing an etch-back process on the first molding insulating layer 911. For example, the process of forming the first molding insulating patterns 912 may include a process of performing the etch-back process on the first molding insulating layer 911 such that the highest level of the first molding insulating patterns 912 is lower than the highest level of the first preliminary bit line structures 301.

Figure 9A:
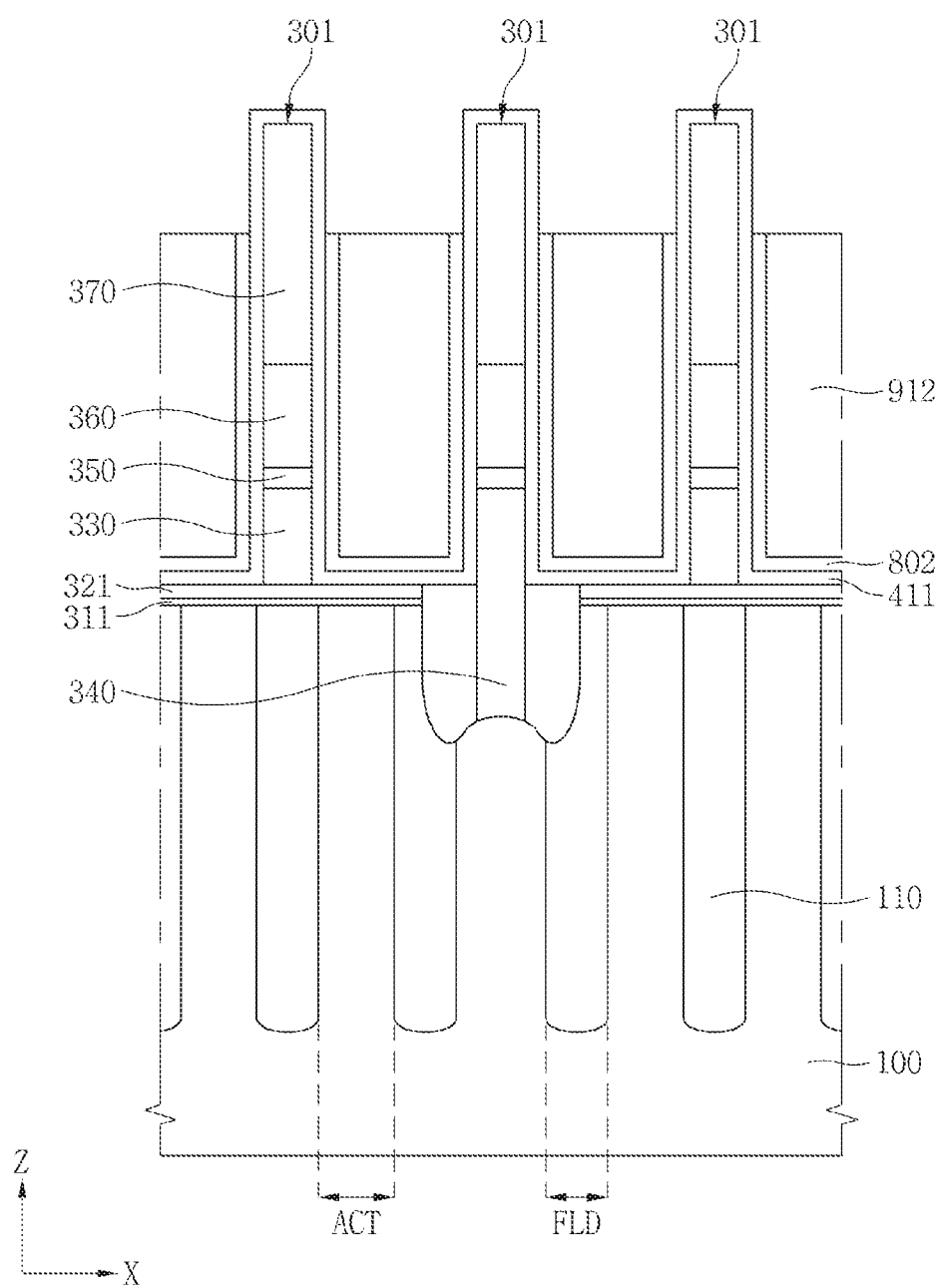
Figure 9B:
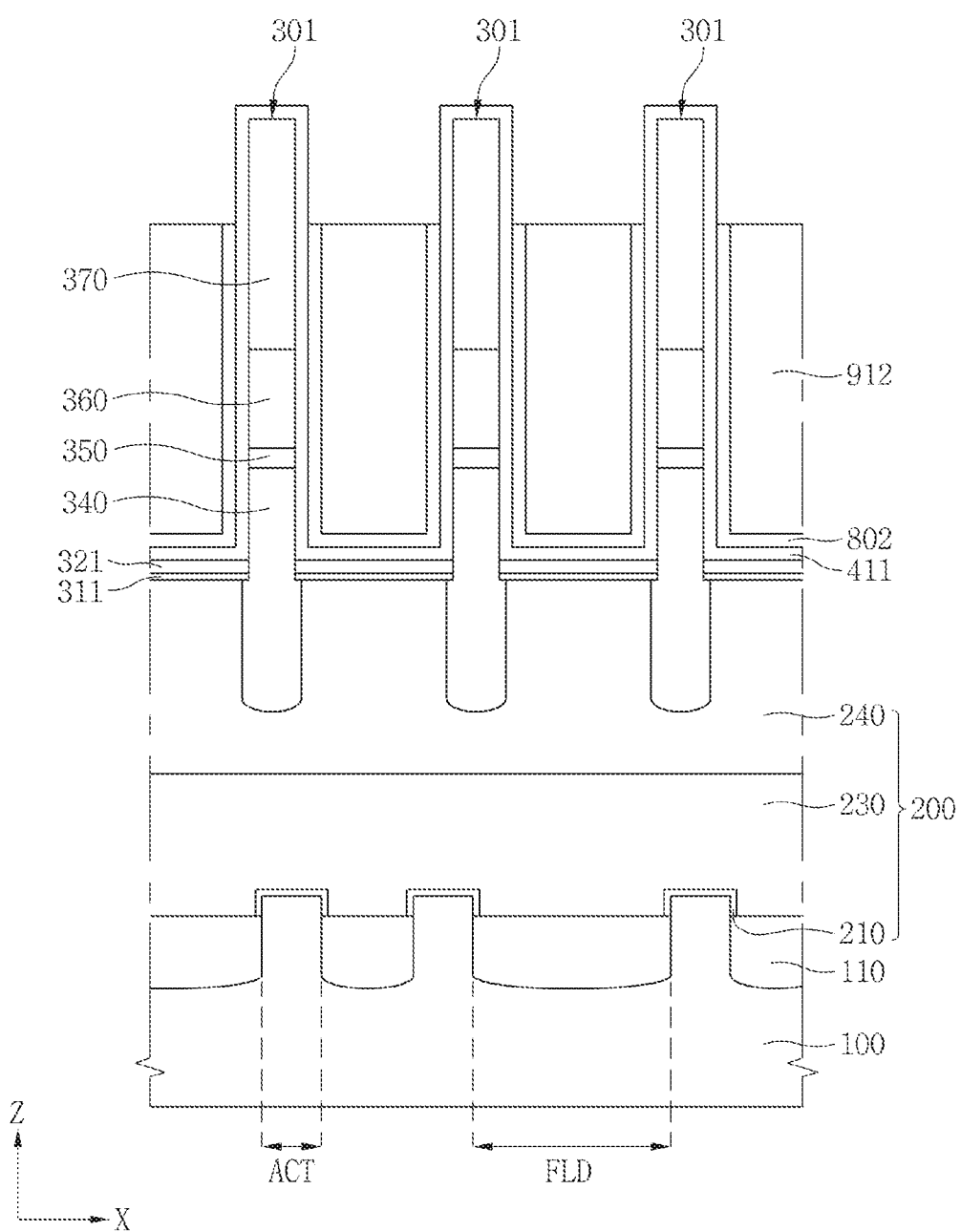

Referring to FIGS. 9A and 9B, the method of forming a semiconductor device in accordance with the embodiment of the inventive concept may include a process of forming first sacrificial insulating patterns 802 between the first preliminary bit line structures 301 and the first molding insulating patterns 912.

The process of forming the first sacrificial insulating patterns 802 may include a process of performing an etch-back process on the sacrificial spacer insulating layer 801. For example, the process of forming the first sacrificial insulating patterns 802 may include a process of performing the etch-back process on the sacrificial spacer insulating layer 801 such that the highest level of the sacrificial spacer insulating layer 801 is the same as the highest level of the first molding insulating patterns 912.

In the method of forming a semiconductor device in accordance with the embodiment of the inventive concept, the inner spacer insulating layer 411 may be exposed at upper portions of the first preliminary bit line structures 301 in the process of forming the first sacrificial insulating patterns 802.

Figure 10A:
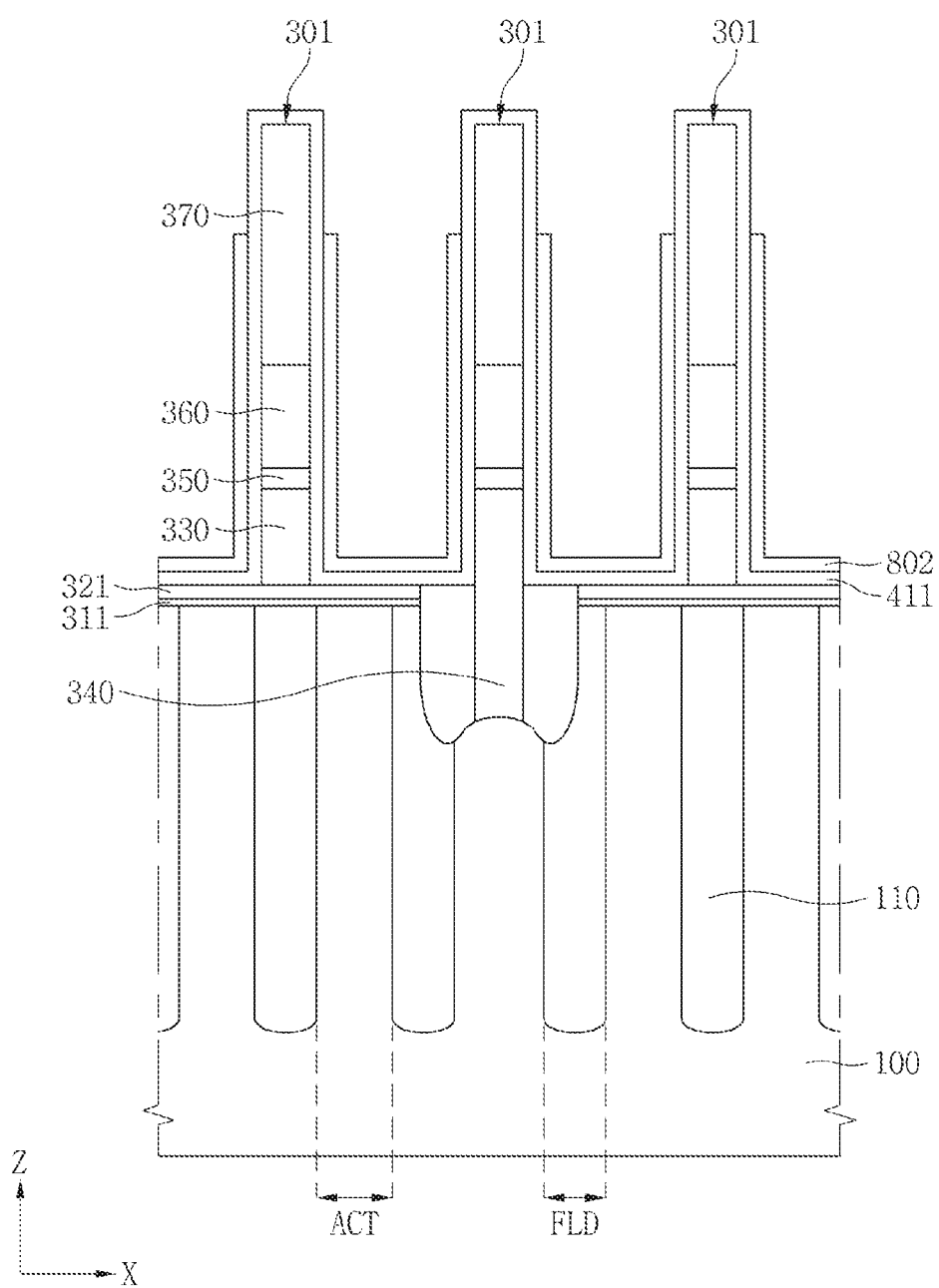
Figure 10B:
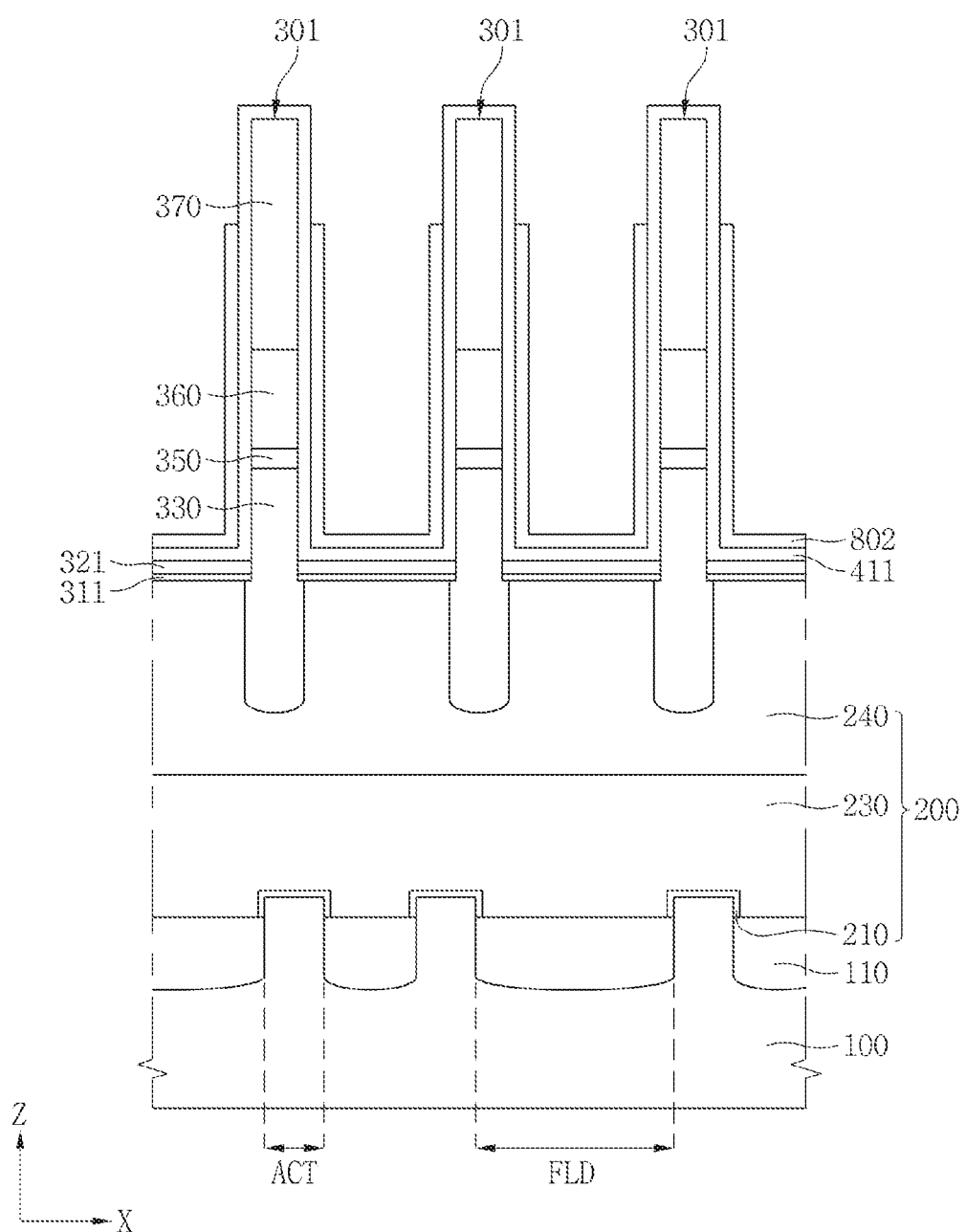

Referring to FIGS. 10A and 10B, the method of forming a semiconductor device in accordance with the embodiment of the inventive concept may include a process of removing the first molding insulating patterns 912.

Figure 11A:
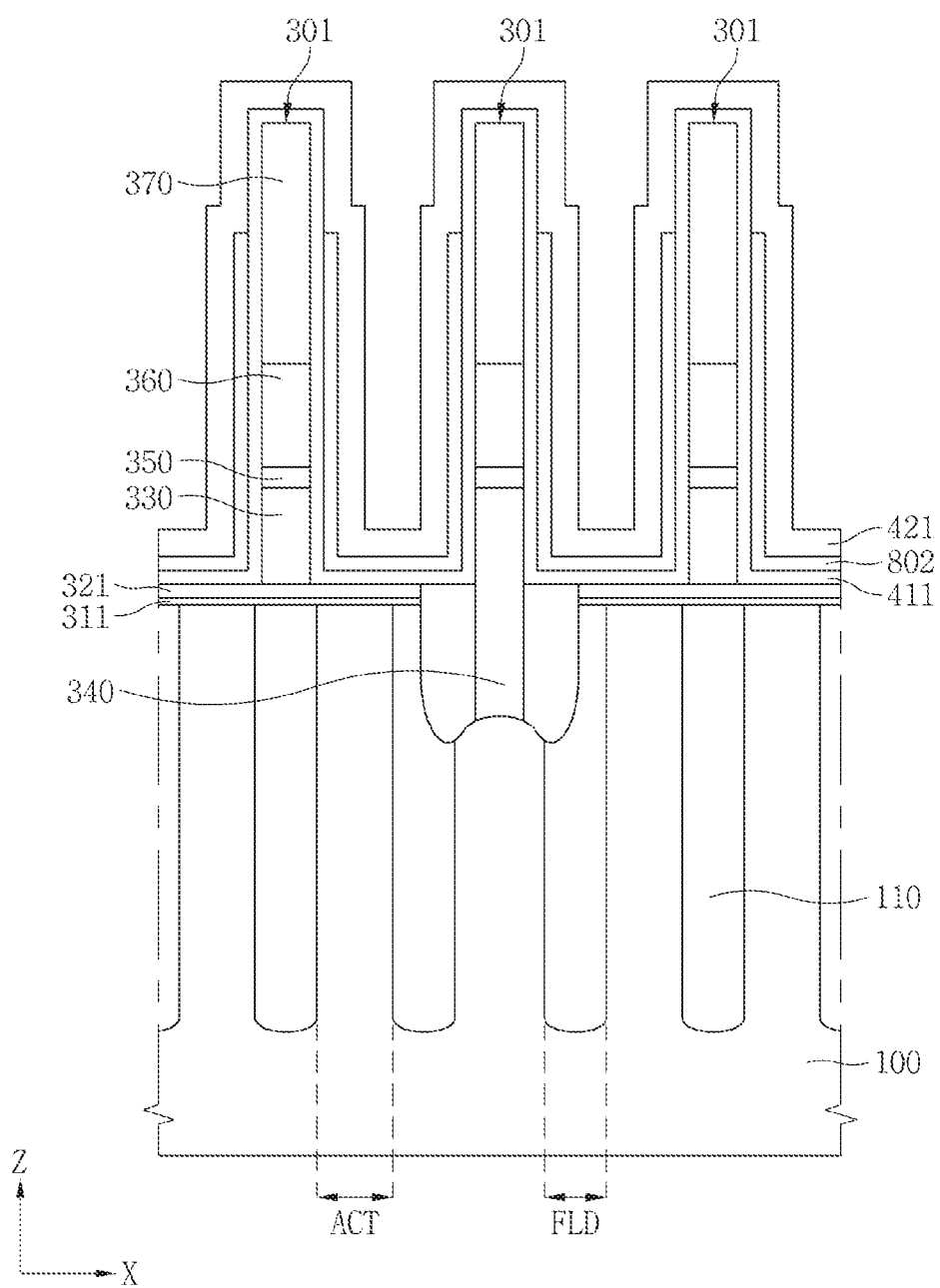
Figure 11B:
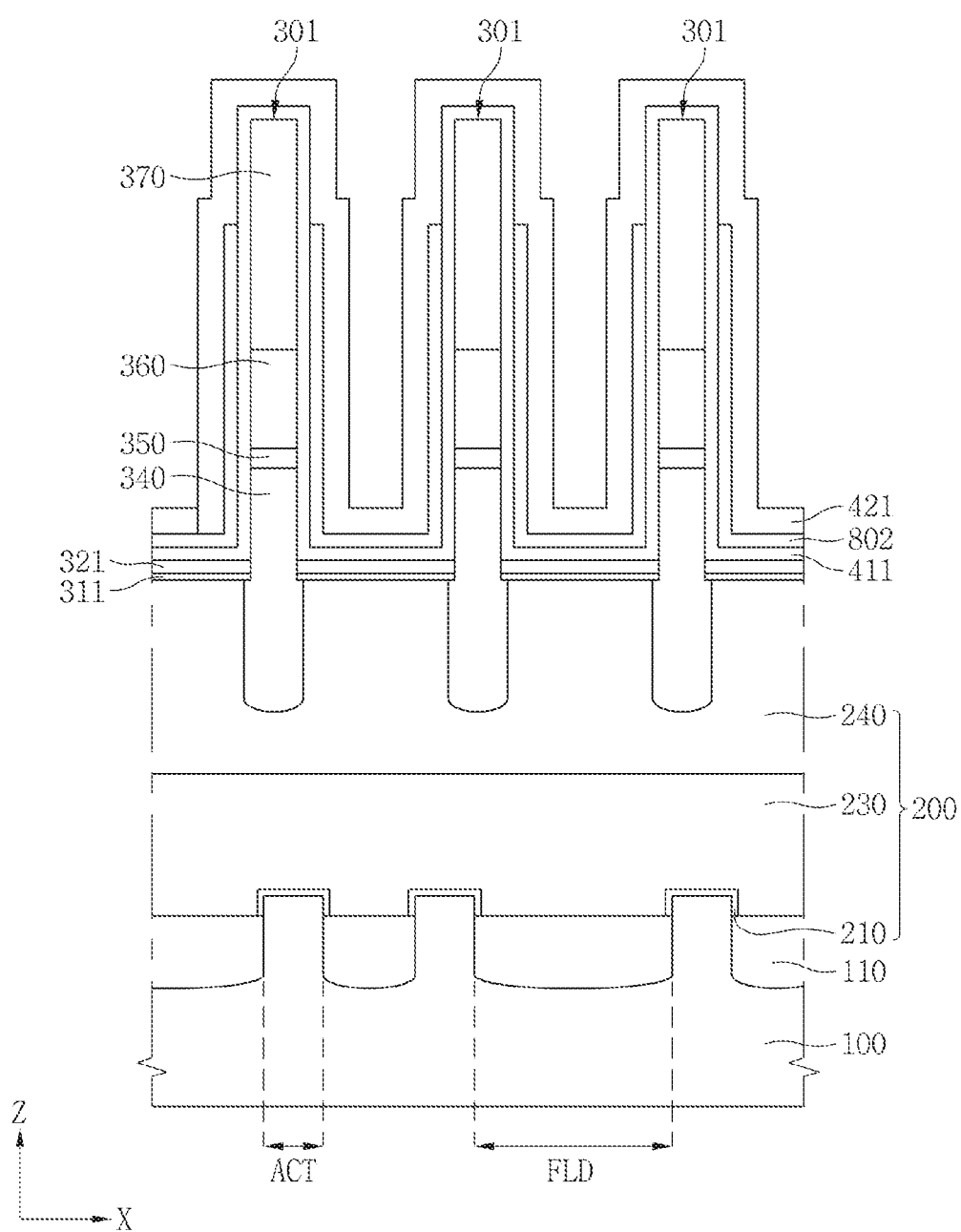

Referring to FIGS. 11A and 11B, the method of forming a semiconductor device in accordance with the embodiment of the inventive concept may include a process of forming an outer spacer insulating layer 421 on the inner spacer insulating layer 411 and the first sacrificial insulating patterns 802.

The process of forming the outer spacer insulating layer 421 may include a process of depositing an insulating material on the semiconductor substrate 100 on which the first molding insulating patterns 912 have been removed. The process of forming the outer spacer insulating layer 421 may include a process of depositing an insulating material having an etch selectivity with respect to the first sacrificial insulating patterns 802. For example, the process of forming the outer spacer insulating layer 421 may include a process of depositing silicon nitride on the semiconductor substrate 100 including the first sacrificial insulating patterns 802.

Figure 12A:
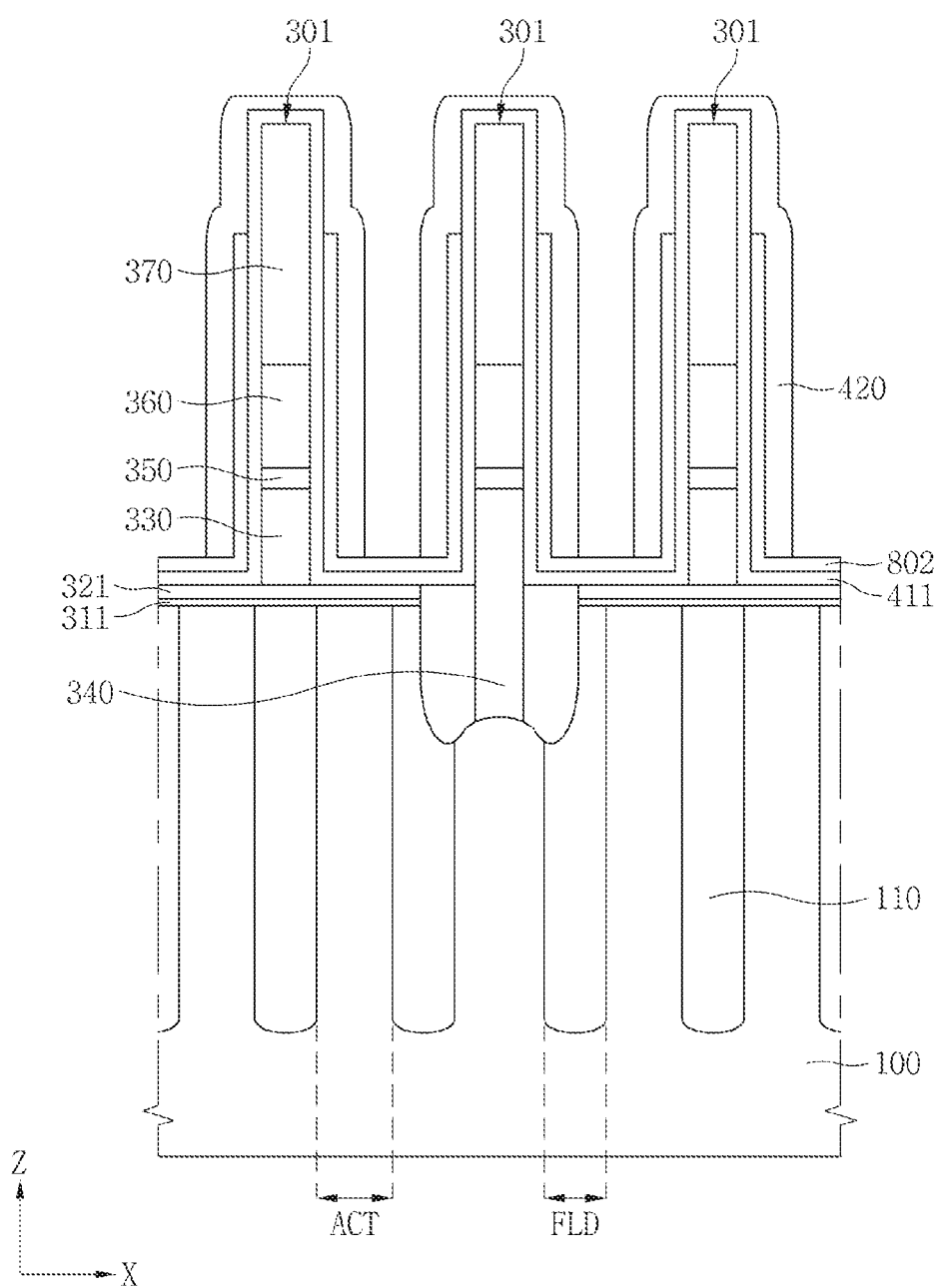
Figure 12B:
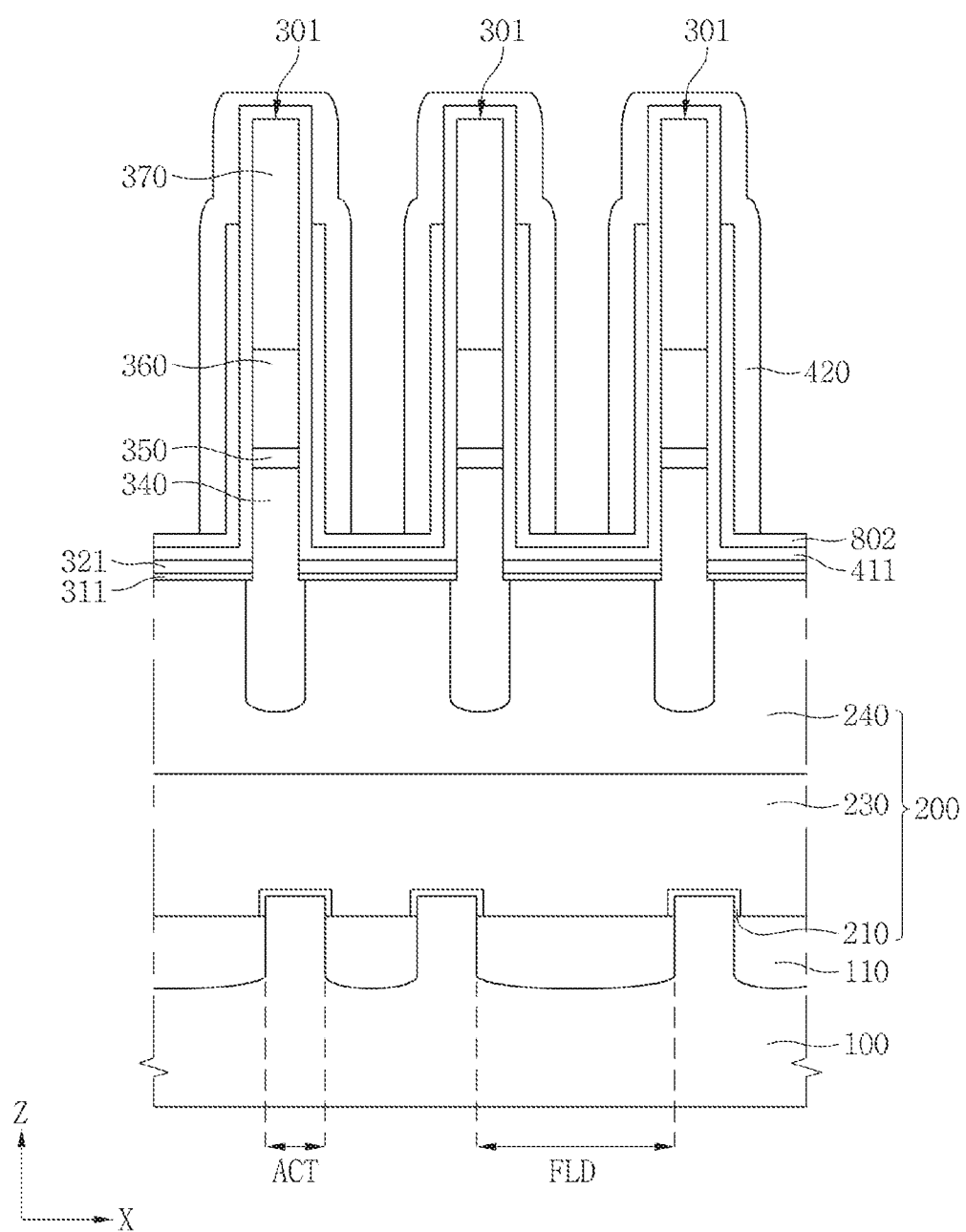

Referring to FIGS. 12A and 12B, the method of forming a semiconductor device in accordance with the embodiment of the inventive concept may include a process of forming outer bit line spacers 420 on the first preliminary bit line structures 301.

The process of forming the outer bit line spacers 420 may include a process of covering the inner spacer insulating layer 411 exposed by the first sacrificial insulating patterns 802 with the outer bit line spacers 420. The process of forming the outer bit line spacers 420 may include a process of covering vertical regions of the first sacrificial insulating patterns 802 with the outer bit line spacers 420. For example, the process of forming the outer bit line spacers 420 may include a process of dry-etching the outer spacer insulating layer 421.

Figure 13A:
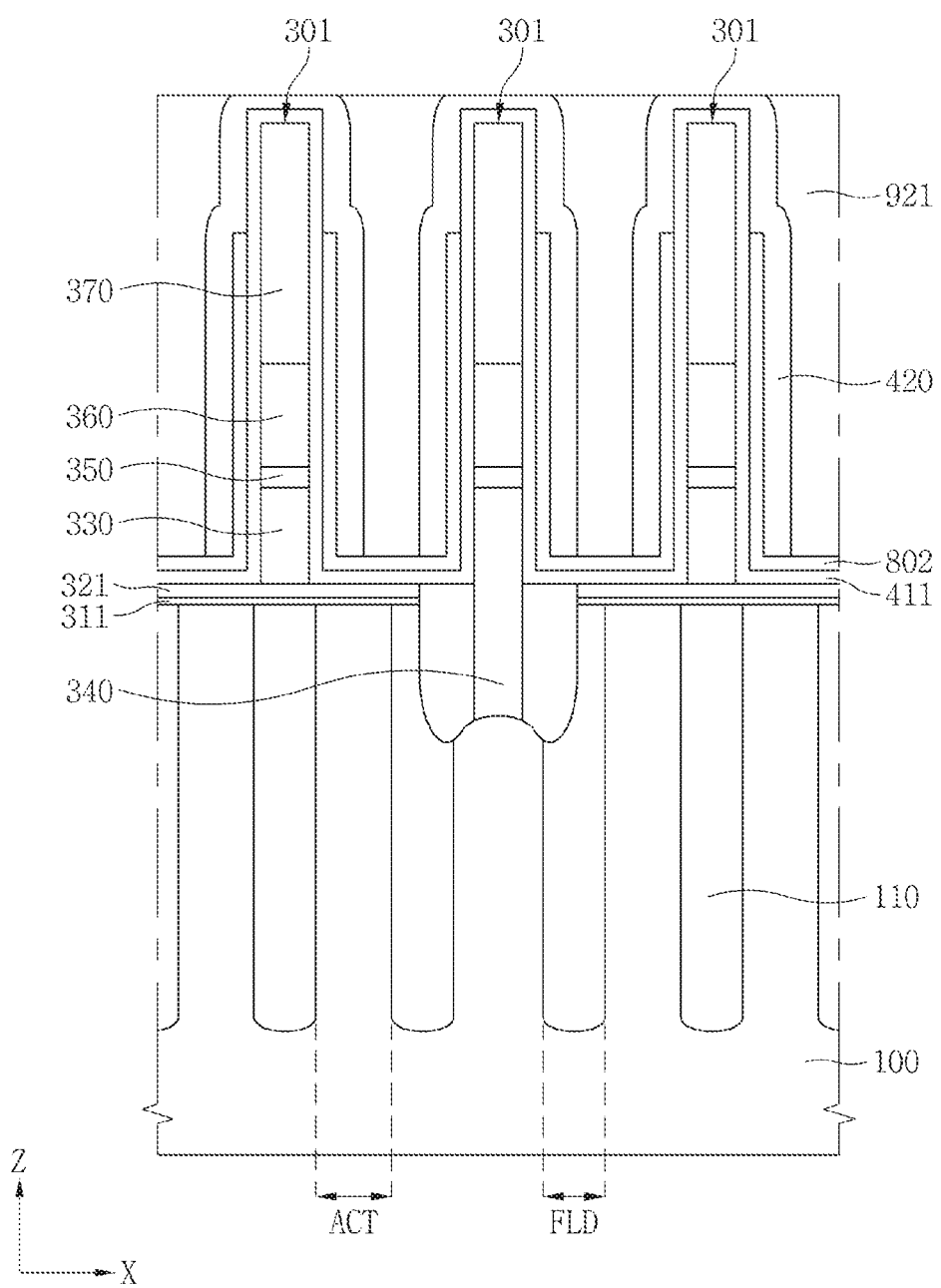
Figure 13B:
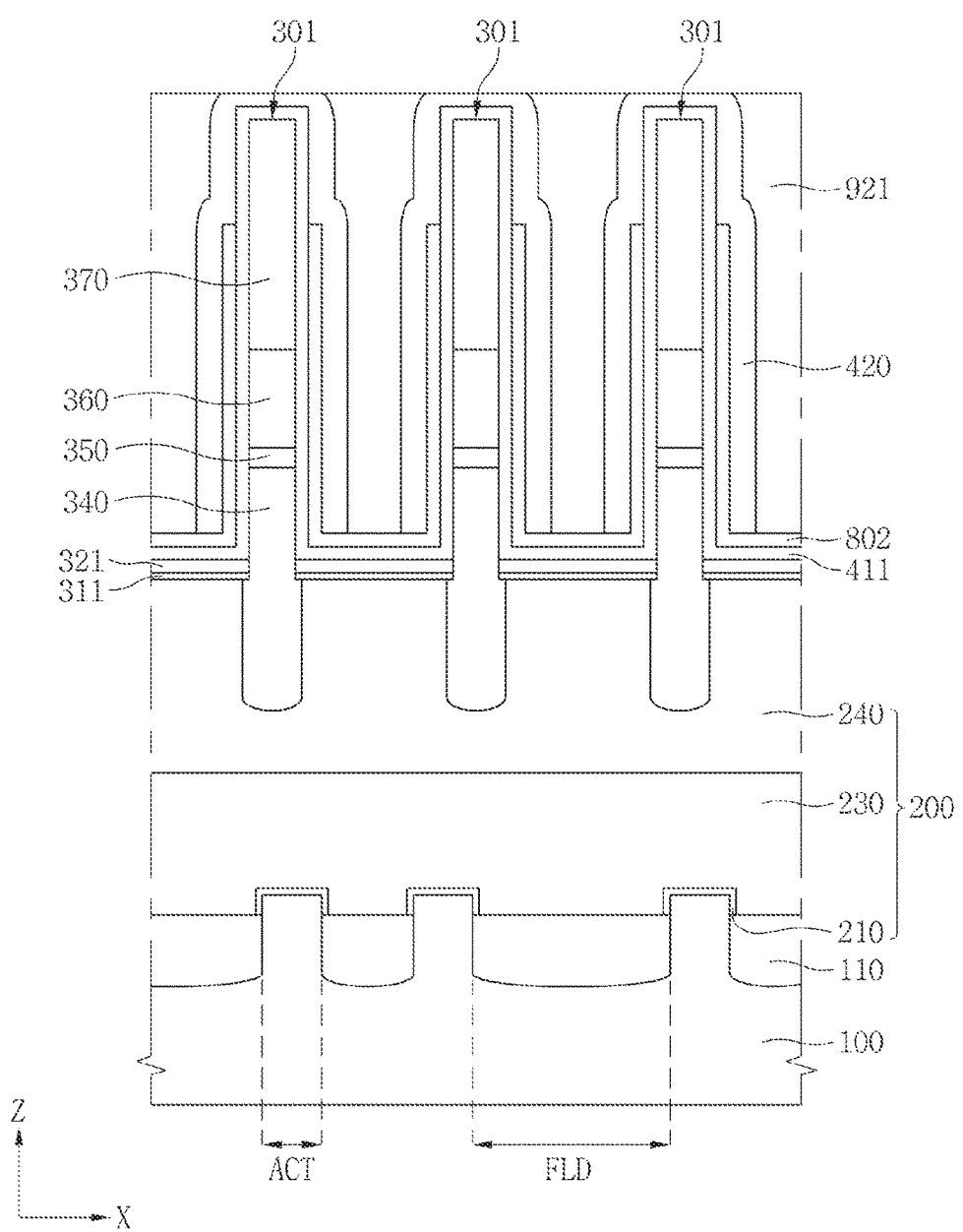

Referring to FIGS. 13A and 13B, the method of forming a semiconductor device in accordance with the embodiment of the inventive concept may include a process of forming second molding insulating patterns 921 between the outer bit line spacers 420.

The process of forming the second molding insulating patterns 921 may include a process of filling between the outer bit line spacers 420 with an insulating material. The process of forming the second molding insulating patterns 921 may a process of include depositing an insulating material having an etch selectivity with the outer bit line spacers 420. For example, the process of forming the second molding insulating patterns 921 may include a process of filling between the outer bit line spacers 420 with silicon oxide.

Figure 14A:
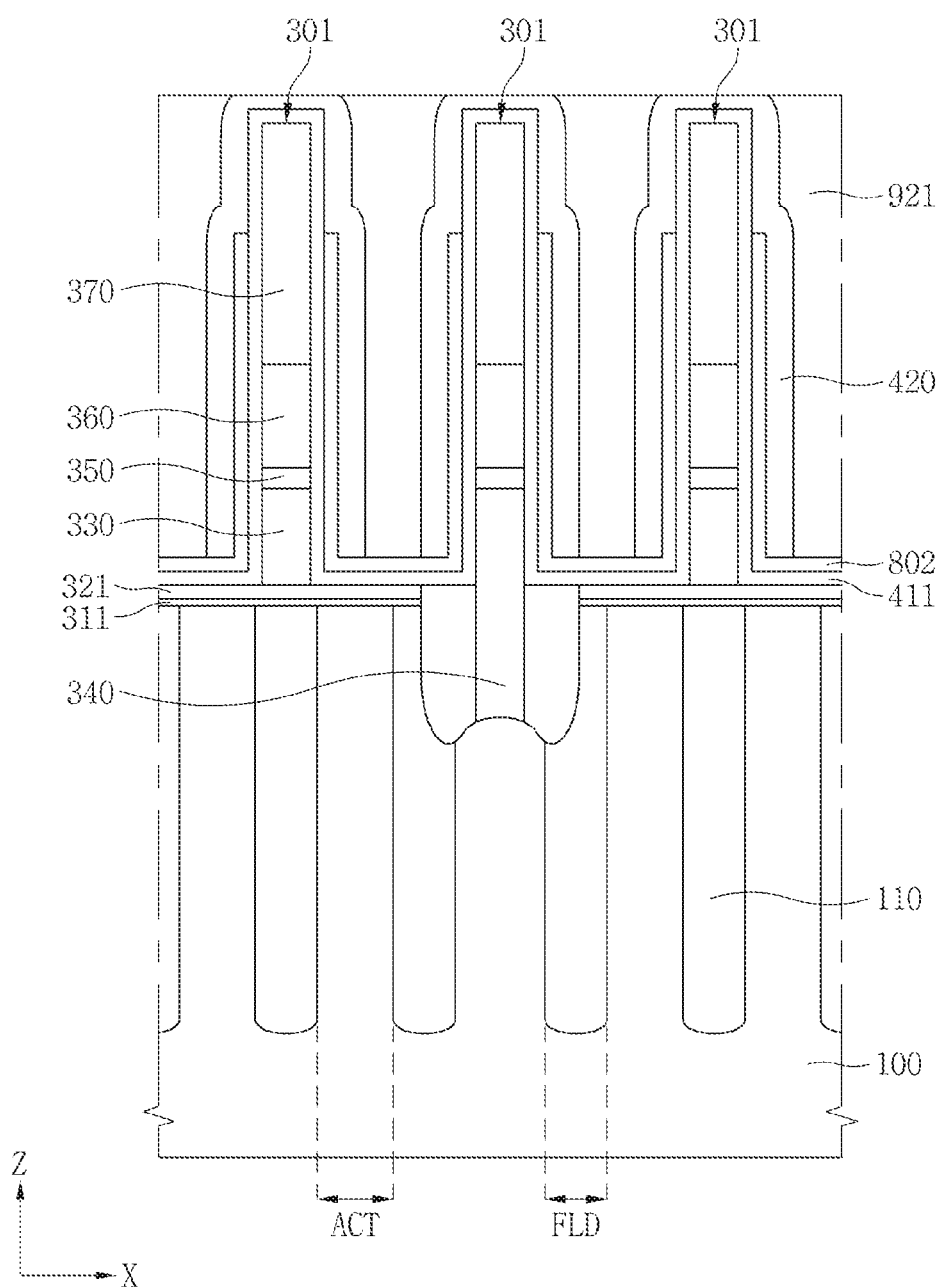
Figure 14B:
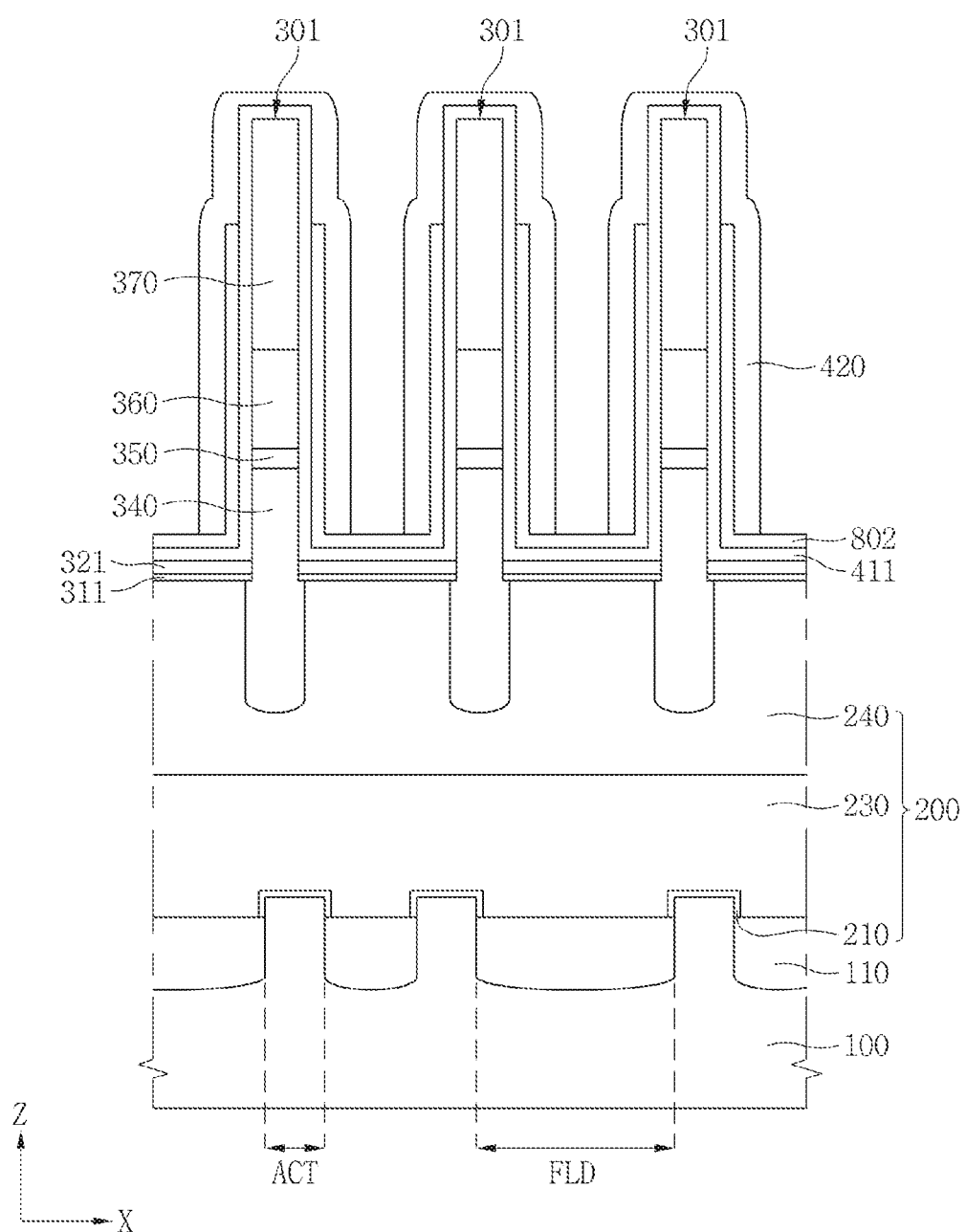

Referring to FIGS. 14A and 14B, the method of forming a semiconductor device in accordance with the embodiment of the inventive concept may include a process of removing the second molding insulating patterns 921 located on the gate structures 200.

Figure 15A:
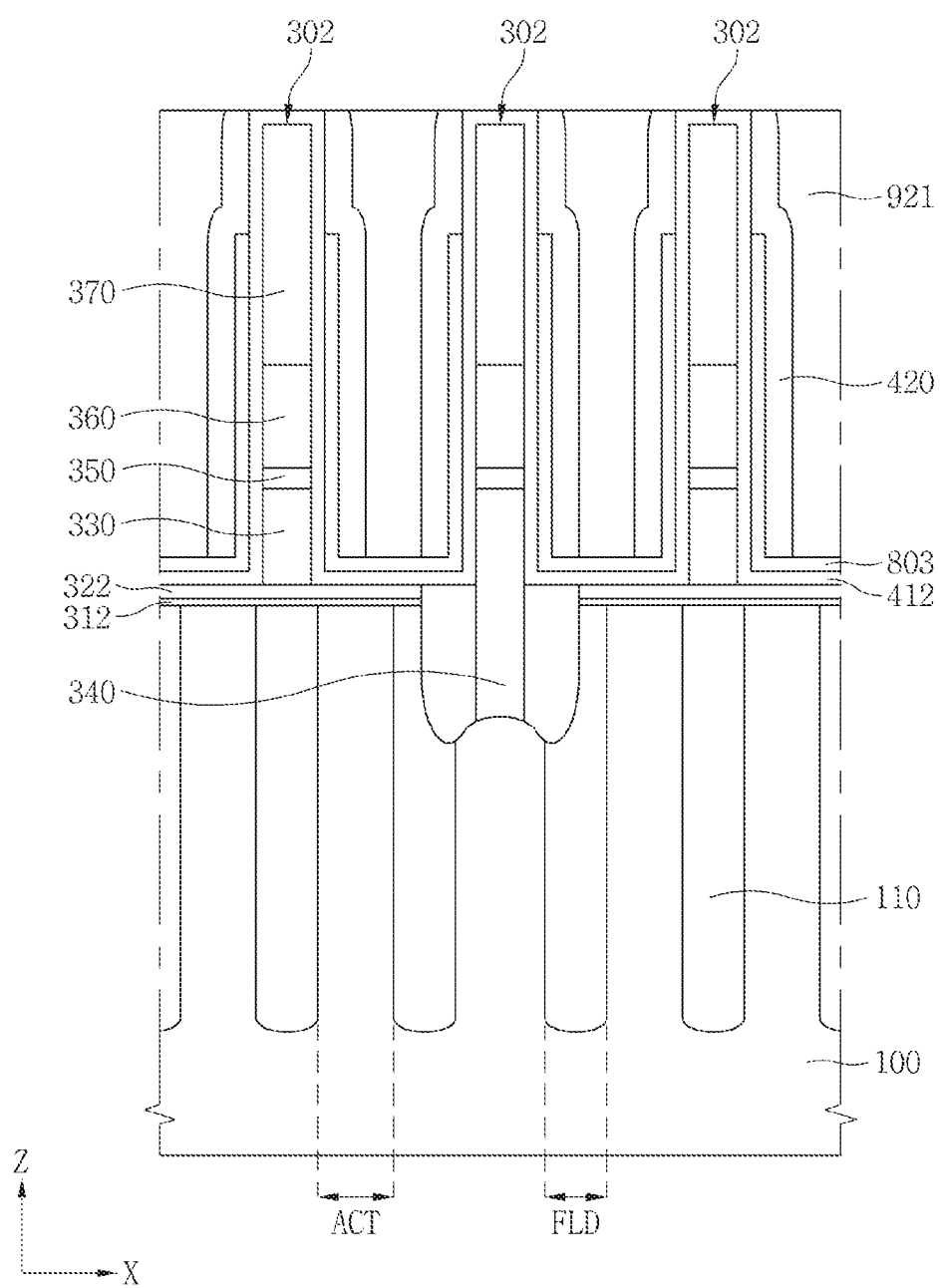
Figure 15B:
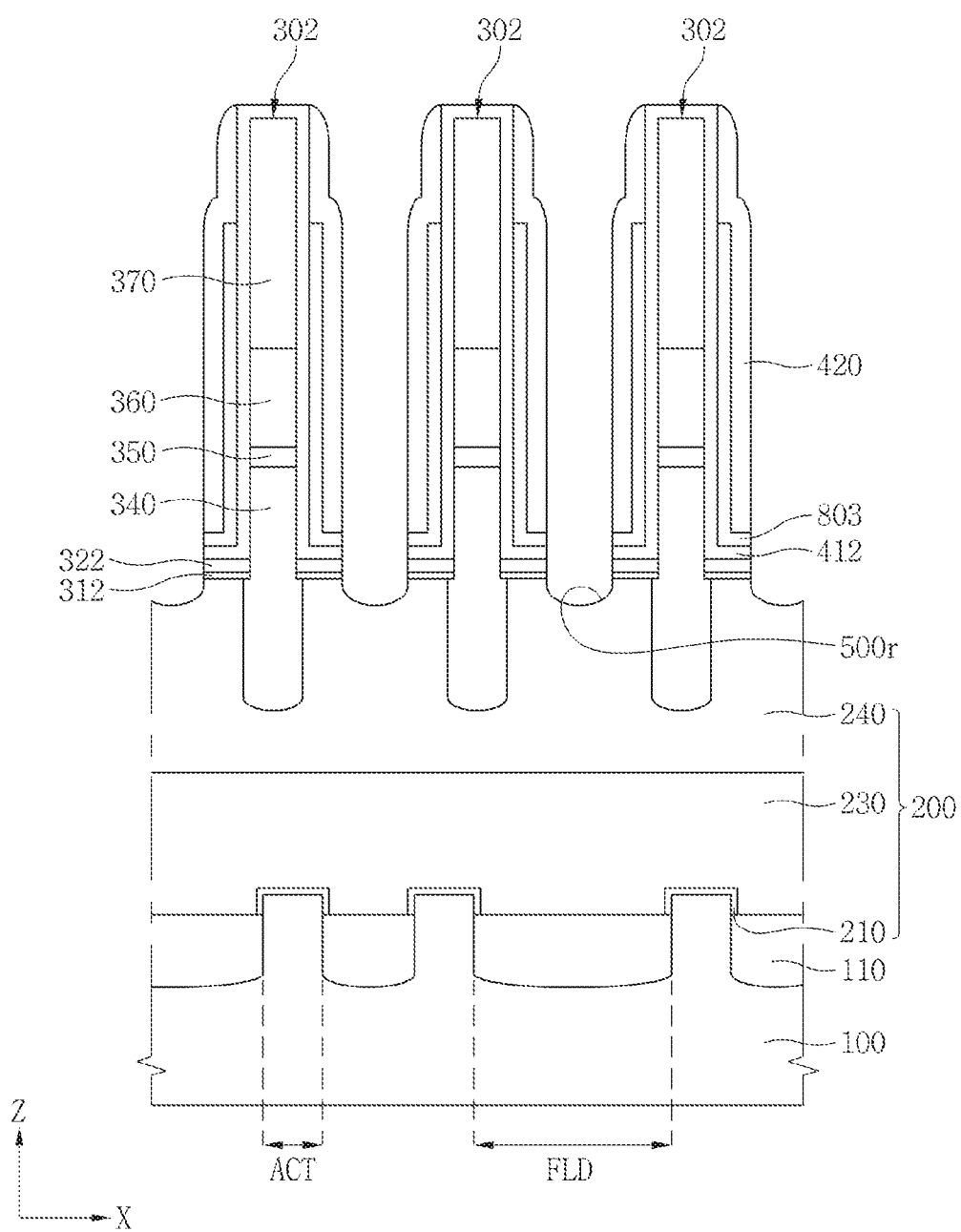

Referring to FIGS. 15A and 15B, the method of forming a semiconductor device in accordance with the embodiment of the inventive concept may include a process of forming first recesses 500*r* in the gate capping layers 240.

The process of forming the first recesses 500*r* may include a process of forming second sacrificial insulating patterns 803 by etching the first sacrificial insulating patterns 802, a process of forming an inner spacer pattern 412 by etching the inner spacer insulating layer 411, a process of forming a preliminary upper bit line barrier pattern 322 by etching the upper bit line barrier layer 321, a process of forming a preliminary lower bit line barrier pattern 312 by etching the lower bit line barrier layer 311, and a process of recessing the gate capping layers 240.

The process of forming the second sacrificial insulating patterns 803 may include a process of removing the first sacrificial insulating patterns 802 exposed by the outer bit line spacers 420 and the second molding insulating patterns 921. For example, the process of forming the second sacrificial insulating patterns 803 may include a process of dry-etching the first sacrificial insulating patterns 802 using the second molding insulating patterns 921 and the outer bit line spacers 420 as an etch mask.

The process of forming the inner spacer pattern 412 may include a process of removing the inner spacer insulating layer 411 exposed by the second sacrificial insulating patterns 803. For example, the process of forming the inner spacer pattern 412 may include a process of dry-etching the inner spacer insulating layer 411 using the second molding insulating patterns 921, the outer bit line spacers 420, and the second sacrificial insulating patterns 803 as an etch mask.

The process of forming the preliminary upper bit line barrier patterns 322 may include a process of removing the upper bit line barrier layer 321 exposed by the inner spacer pattern 412. For example, the process of forming the preliminary upper bit line barrier patterns 322 may include a process of etching the upper bit line barrier layer 321 using the second molding insulating patterns 921, the outer bit line spacers 420, the second sacrificial insulating patterns 803, and the inner spacer pattern 412 as an etch mask.

The process of forming the preliminary lower bit line barrier patterns 312 may include a process of removing the lower bit line barrier layer 311 exposed by the preliminary upper bit line barrier patterns 322. For example, the process of forming the preliminary lower bit line barrier patterns 312 may include a process of etching the lower bit line barrier layer 311 using the second molding insulating patterns 921, the outer bit line spacers 420, the second sacrificial insulating patterns 803, the inner spacer pattern 412, and the preliminary upper bit line barrier patterns 322 as an etch mask.

In the method of forming a semiconductor device in accordance with the embodiment of the inventive concept, the second preliminary bit line structures 302 may be formed by forming the preliminary upper bit line barrier pattern 322 and forming the preliminary lower bit line barrier pattern 312.

Figure 16A:
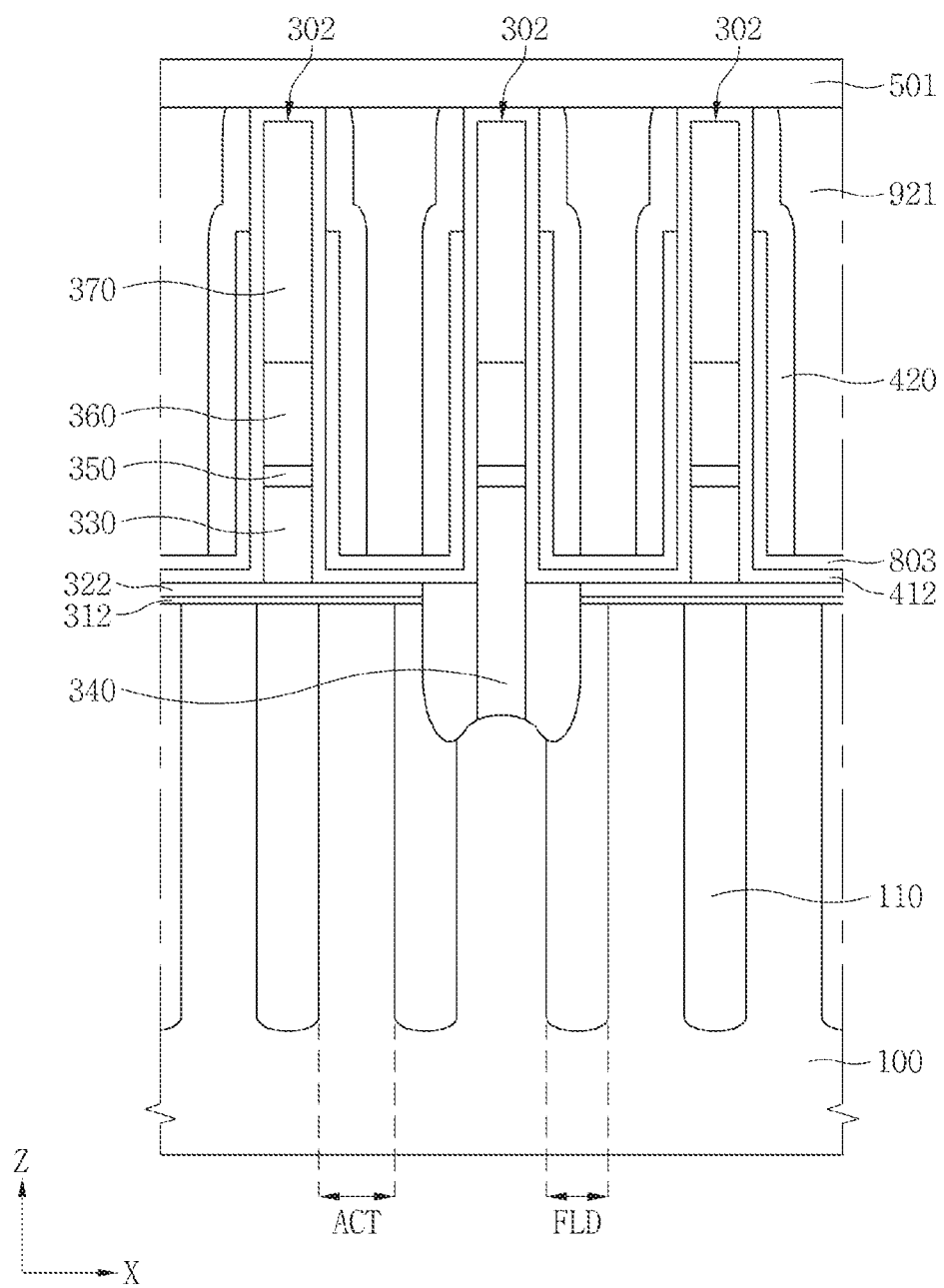
Figure 16B:
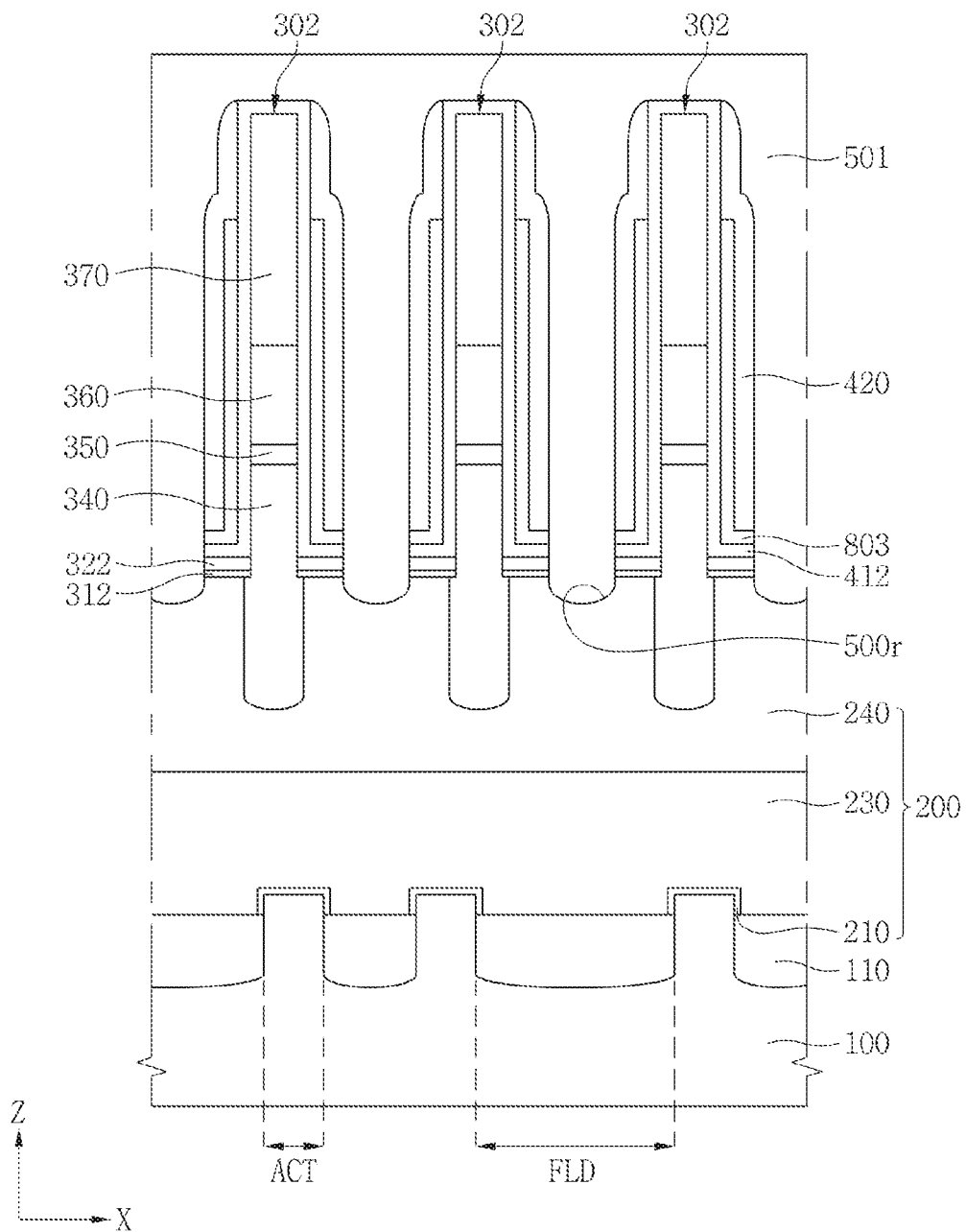

Referring to FIGS. 16A and 16B, the method of forming a semiconductor device in accordance with the embodiment of the inventive concept may include a process of forming a plug isolation insulating layer 501 filling the first recesses 500r.

The process of forming the plug isolation insulating layer 501 may include a process of depositing an insulating material on the semiconductor substrate 100 including the first recesses 500r. The process of forming the plug isolation insulating layer 501 may include a process of filling between the second molding insulating patterns 921 and the outer bit line spacers 420 with an insulating material. The process of forming the plug isolation insulating layer 501 may include a process of depositing an insulating material having an etch selectivity with respect to the second molding insulating patterns 921. For example, the process of forming the plug isolation insulating layer 501 may include a process of depositing silicon nitride on the semiconductor substrate 100 including the first recesses 500r.

Figure 17A:
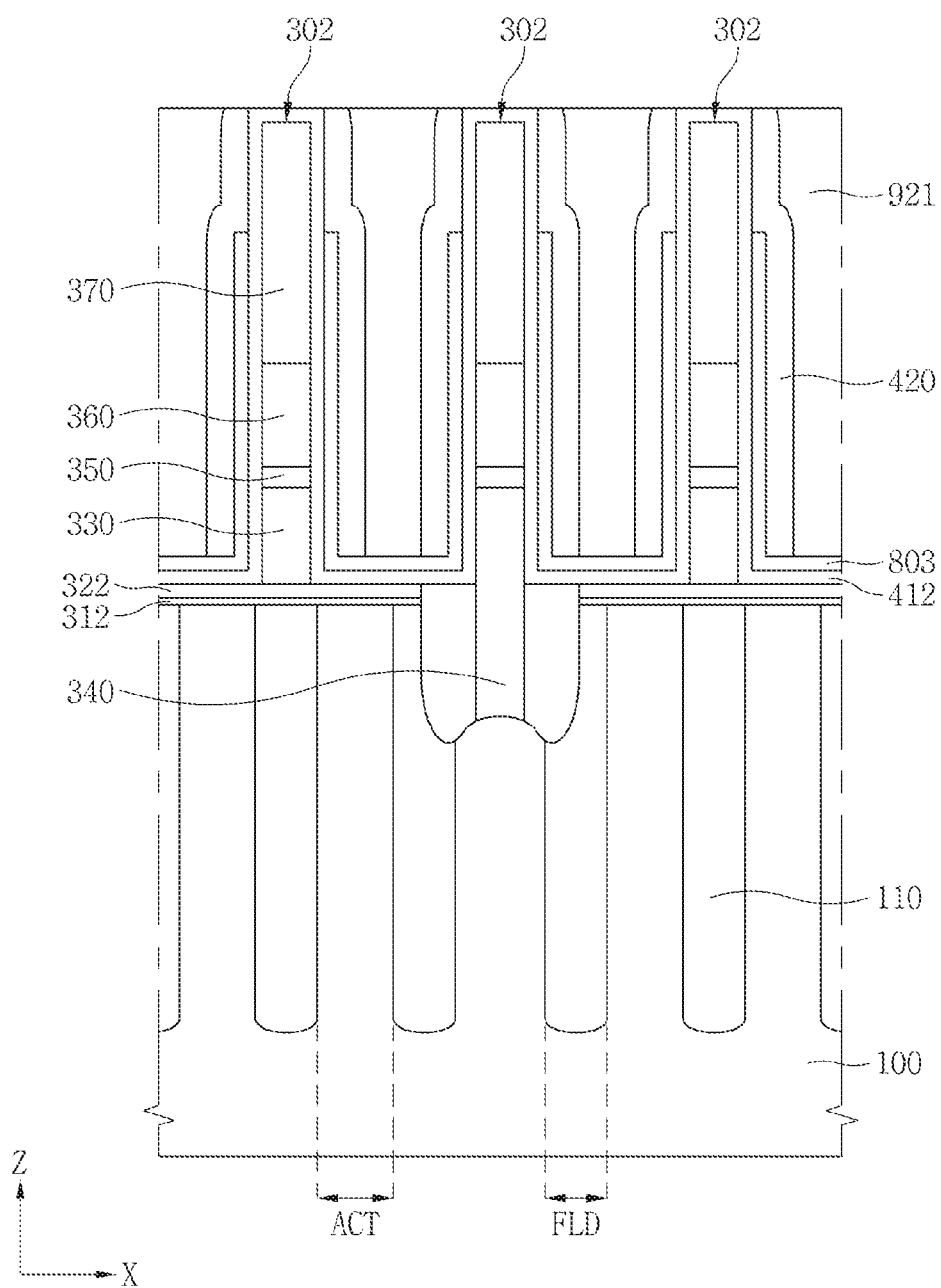
Figure 17B:
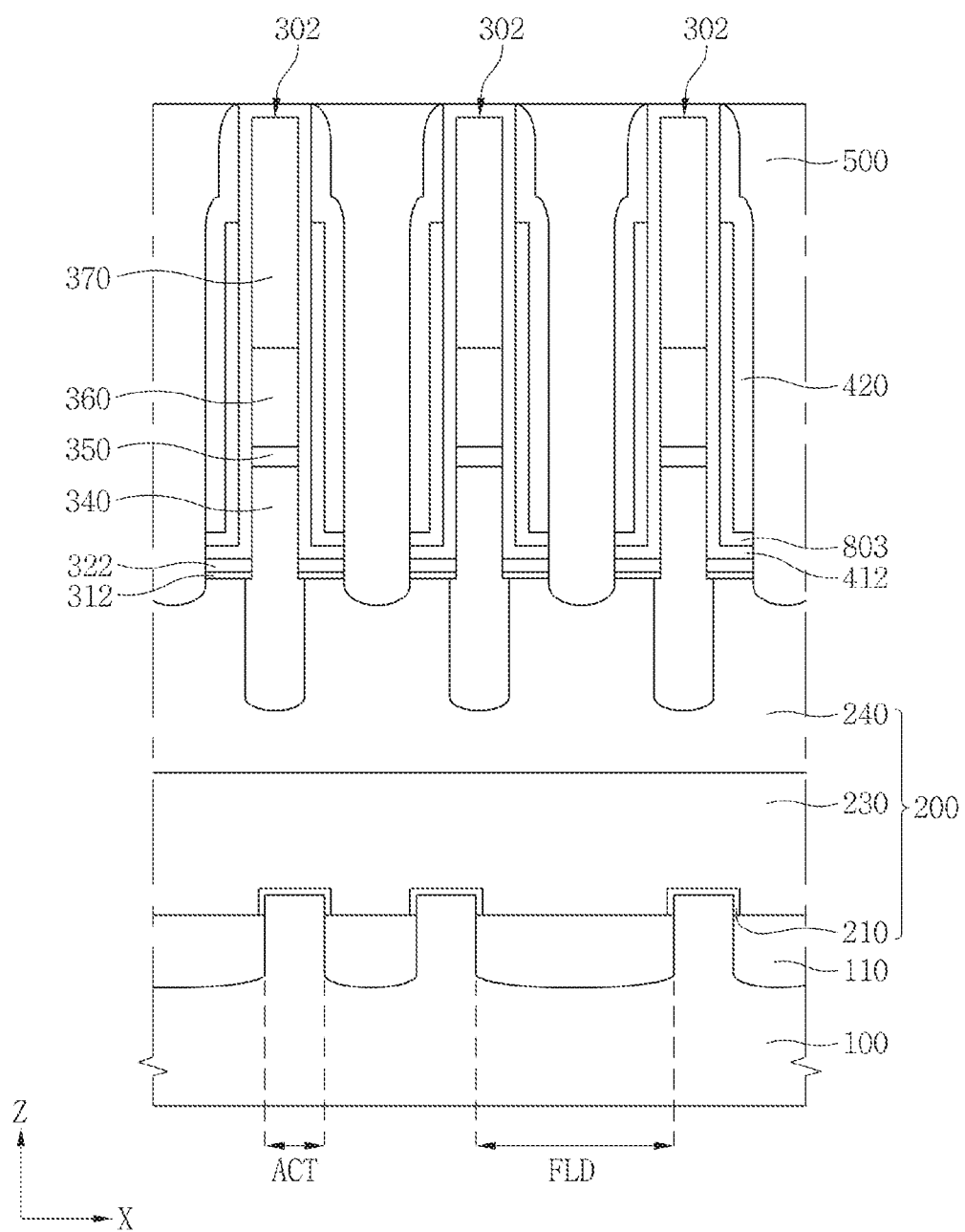

Referring to FIGS. 17A and 17B, the method of forming a semiconductor device in accordance with the embodiment of the inventive concept may include a process of forming plug isolation patterns 500 on the gate structures 200.

The process of forming the plug isolation patterns 500 may include a process of planarizing the plug isolation insulating layer 501. For example, the process of forming the plug isolation patterns 500 may include a process of planarizing the plug isolation insulating layer 501 to expose upper surfaces of the outer bit line spacers 420.

The process of planarizing the plug isolation insulating layer 501 may include a chemical mechanical polishing (CMP) process.

Figure 18A:
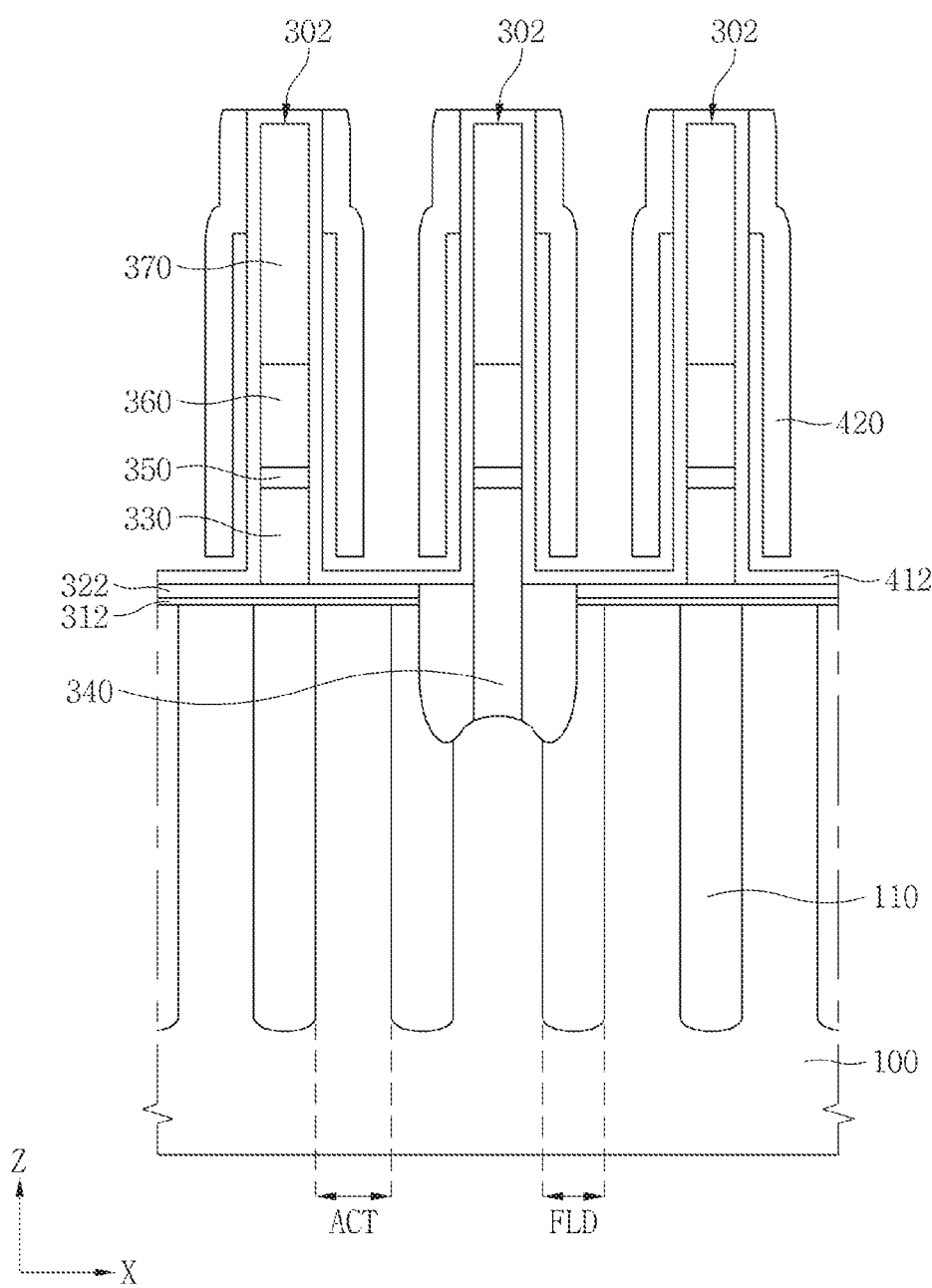
Figure 18B:
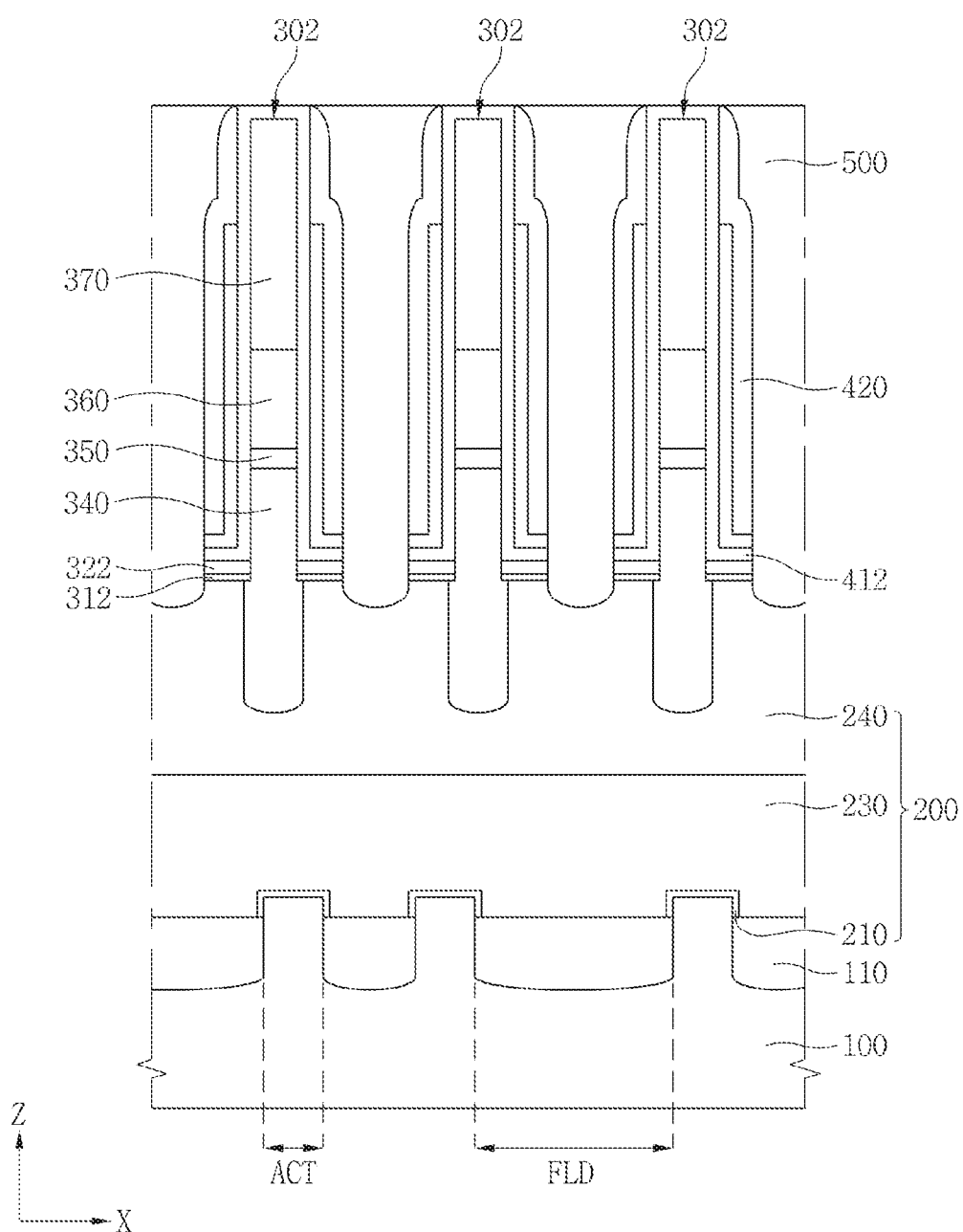

Referring to FIGS. 18A and 18B, the method of forming a semiconductor device in accordance with the embodiment of the inventive concept may include a process of removing the second molding insulating patterns 921 and the second sacrificial insulating patterns 803.

The process of removing the second molding insulating patterns 921 and the second sacrificial insulating patterns 803 may be performed in a single chamber. For example, the process of removing the second molding insulating patterns 921 and the second sacrificial insulating patterns 803 may include a process of wet-etching the second molding insulating patterns 921 and the second sacrificial insulating patterns 803.

Figure 19A:
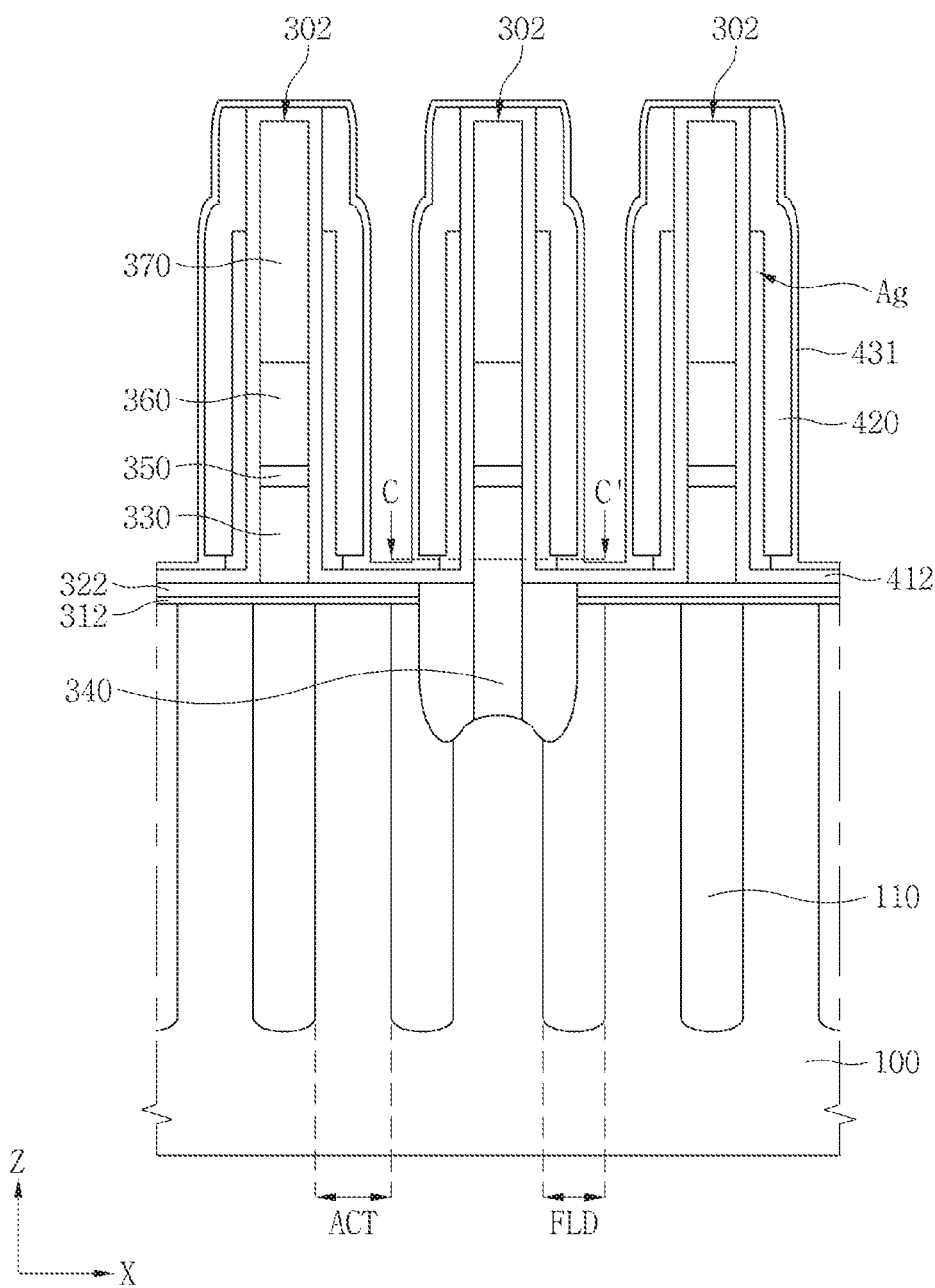
Figure 19B:
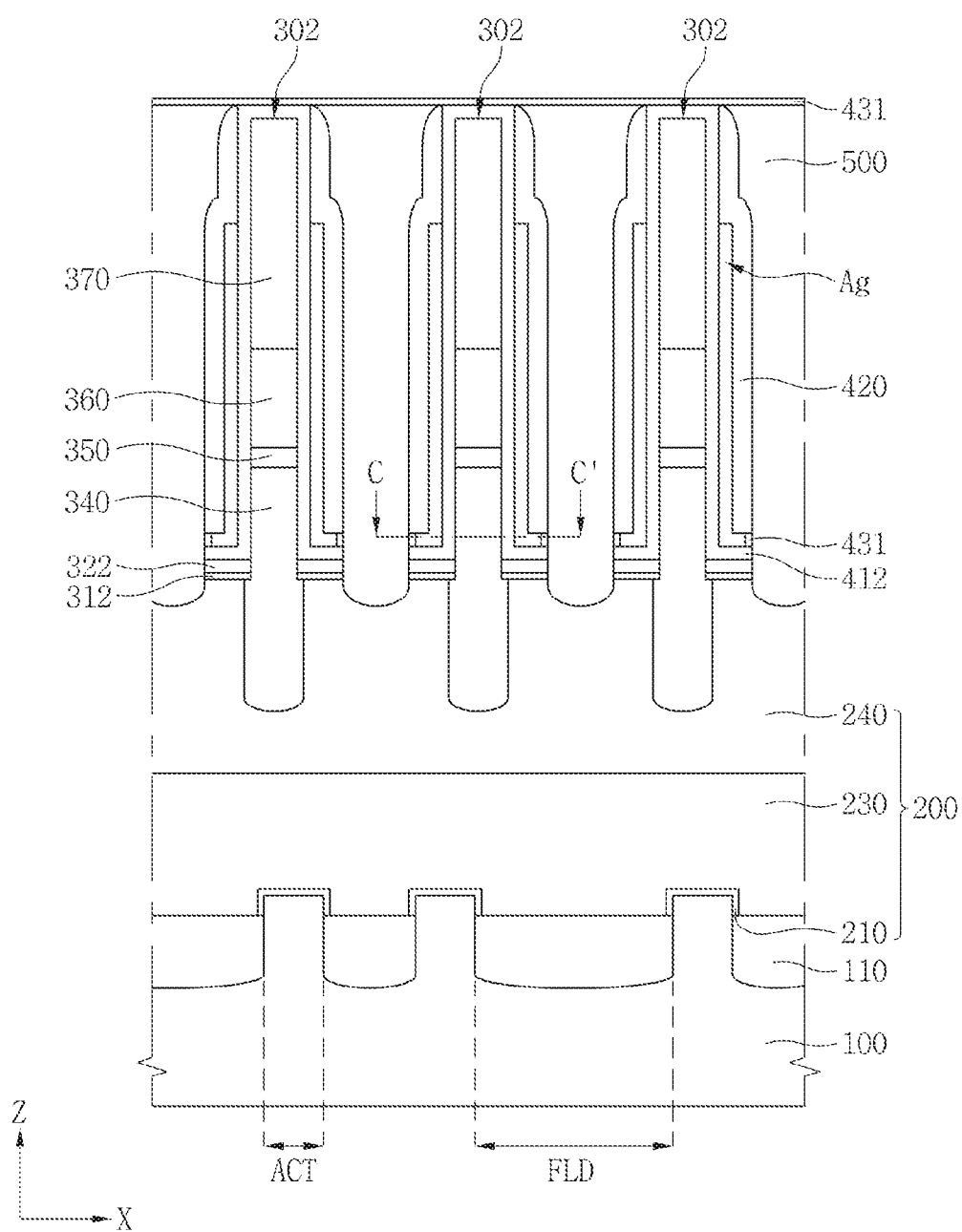
Figure 19C:
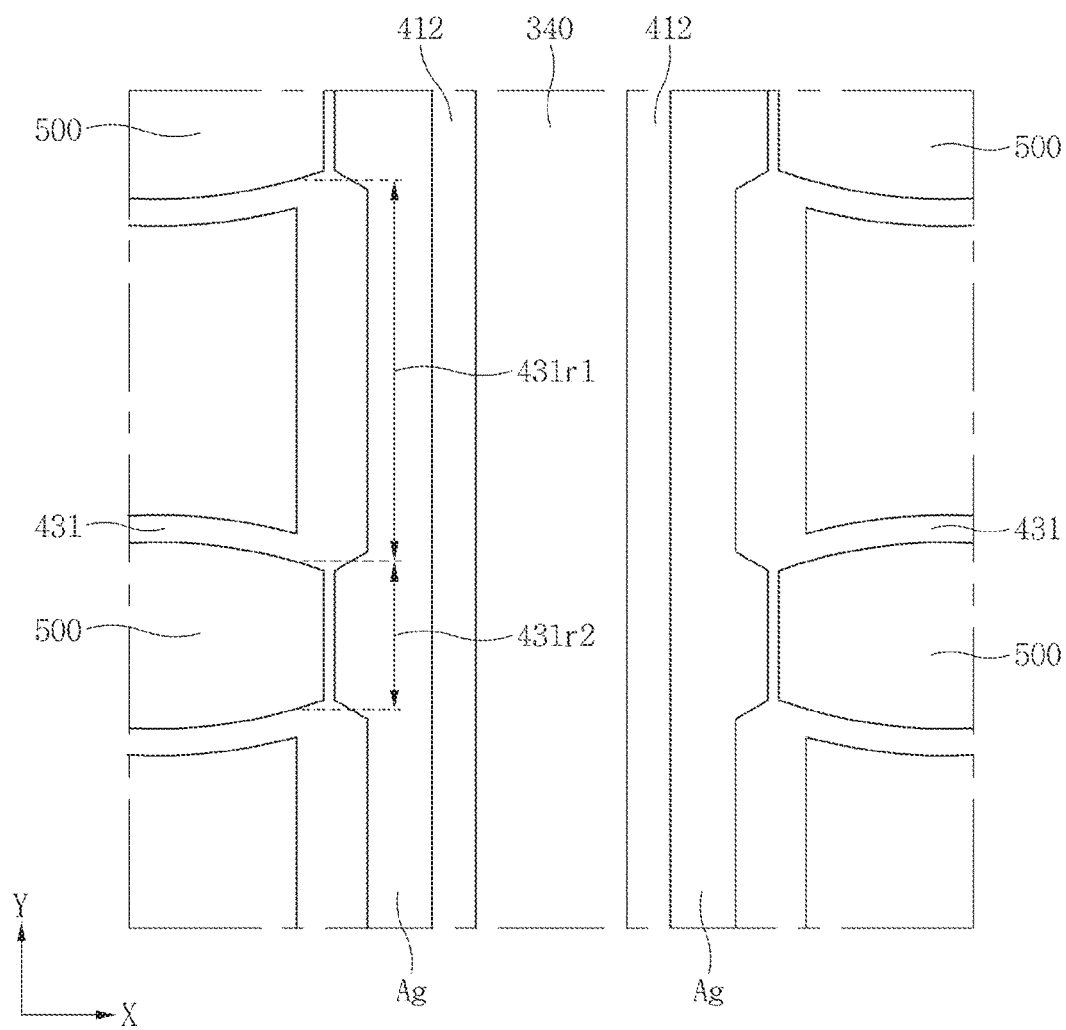
FIG. 19C is a plan view taken along the line C-C' of FIGS. 19A and 19B.

Referring to FIGS. 19A to 19C, the method of forming a semiconductor device in accordance with the embodiment of the inventive concept may include a process of forming a block spacer insulating layer 431 on the semiconductor substrate 100 on which the second molding insulating patterns 921 and the second sacrificial insulating patterns 803 are removed.

The process of forming the block spacer insulating layer 431 may include a process of depositing an insulating material on the semiconductor substrate 100 on which the second molding insulating patterns 921 and the second sacrificial insulating patterns 803 are removed. For example, the process of forming the block spacer insulating layer 431 may include a process of depositing silicon oxide or silicon nitride on the semiconductor substrate 100 on which the second molding insulating patterns 921 and the second sacrificial insulating patterns 803 are removed.

In the method of forming a semiconductor device in accordance with the embodiment of the inventive concept, the block spacer insulating layer 431 may extend into an area where the second sacrificial insulating patterns 803 are removed. In the method of forming a semiconductor device in accordance with the embodiment of the inventive concept, the block spacer insulating layer 431 may be formed on the plug isolation patterns 500. Thus, in the method of forming a semiconductor device in accordance with the embodiment of the inventive concept, the block spacer insulating layer 431 between the plug isolation patterns 500 may extend between a horizontal part of the inner spacer pattern 412 and lower surfaces of the outer bit line spacers 420. Accordingly, in the method of forming a semiconductor device in accordance with the embodiment of the inventive concept, the block spacer insulating layer 431 may extend more deeply in a first area 431r1 located between the plug isolation patterns 500 than in a second area 431r2 located on side surfaces of the plug isolation patterns 500.

In the method of forming a semiconductor device in accordance with the embodiment of the inventive concept, air-gaps Ag may be formed on side surfaces 300S1 and 300S2 of each second preliminary bit line structure 302 in the process of forming the block spacer insulating layer 431. In the method of forming a semiconductor device in accordance with the embodiment of the inventive concept, the air-gaps Ag may be formed under the outer bit line spacers 420 in contact with the inner spacer pattern 412. In the method of forming a semiconductor device in accordance with the embodiment of the inventive concept, the air-gaps Ag may be formed to be symmetrical at first side surfaces 300S1 and second side surfaces 300S2 of the second preliminary bit line structures 302. Thus, in the method of forming a semiconductor device in accordance with the embodiment of the inventive concept, upper portions of the air-gaps Ag may be fully covered by the outer bit line spacers 420. Accordingly, in the method of forming a semiconductor device in accordance with the embodiment of the inventive concept, inflow of a component formed by a subsequent process into the air-gaps Ag may be prevented.

Figure 20A:
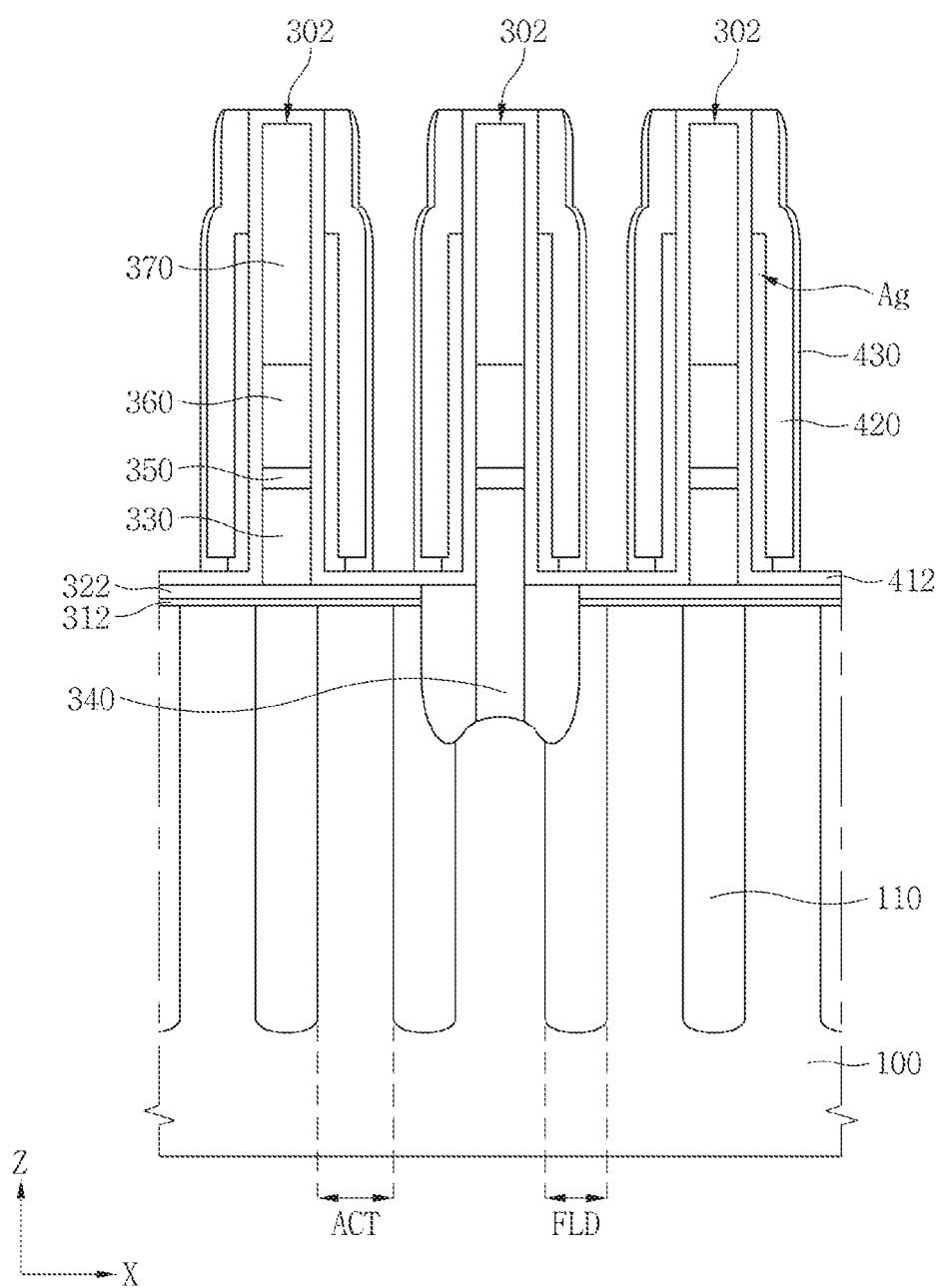
Figure 20B:
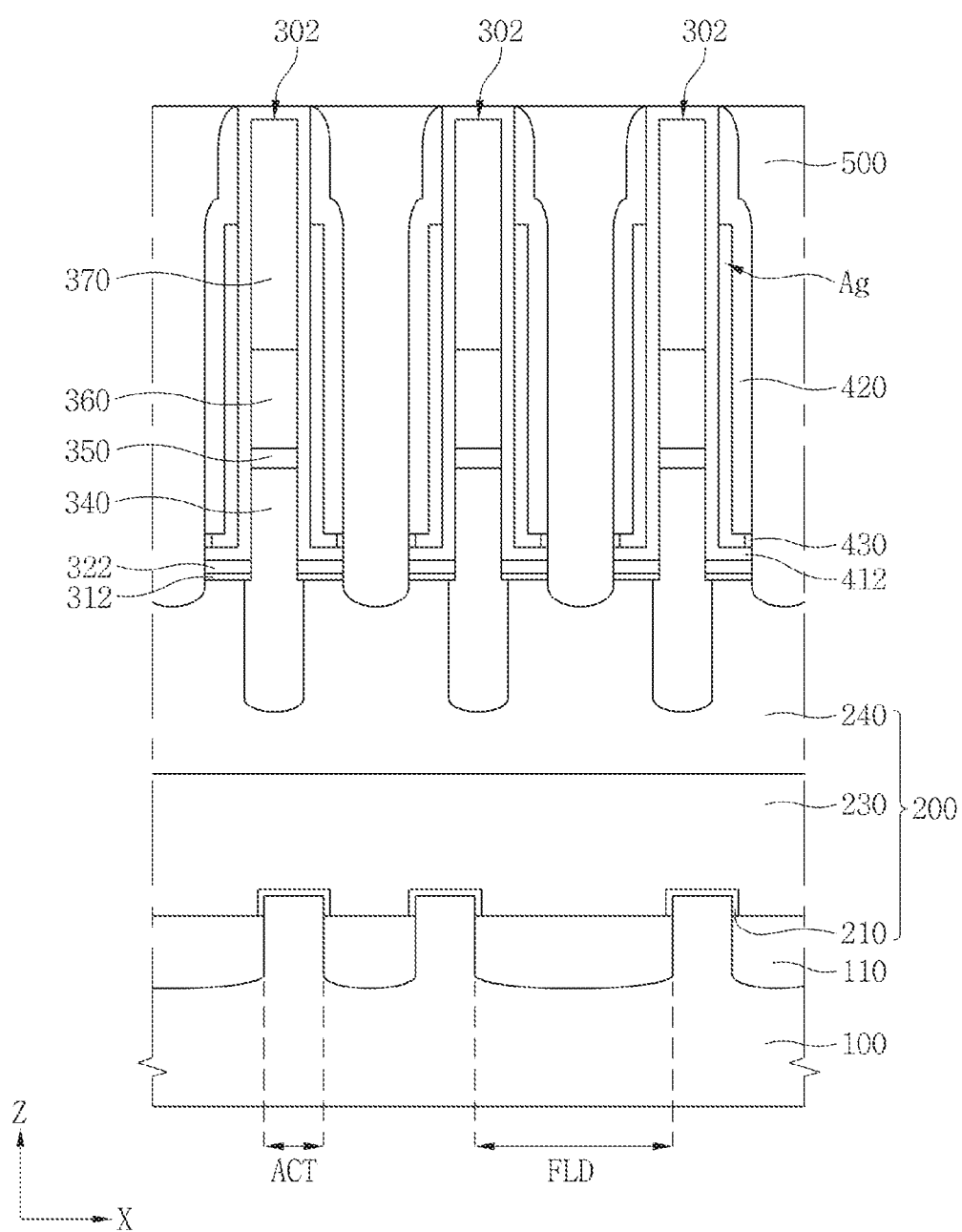

Referring to FIGS. 20A and 20B, the method of forming a semiconductor device in accordance with the embodiment of the inventive concept may include a process of forming preliminary block bit line spacers 432 on the second preliminary bit line structures 302.

The process of forming the preliminary block bit line spacers 432 may include a process of removing the block spacer insulating layer 431 located between the outer bit line spacers 420. For example, the process of forming the preliminary block bit line spacers 432 may include a process of dry-etching the block spacer insulating layer 431.

Figure 21A:
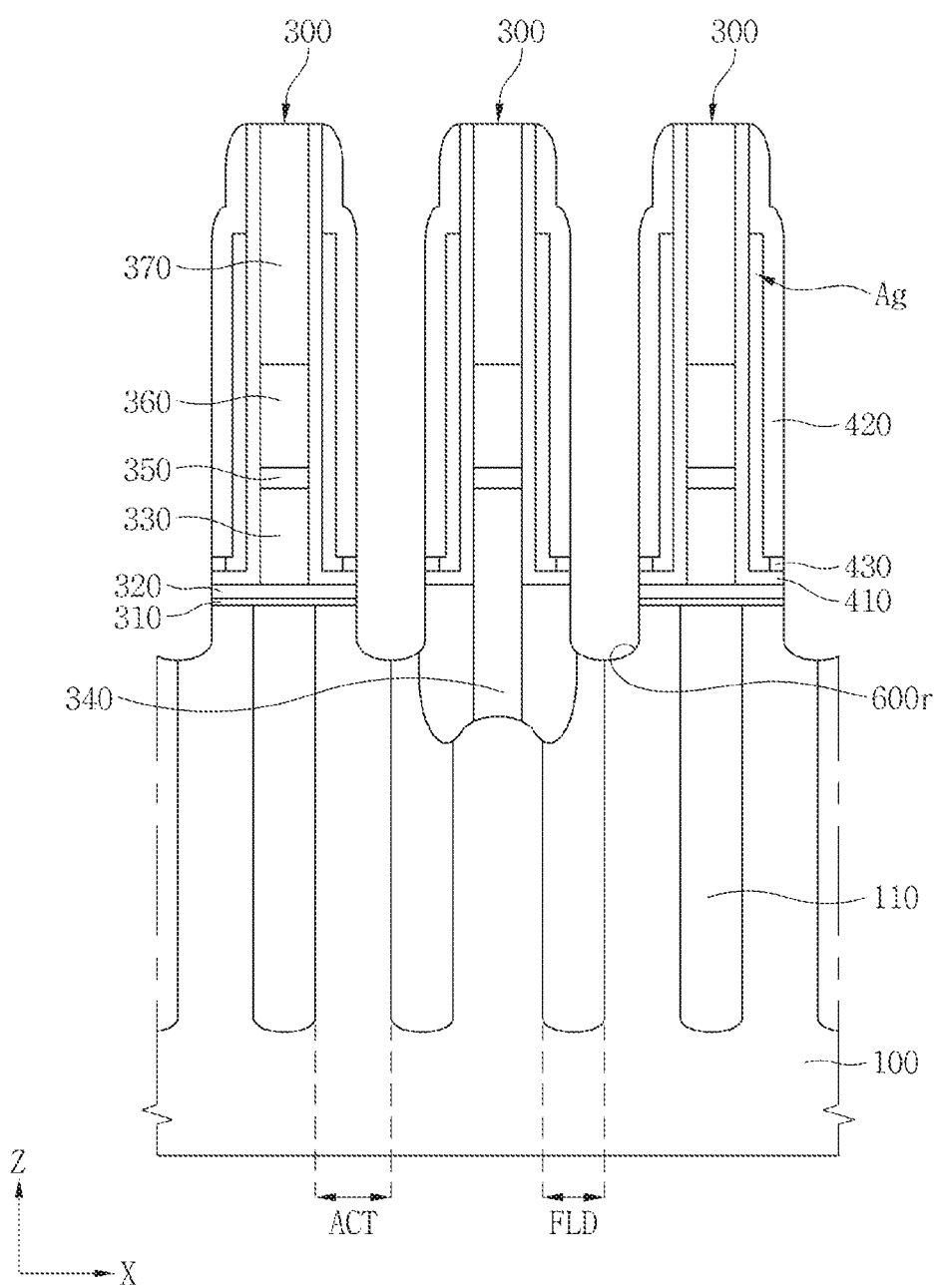
Figure 21B:
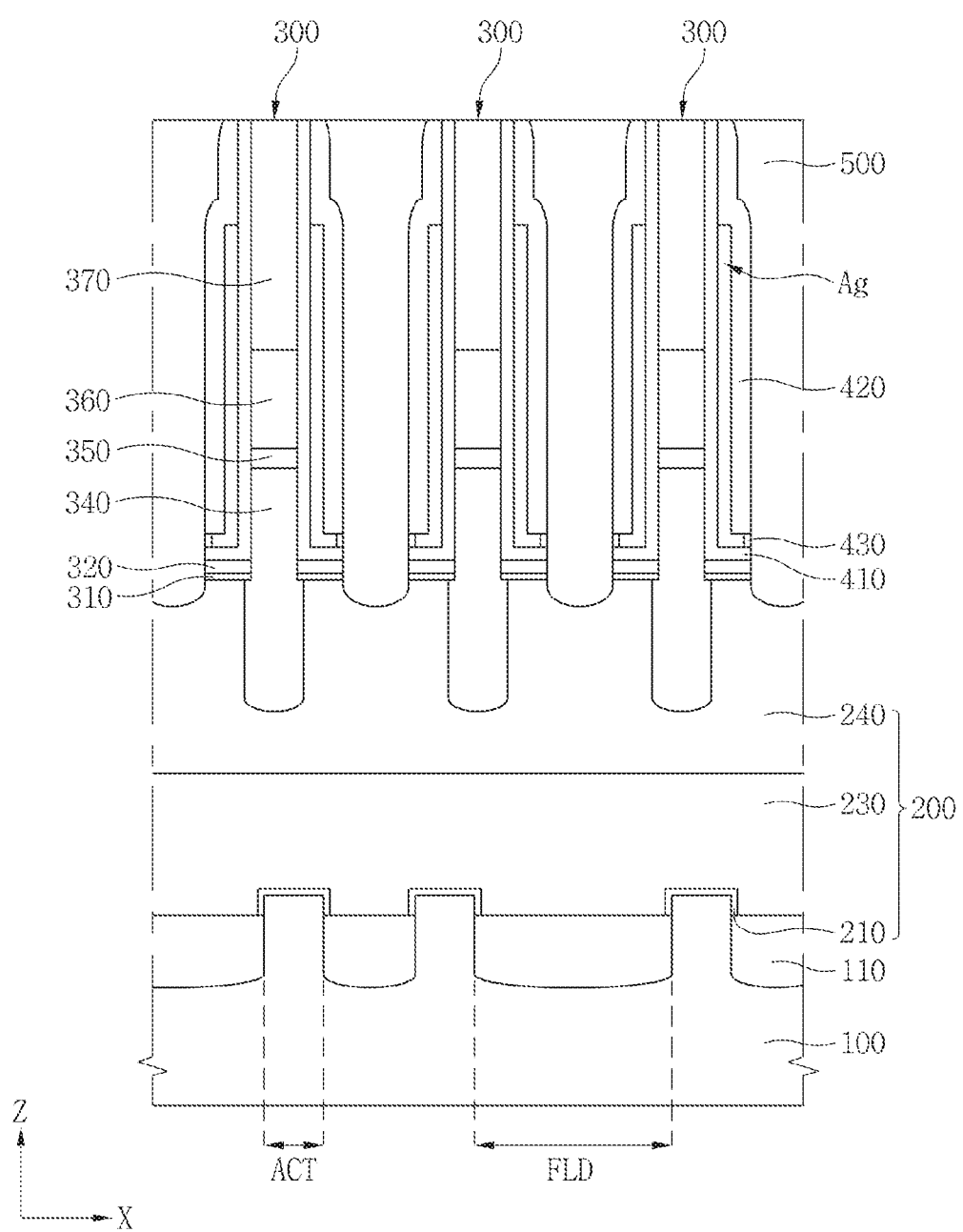

Referring to FIGS. 21A and 21B, the method of forming a semiconductor device in accordance with the embodiment of the inventive concept may include a process of forming second recesses 600r in the semiconductor substrate 100.

The process of forming the second recesses 600r may include a process of forming inner bit line spacers 410 by etching the inner spacer pattern 412, forming upper bit line barrier patterns 320 by etching the preliminary upper bit line barrier pattern 322, a process of forming lower bit line barrier patterns 310 by etching the preliminary lower bit line barrier pattern 312, and a process of recessing the semiconductor substrate 100.

The process of forming the inner bit line spacers 410 may include a process of removing the inner spacer pattern 412 exposed by the preliminary block bit line spacers 432. For example, the process of forming the inner bit line spacers 410 may include a process of dry-etching the inner spacer pattern 412 using the outer bit line spacers 420, the preliminary block bit line spacers 432, and the plug isolation patterns 500 as an etch mask.

The process of forming the upper bit line barrier patterns 320 may include a process of removing the preliminary upper bit line barrier pattern 322 exposed by the inner bit line spacers 410. For example, the process of forming the upper bit line barrier patterns 320 may include a process of dry-etching the preliminary upper bit line barrier pattern 322 using the inner bit line spacers 410, the outer bit line spacers 420, the preliminary block bit line spacers 432, and the plug isolation patterns 500 as an etch mask.

The process of forming the lower bit line barrier patterns 310 may include a process of removing the preliminary lower bit line barrier pattern 312 exposed by the upper bit line barrier patterns 320. For example, the process of forming the lower bit line barrier patterns 310 may include a process of dry-etching the preliminary lower bit line barrier pattern 312 using the upper bit line barrier patterns 320, the inner bit line spacer 410, the outer bit line spacer 420, the preliminary block bit line spacers 432, and the plug isolation patterns 500 as an etch mask.

In the method of forming a semiconductor device in accordance with the embodiment of the inventive concept, bit line structures 300 may be formed by forming the upper bit line barrier patterns 320 and the lower bit line barrier patterns 310.

In addition, in the method of forming a semiconductor device in accordance with the embodiment of the inventive concept, a vertical part of the preliminary block bit line spacer 432 may be removed by the processes of forming the inner bit line spacers 410, forming the upper bit line barrier patterns 320, forming the lower bit line barrier patterns 310, and recessing the semiconductor substrate 100. Accordingly, in the method of forming a semiconductor device in accordance with the embodiment of the inventive concept, block bit line spacers 430 located between horizontal parts of the inner bit line spacers 410 and lower surfaces of the outer bit line spacers 420 may be formed in the process of forming the second recesses 600r.

Figure 22A:
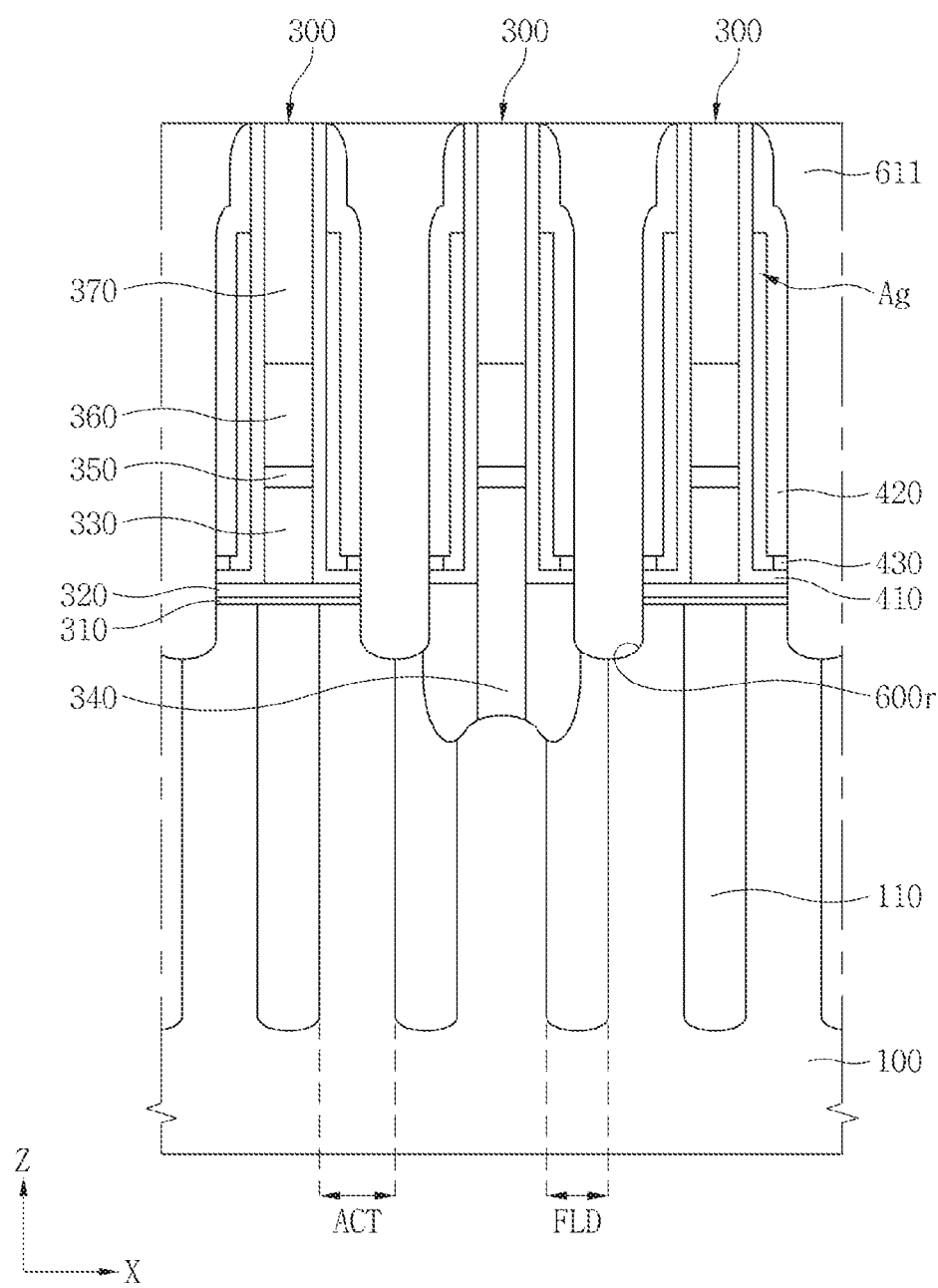
Figure 22B:
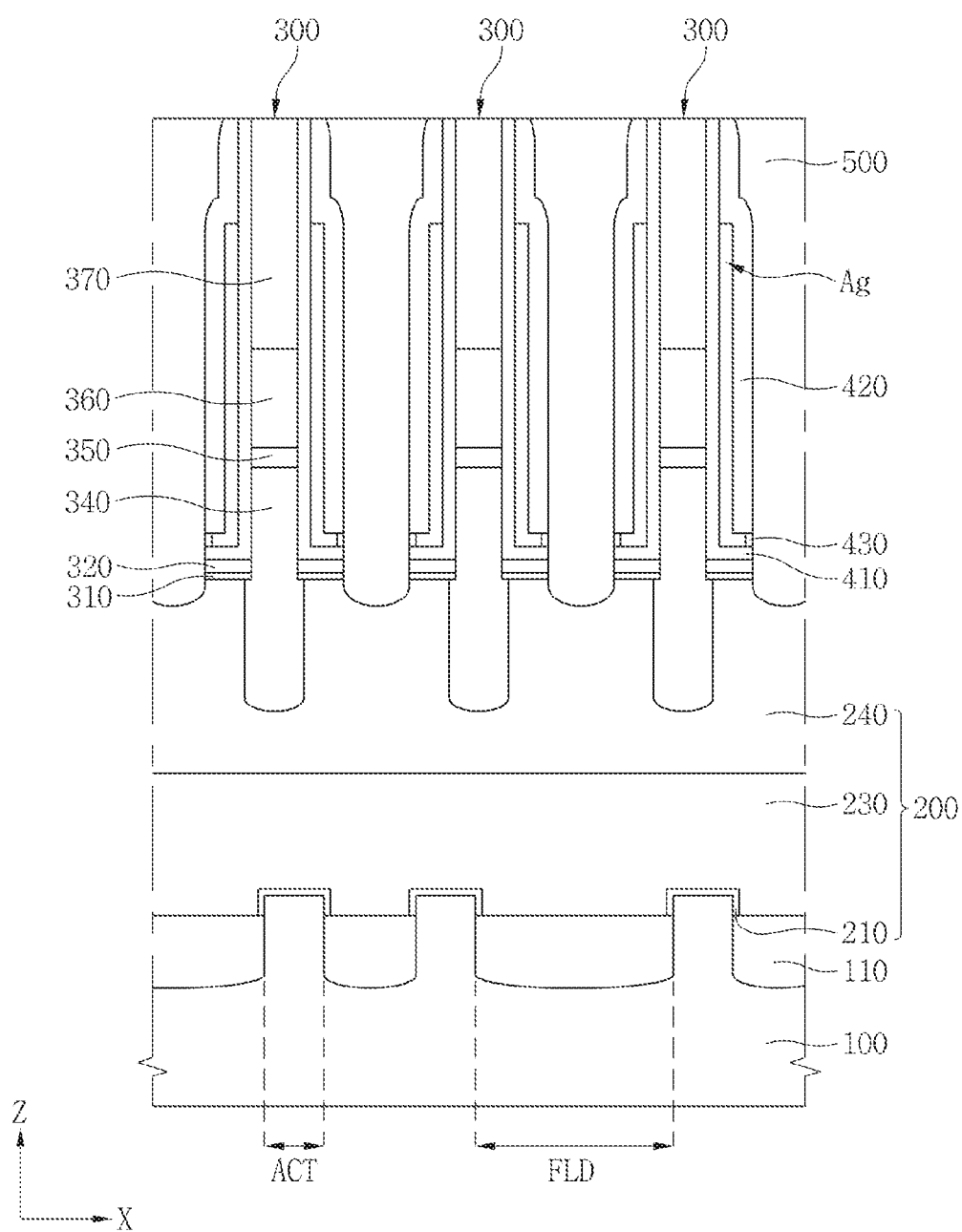

Referring to FIGS. 22A and 22B, the method of forming a semiconductor device in accordance with the embodiment of the inventive concept may include a process of forming lower plug patterns 611 filling the second recesses 600r.

The process of forming the lower plug patterns 611 may include a process of filling between the outer bit line spacers 420 and the plug isolation patterns 500 with a conductive material. For example, the process of forming the lower plug patterns 611 may include a process of filling between the outer bit line spacers 420 and the plug isolation patterns 500 with polysilicon.

Figure 23A:
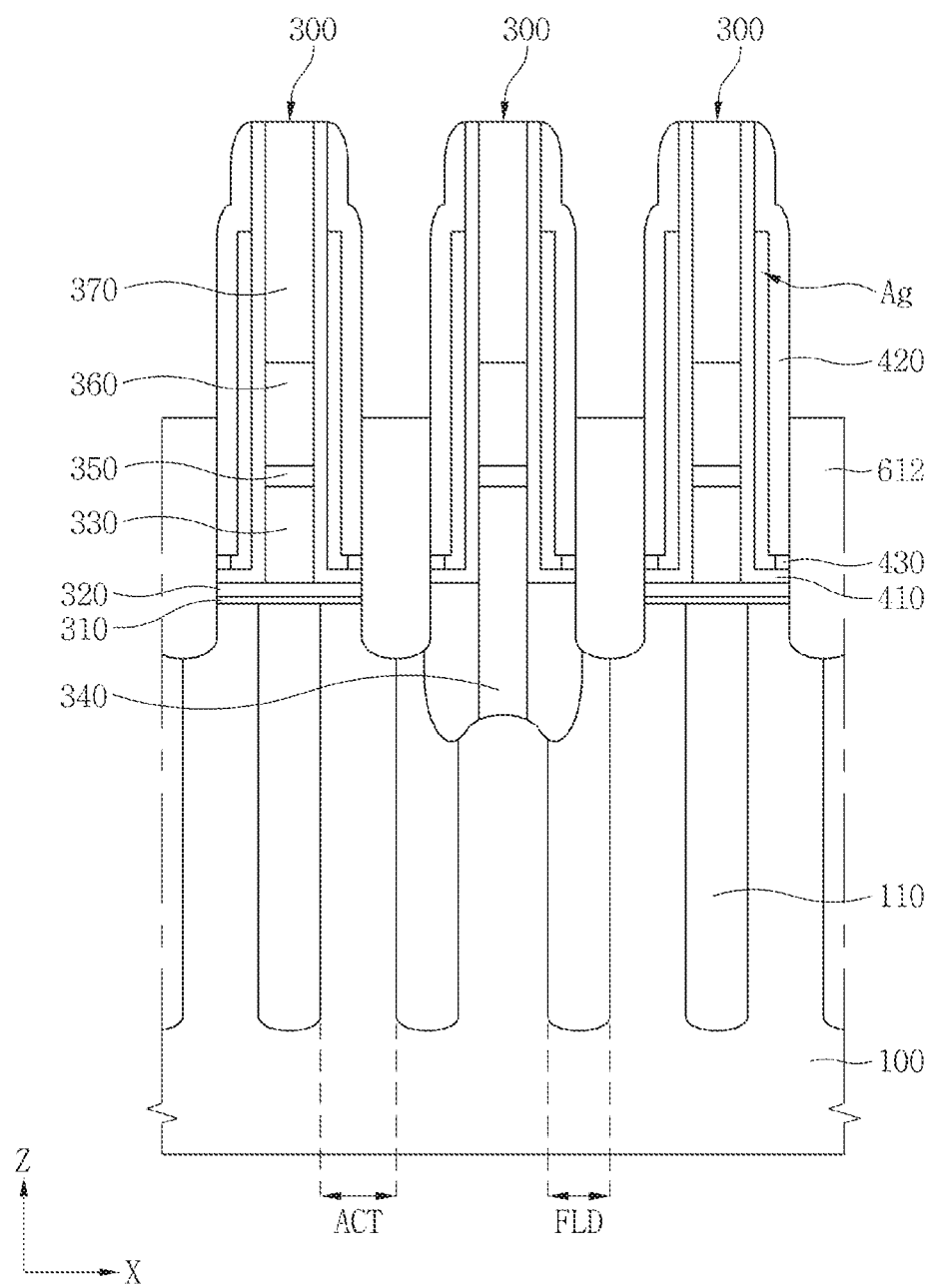
Figure 23B:
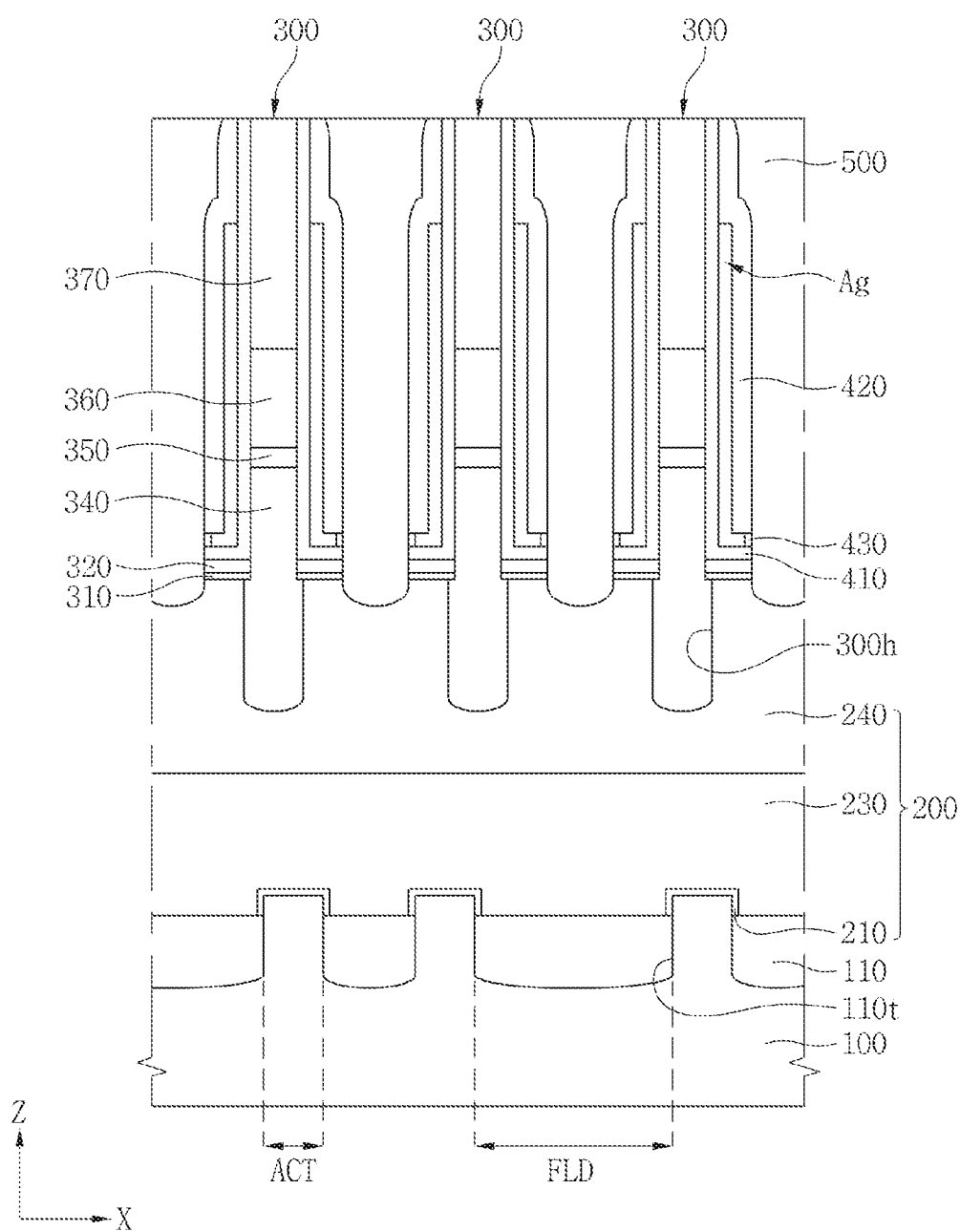

Referring to FIGS. 23A and 23B, the method of forming a semiconductor device in accordance with the embodiment of the inventive concept may include a process of forming preliminary lower plug pads 612 between the outer bit line spacers 420 and the plug isolation patterns 500.

The process of forming the preliminary lower plug pads 612 may include a process of performing an etch-back process on the lower plug patterns 611. For example, the process of forming the preliminary lower plug pads 612 may include a process of performing the etch-back process on the lower plug patterns 611 such that levels of upper surfaces of the preliminary lower plug pads 612 are lower than levels of upper surfaces of the upper bit line electrodes 360.

Figure 24A:
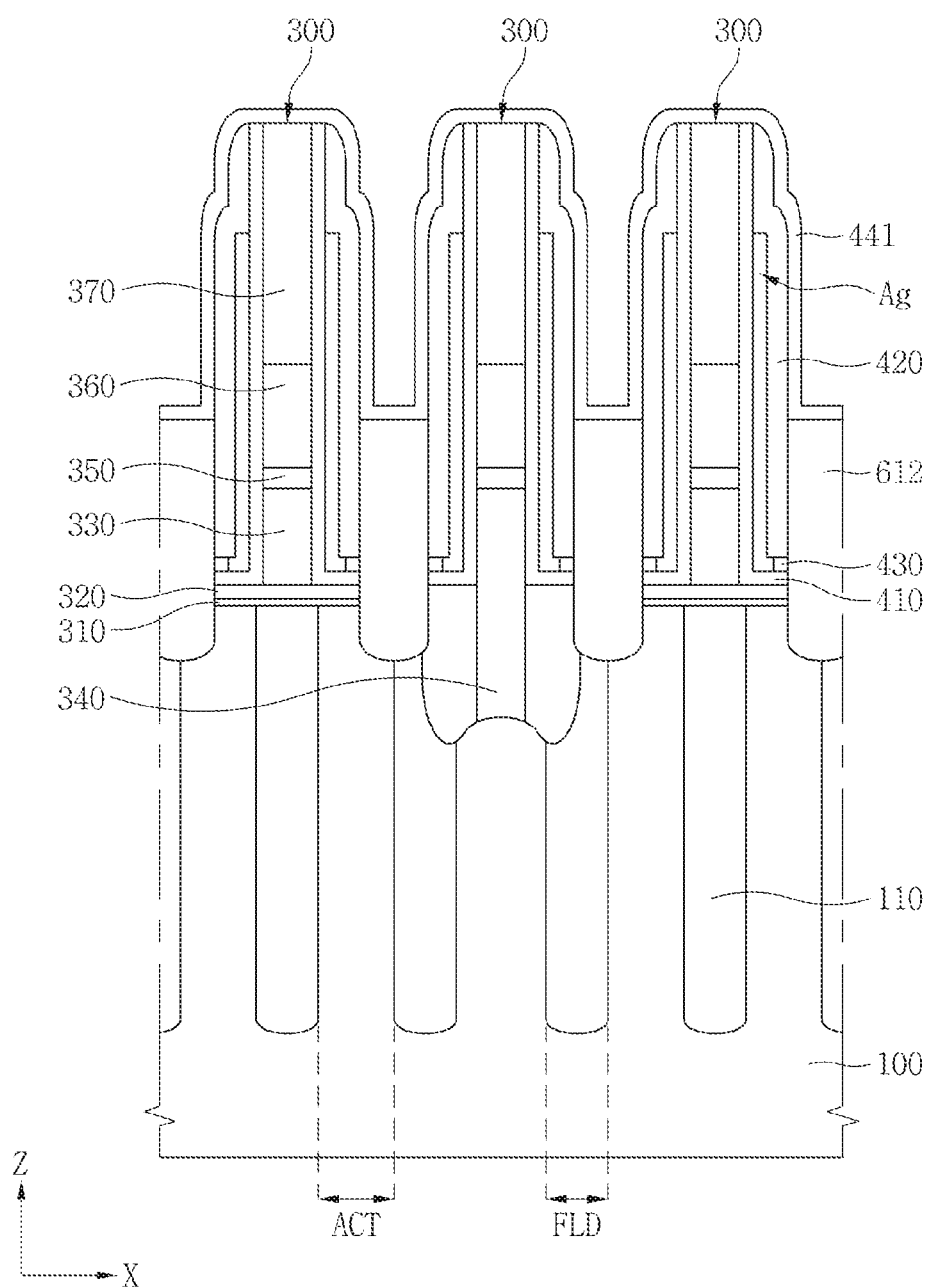
Figure 24B:
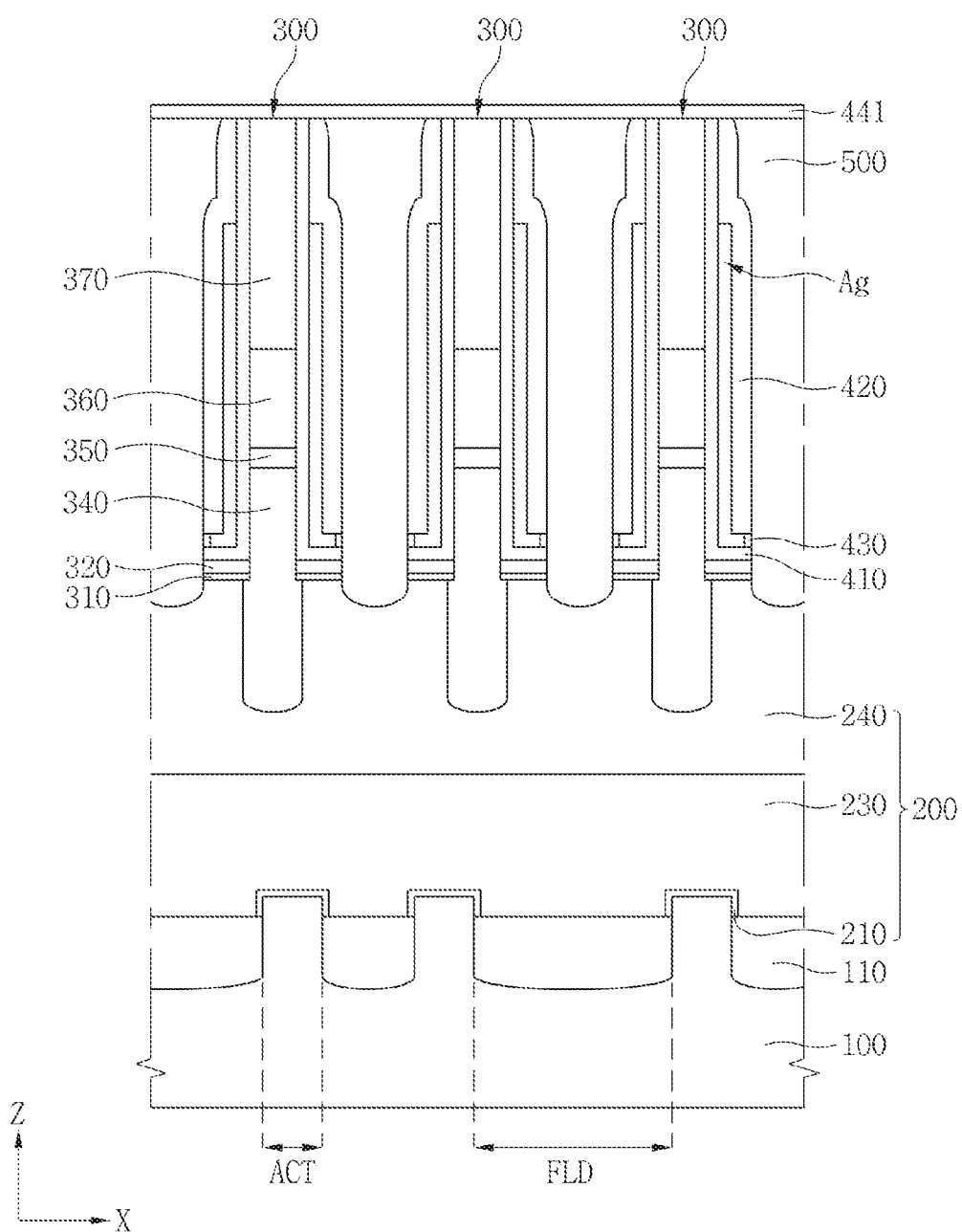

Referring to FIGS. 24A and 24B, the method of forming a semiconductor device in accordance with the embodiment of the inventive concept may include a process of forming a cover spacer insulating layer 441 on the semiconductor substrate 100 including the preliminary lower plug pads 612.

The process of forming the cover spacer insulating layer 441 may include a process of depositing an insulating material on the semiconductor substrate 100 including the preliminary lower plug pads 612. The process of forming the cover spacer insulating layer 441 may include a process of depositing an insulating material having the same etch rate as the outer bit line spacer 420. For example, the process of forming the cover spacer insulating layer 441 may include a process of depositing silicon nitride on the semiconductor substrate 100 including the preliminary lower plug pads 612.

Figure 25A:
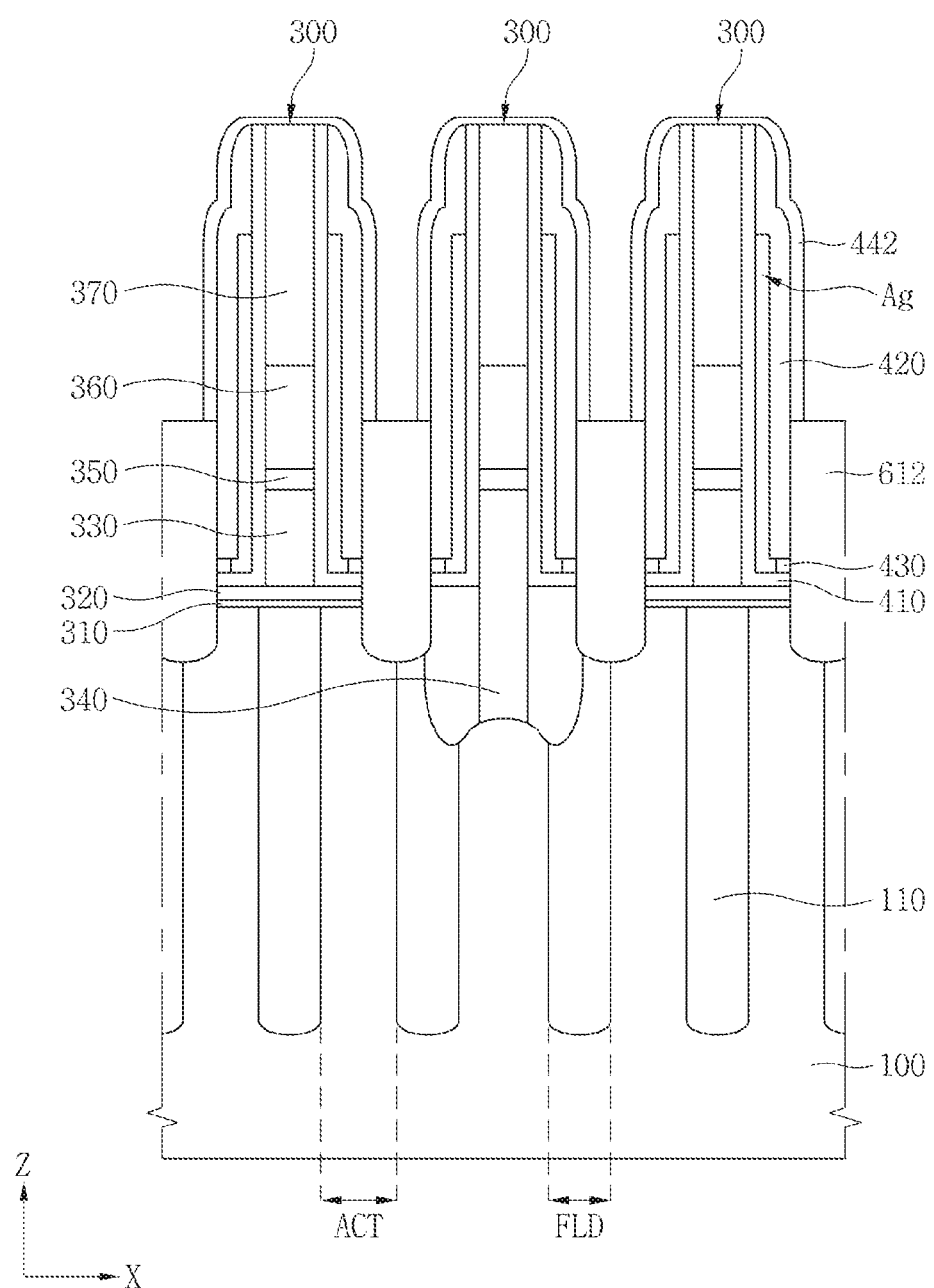
Figure 25B:
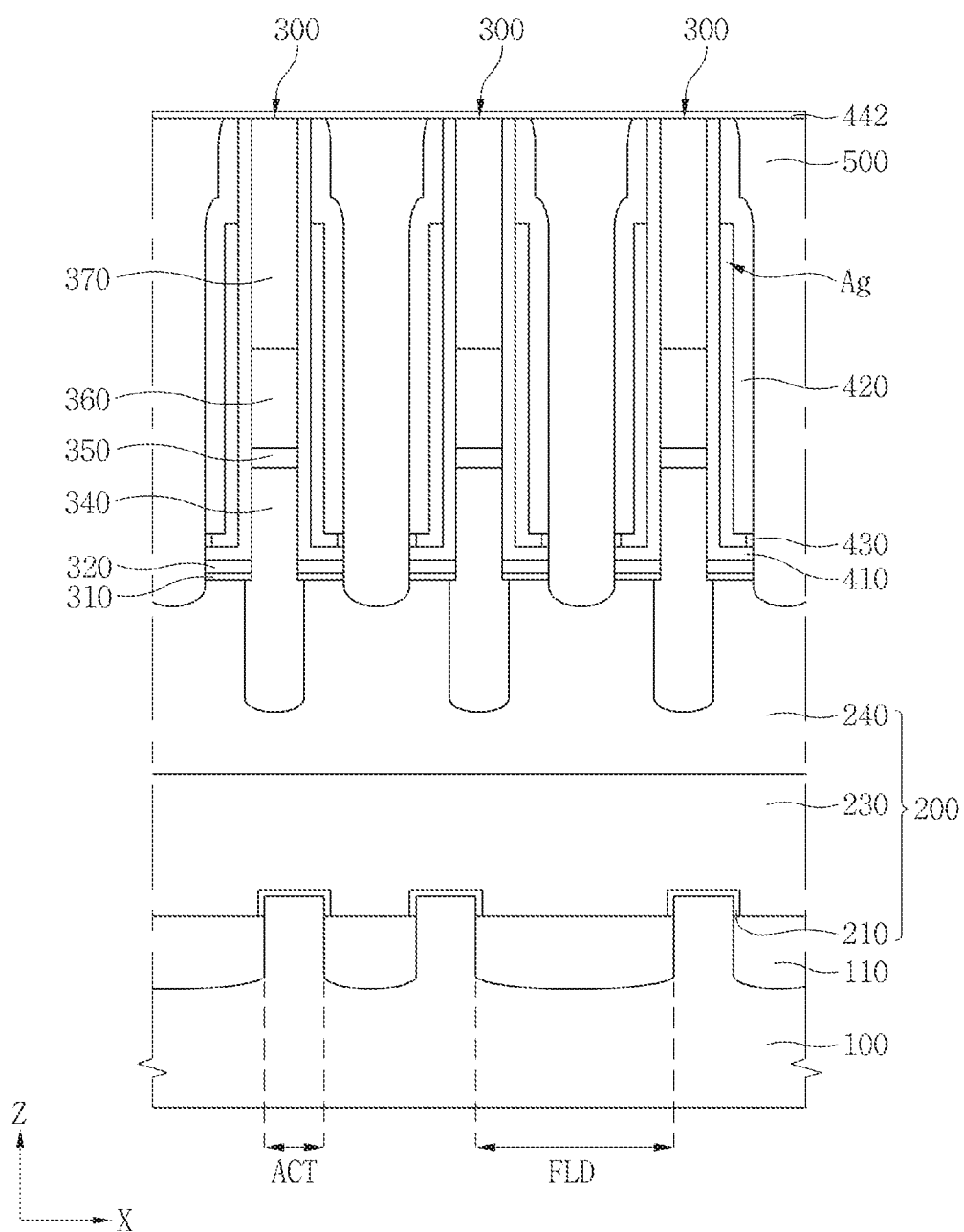

Referring to FIGS. 25A and 25B, the method of forming a semiconductor device in accordance with the embodiment of the inventive concept may include a process of forming preliminary cover bit line spacers 442 on the outer bit line spacers 420.

The process of forming the preliminary cover bit line spacers 442 may include a process of removing a horizontal part of the cover spacer insulating layer 441 located on the preliminary lower plug pads 612. For example, the process of forming the preliminary cover bit line spacers 442 may include a process of dry-etching the cover spacer insulating layer 441.

Figure 26A:
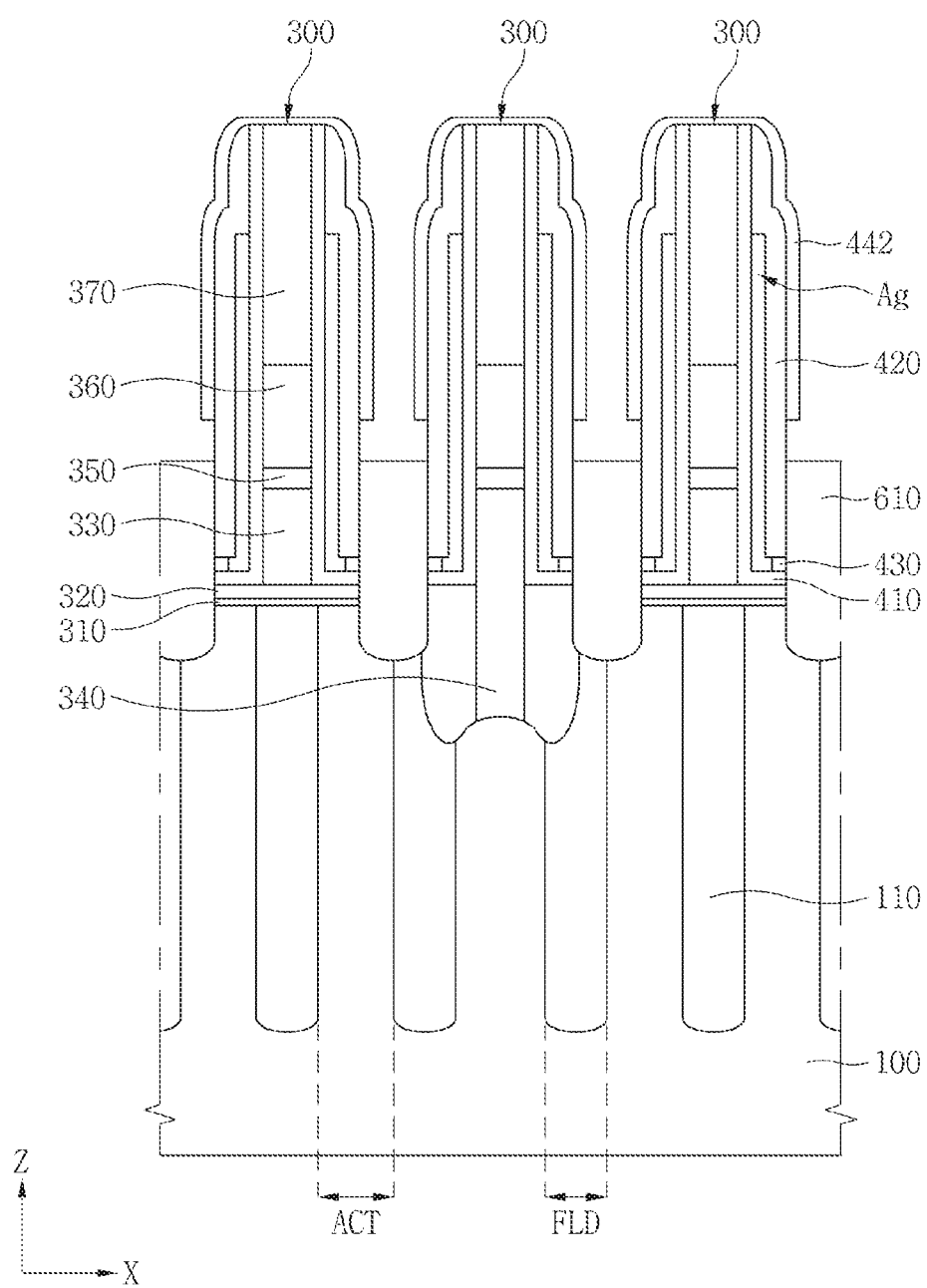
Figure 26B:
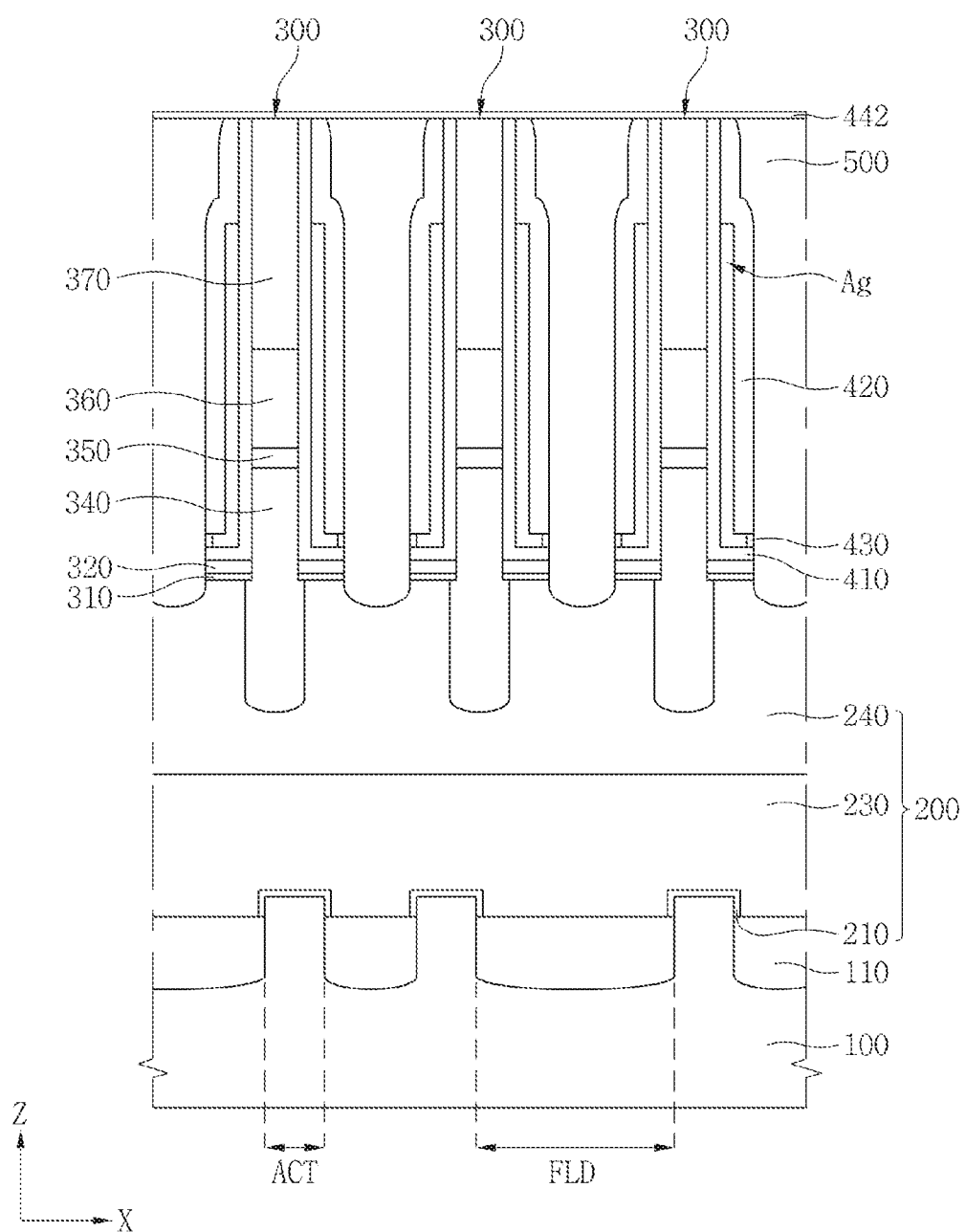

Referring to FIGS. 26A and 26B, the method of forming a semiconductor device in accordance with the embodiment of the inventive concept may include a process of forming lower plug pads 610 on the semiconductor substrate 100 including the preliminary cover bit line spacers 442.

The process of forming the lower plug pads 610 may include a process of performing an etch-back process on the preliminary lower plug pads 612. For example, the process of forming the lower plug pads 610 may include a process of performing the etch-back process on the preliminary lower plug pads 612 such that levels of upper surfaces of the lower plug pads 610 are lower than levels of lower surfaces of the preliminary cover bit line spacers 442.

Figure 27A:
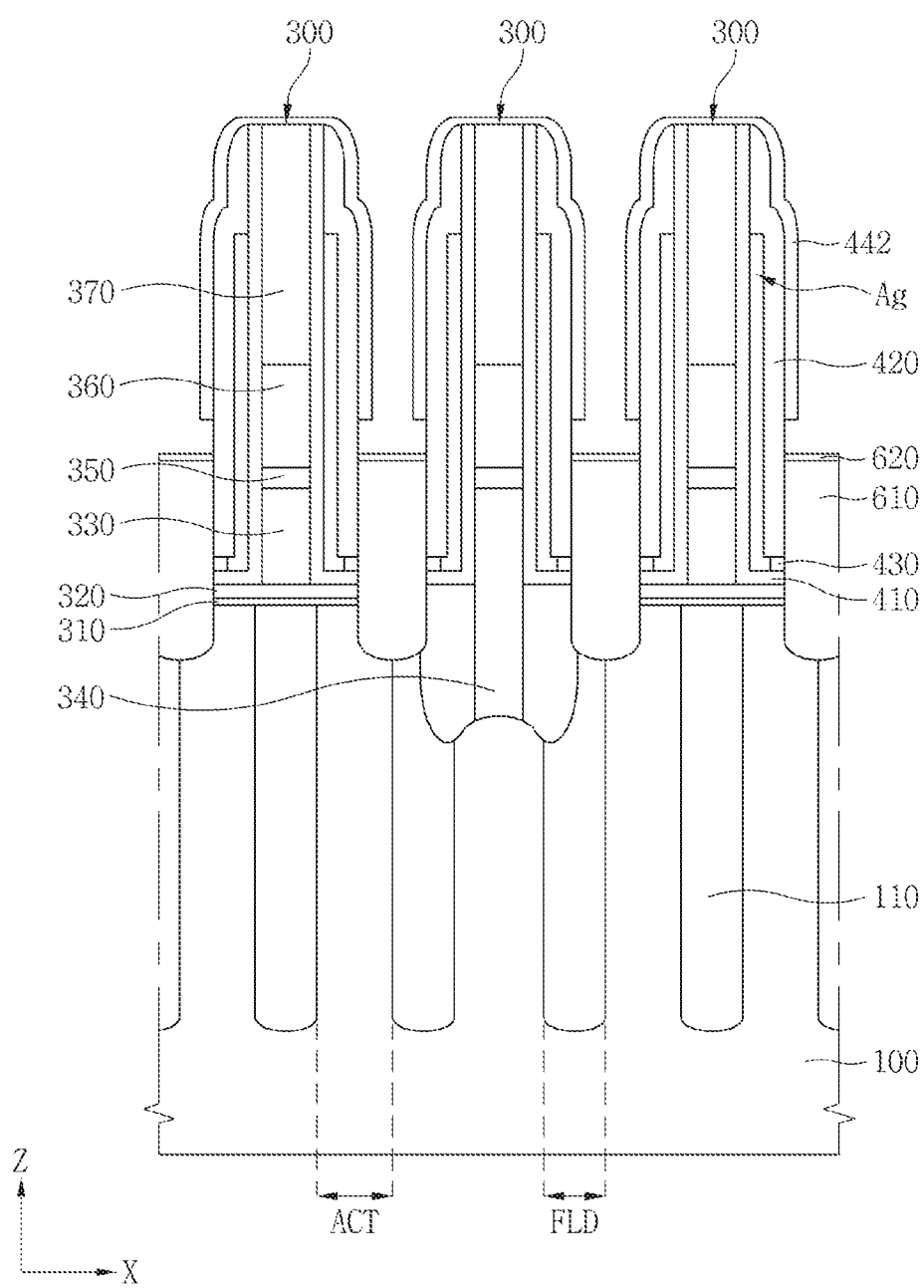
Figure 27B:
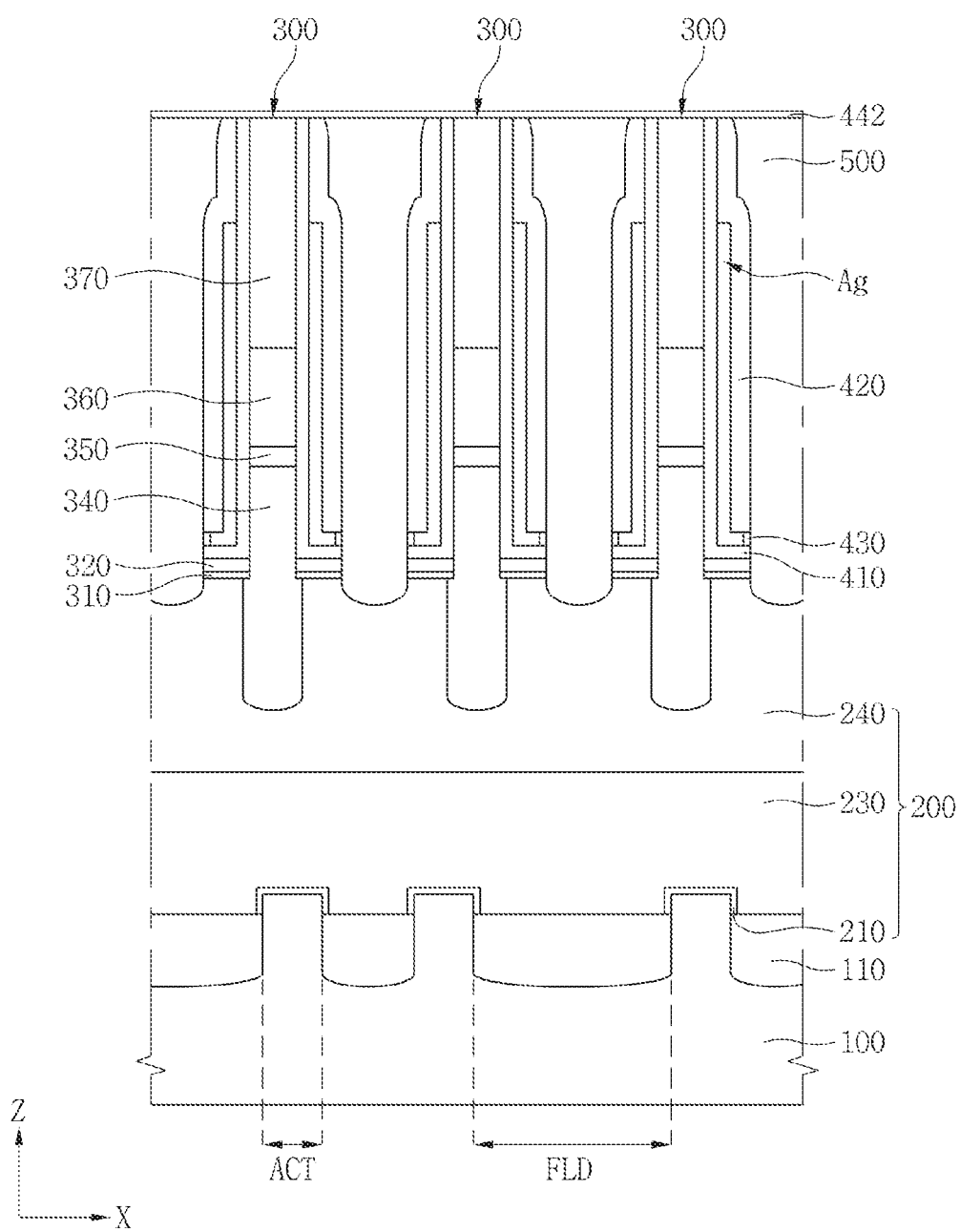

Referring to FIGS. 27A and 27B, the method of forming a semiconductor device in accordance with the embodiment of the inventive concept may include a process of forming an intermediate plug pattern 620 on the lower plug pads 610.

The process of forming the intermediate plug pattern 620 may include a process of forming a conductive material layer on the upper surfaces of the lower plug pads 610. For example, the process of forming the intermediate plug pattern 620 may include a process of forming a metal silicide layer on the lower plug pads 610.

Figure 28A:
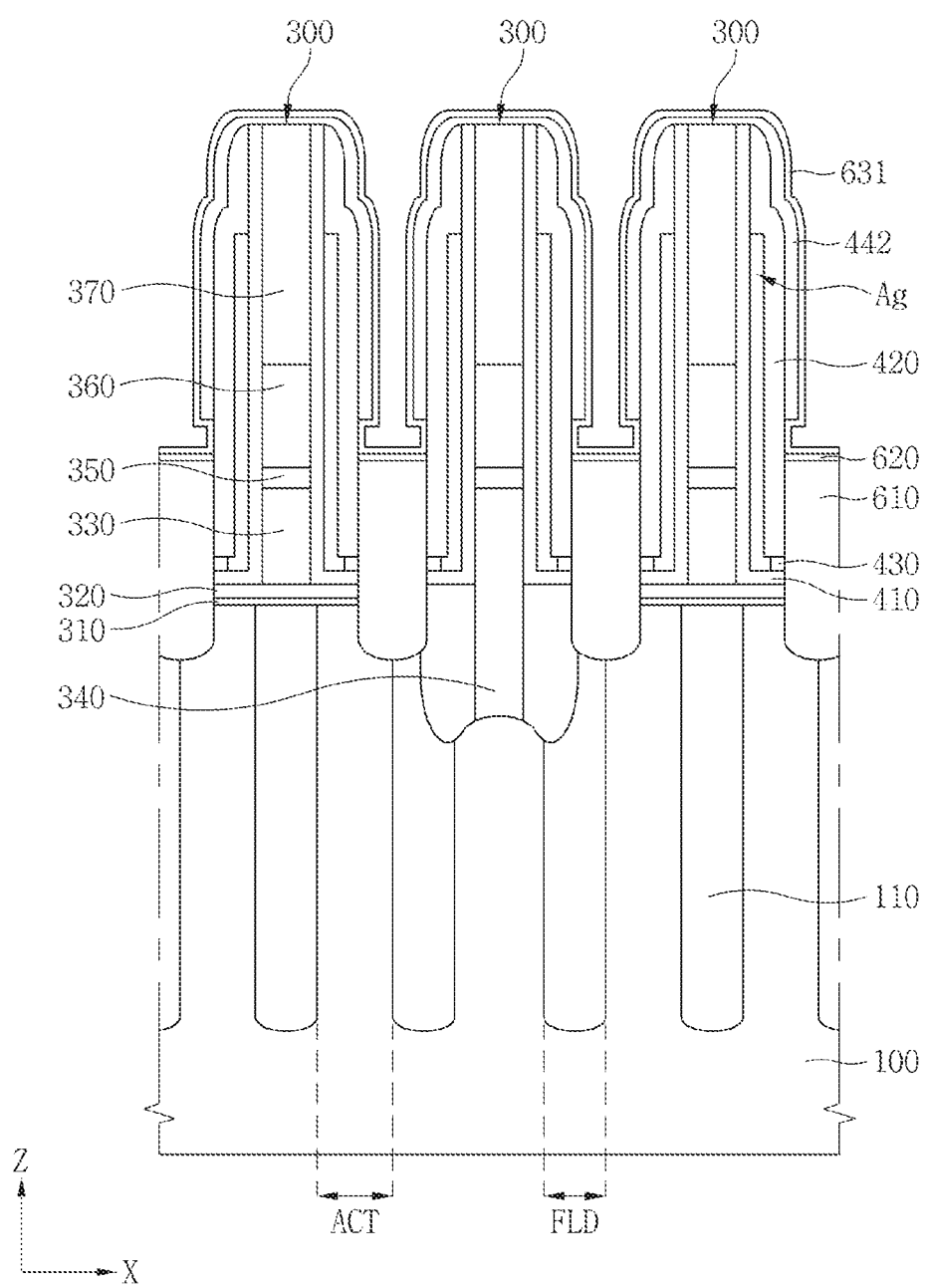
Figure 28B:
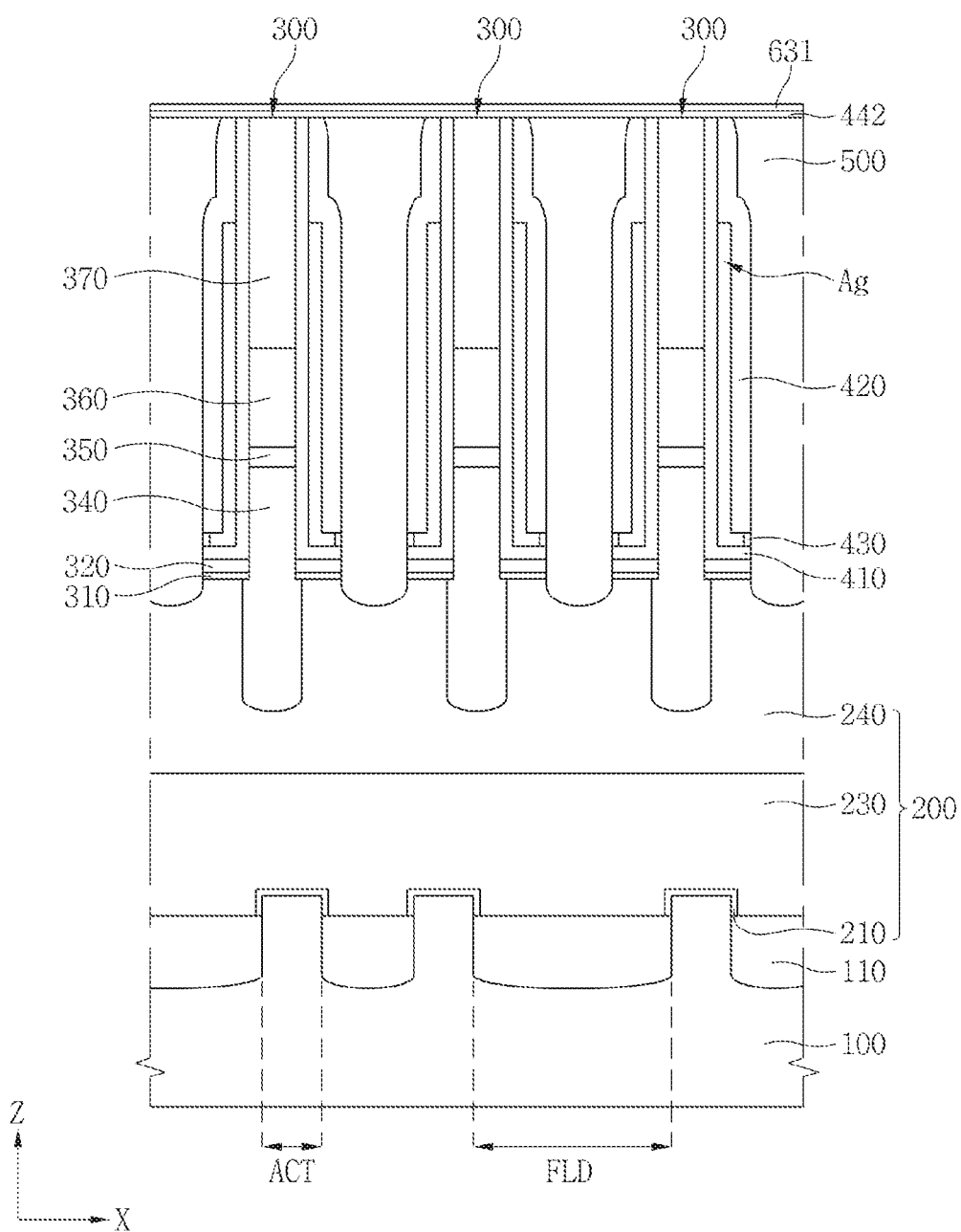

Referring to FIGS. 28A and 28B, the method of forming a semiconductor device in accordance with the embodiment of the inventive concept may include a process of forming a plug barrier layer 631 on the semiconductor substrate 100 including the intermediate plug pattern 620.

The process of forming the plug barrier layer 631 may include a process of forming a metal nitride layer on the semiconductor substrate 100 including the intermediate plug pattern 620.

Figure 29A:
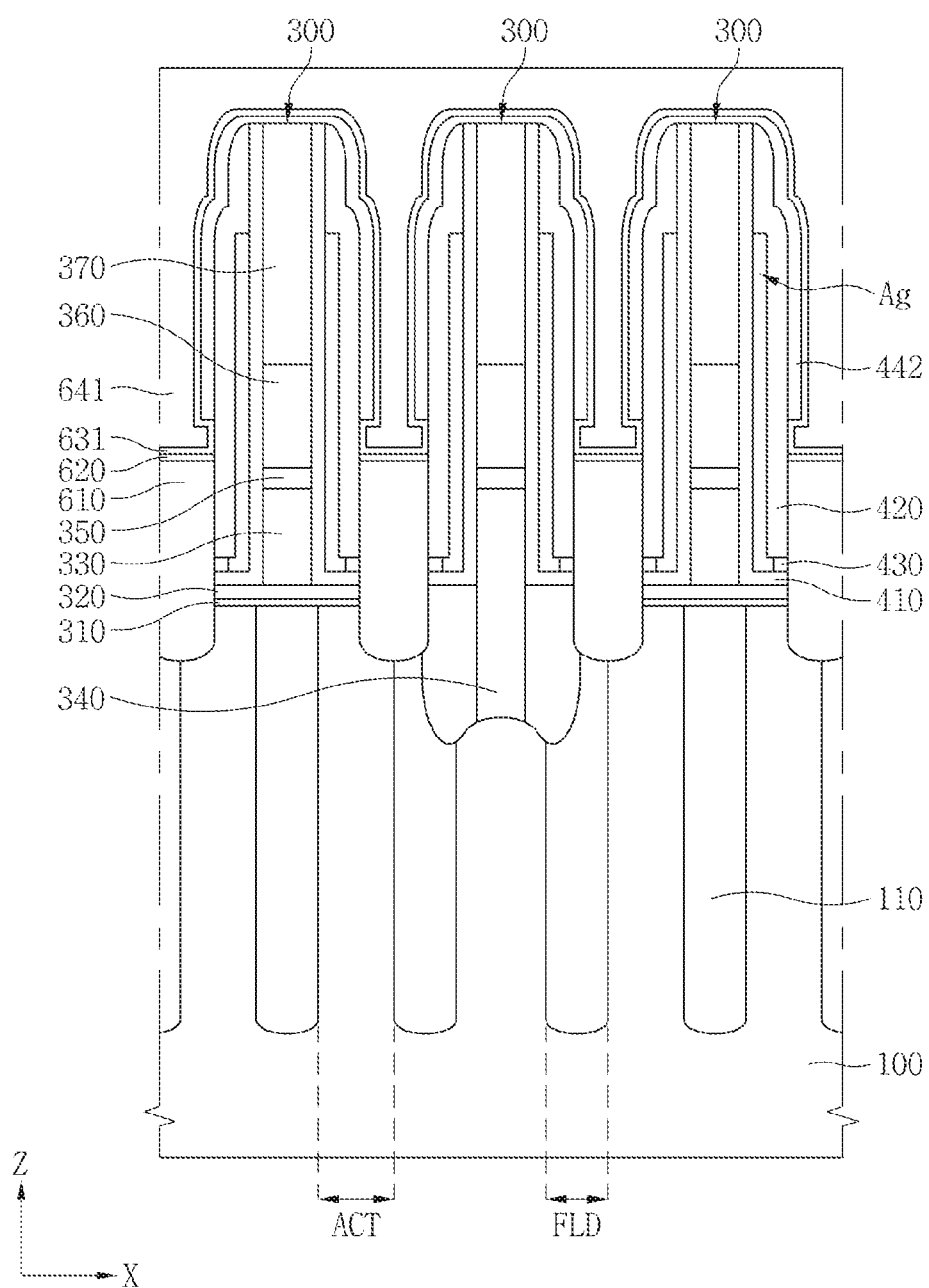
Figure 29B:
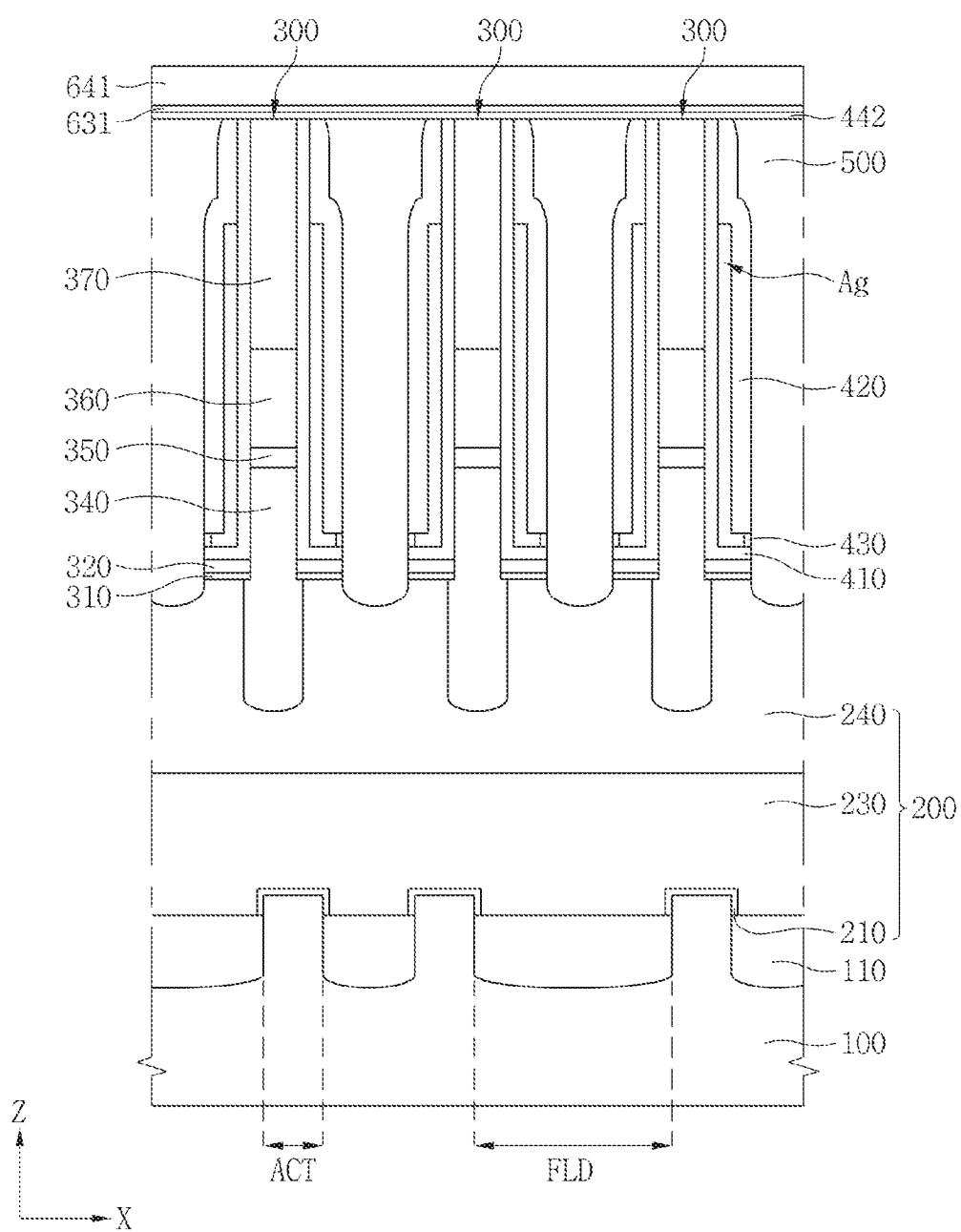

Referring to FIGS. 29A and 29B, the method of forming a semiconductor device in accordance with the embodiment of the inventive concept may include a process of forming an upper conductive layer 641 on the plug barrier layer 631.

The process of forming the upper conductive layer 641 may include a process of forming a conductive material layer on the plug barrier layer 631. The process of forming the upper conductive layer 641 may include a process of filling between vertical regions of the plug barrier layer 631 with a conductive material. For example, the process of forming the upper conductive layer 641 may include a process of forming a metal layer on the plug barrier layer 631.

Figure 30A:
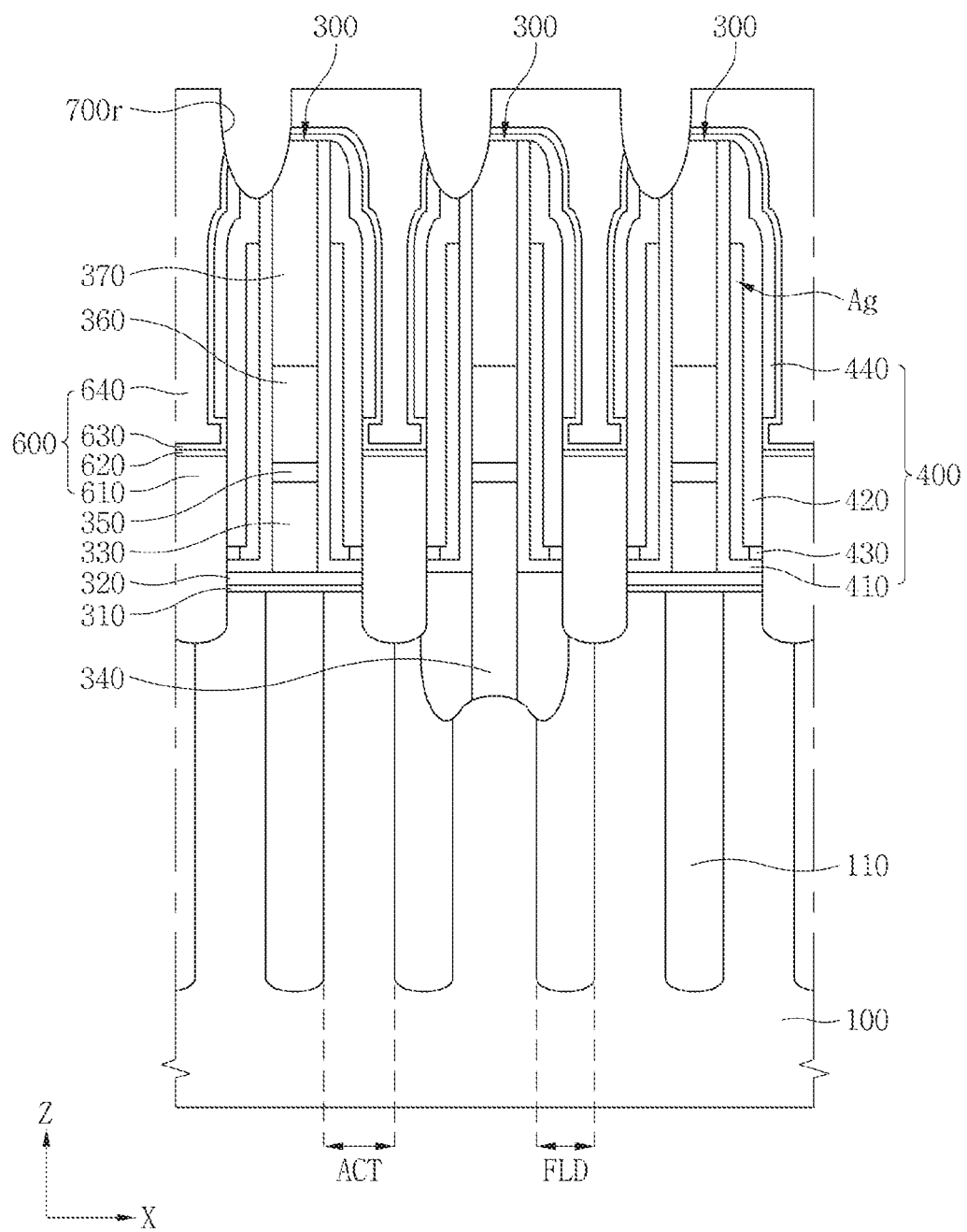
Figure 30B:
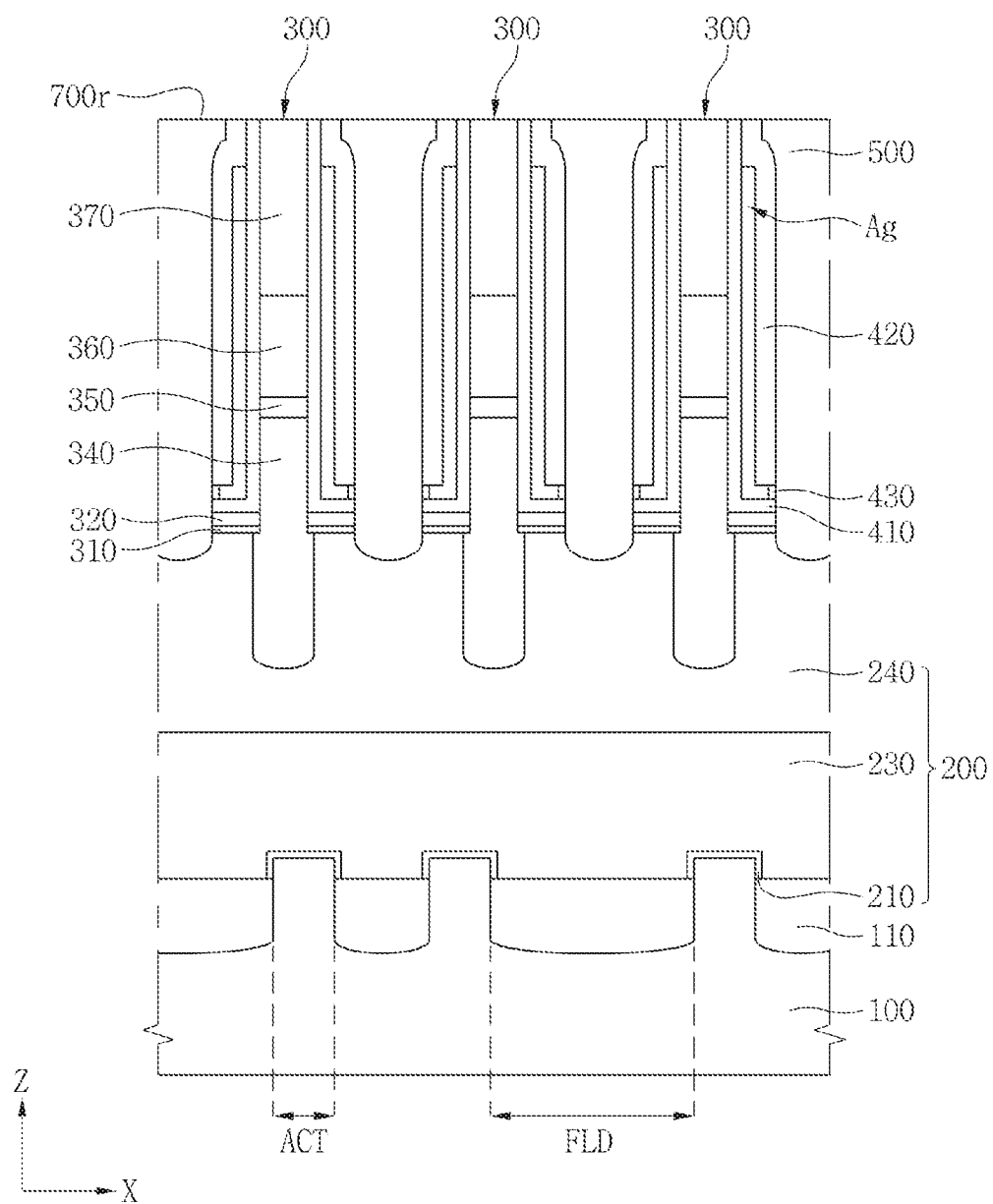

Referring to FIGS. 30A and 30B, the method of forming a semiconductor device in accordance with the embodiment of the inventive concept may include a process of forming a third recess 700r on the semiconductor substrate 100 including the upper conductive layer 641.

The process of forming the third recess 700r may include a process of forming upper contact plugs 640 by etching the upper conductive layer 641, a process of forming the plug barrier patterns 630 by patterning the plug barrier layer 631, a process of forming cover bit line spacers 440 by patterning the preliminary cover bit line spacers 442, and a process of recessing the inner bit line spacers 410 and the outer bit line spacers 420.

The process of forming the upper contact plugs 640 may include a process of removing the upper conductive layer 641 located on the gate structures 200. The process of forming the upper contact plugs 640 may include a process of etching the upper conductive layer 641 on a side surface of each bit line structure 300.

The process of forming the plug barrier patterns 630 may include a process of removing the plug barrier layer 631 located on the gate structures 200. The process of forming the plug barrier patterns 630 may include a process of etching the plug barrier layer 631 on the side surface of each bit line structure 300.

The process of forming the cover bit line spacers 440 may include a process of etching the preliminary cover bit line spacers 442 on the side surfaces of each bit line structure 300.

In the method of forming a semiconductor device in accordance with the embodiment of the inventive concept, storage contact plugs 600 may be formed by forming the upper contact plugs 640 and forming the plug barrier patterns 630.

In the method of forming a semiconductor device in accordance with the embodiment of the inventive concept, bit line spacers 400 may be formed by forming the cover bit line spacers 440.

Figure 31A:
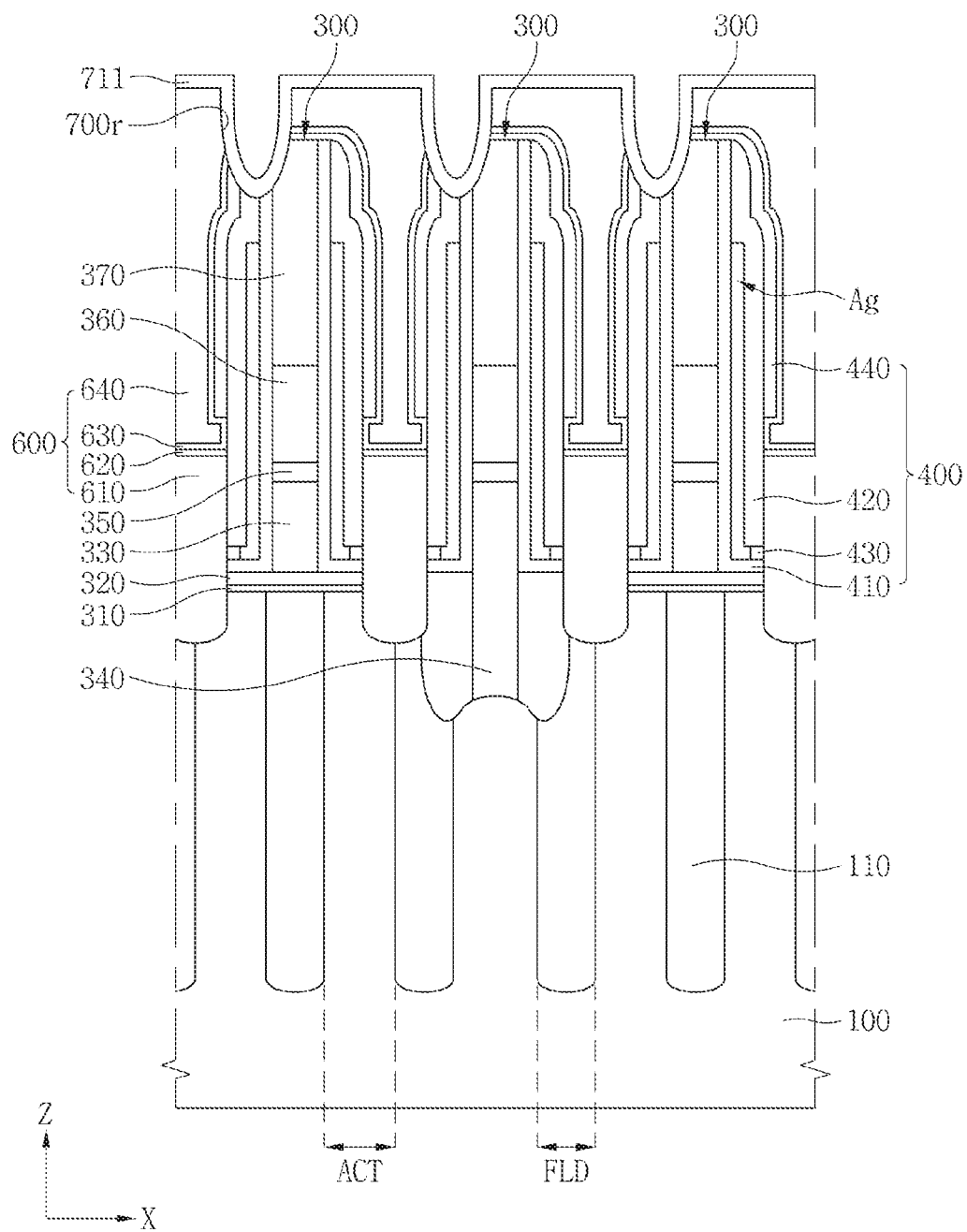
Figure 31B:
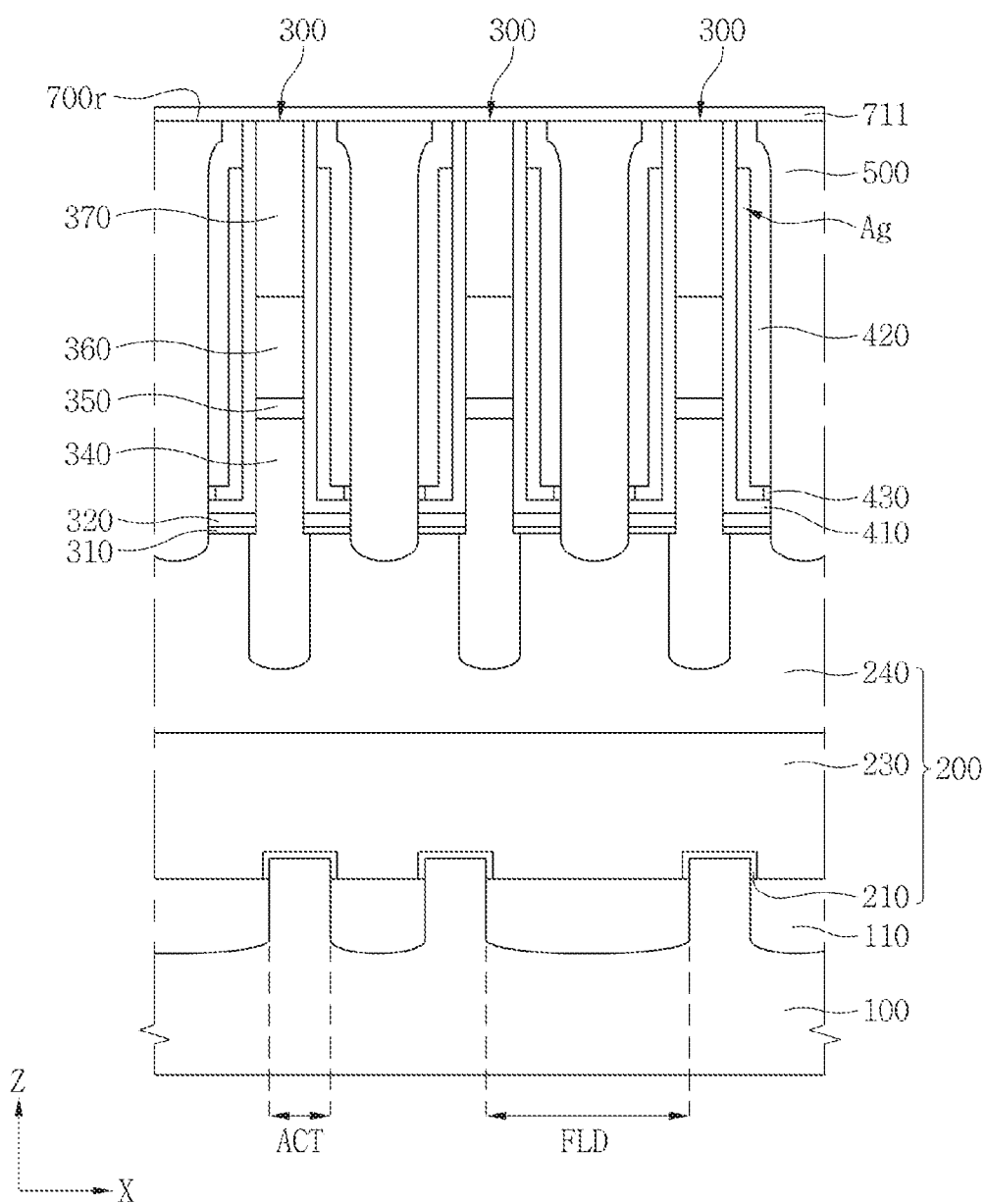

Referring to FIGS. 31A and 31B, the method of forming a semiconductor device in accordance with the embodiment of the inventive concept may include a process of forming a preliminary lower interlayer insulating layer 711 on the semiconductor substrate 100 including the third recesses 700r.

The process of forming the preliminary lower interlayer insulating layer 711 may include a process of depositing an insulating material on the semiconductor substrate 100 including the third recesses 700r.

Figure 32A:
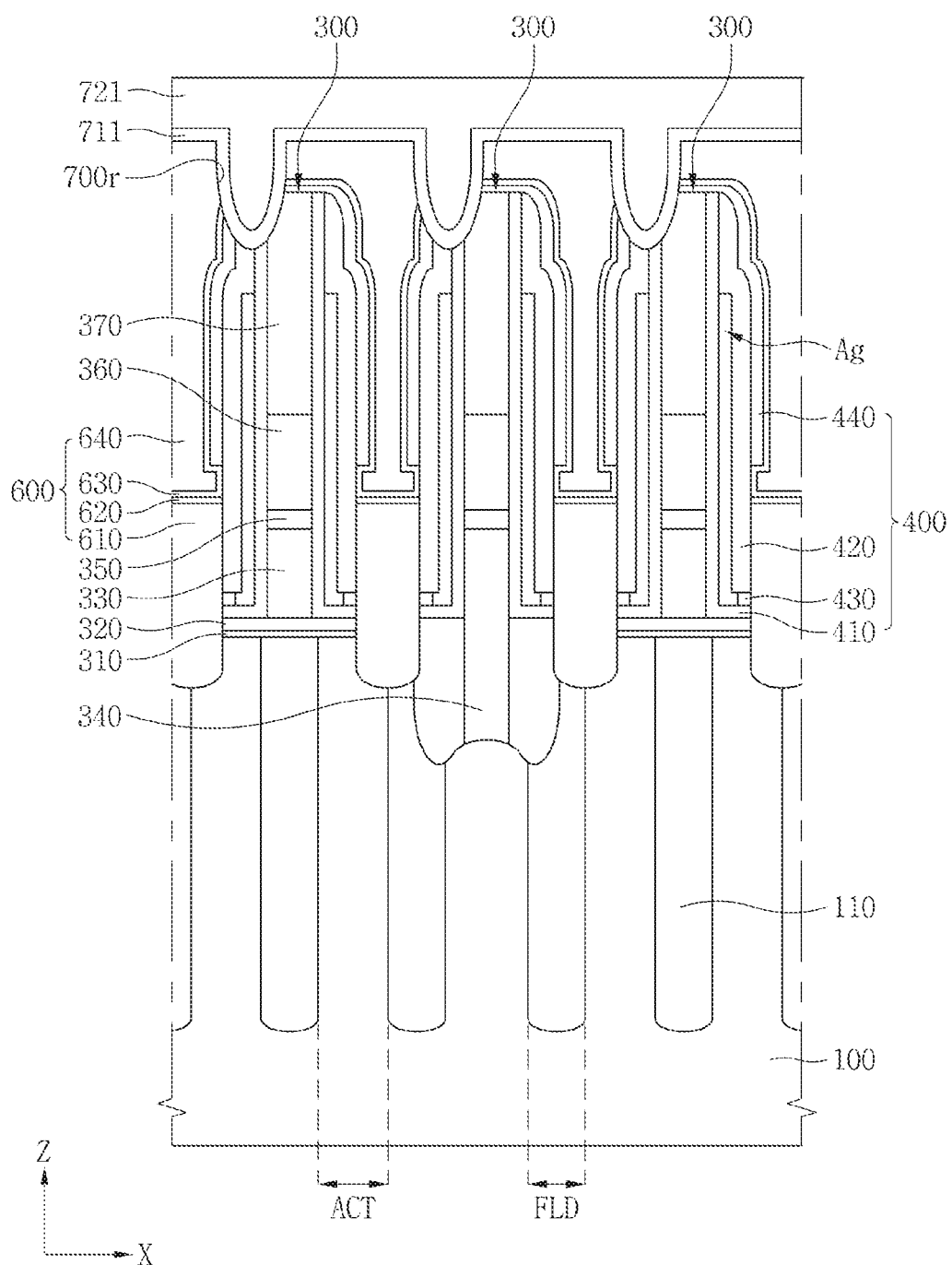
Figure 32B:
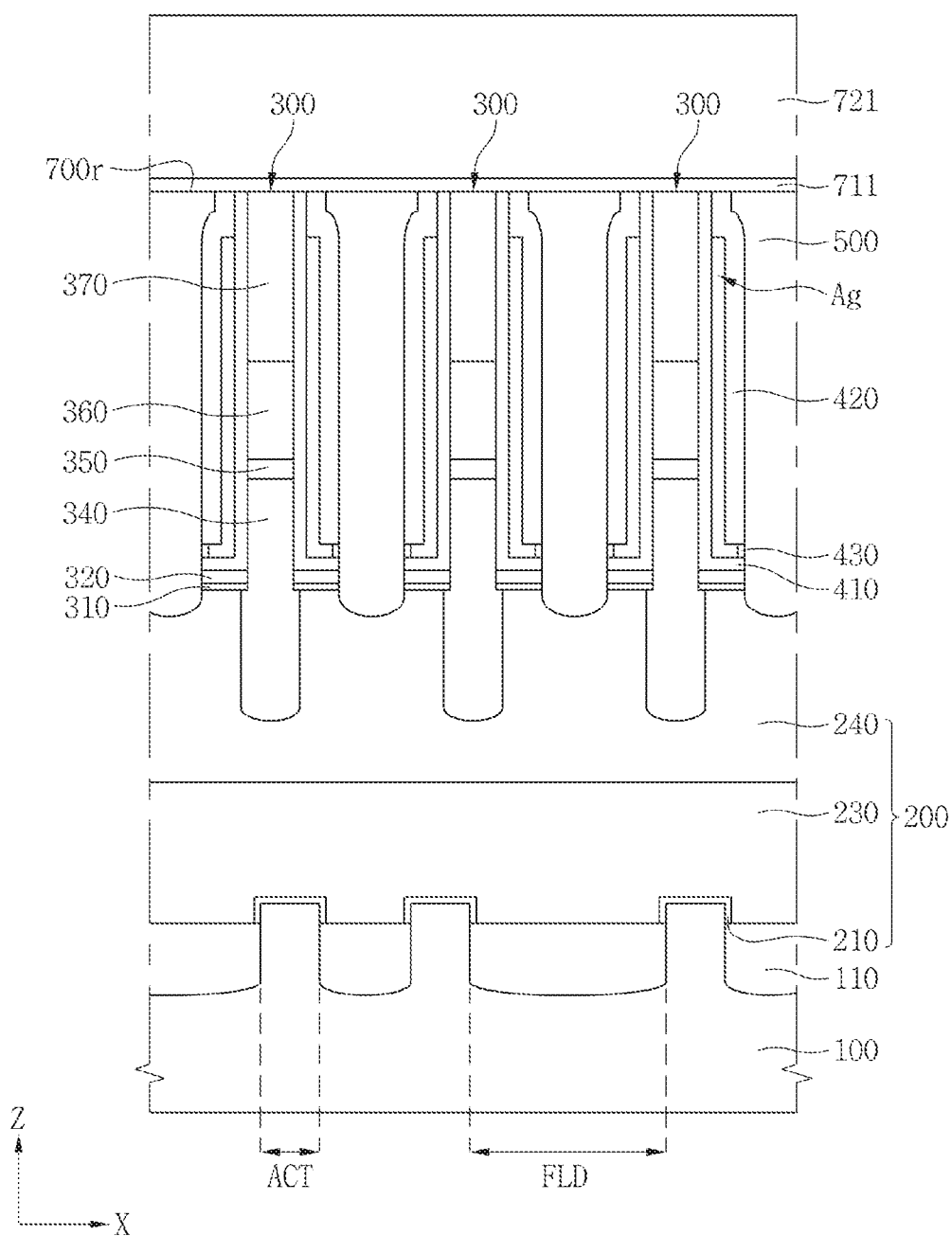
Figure 33A:
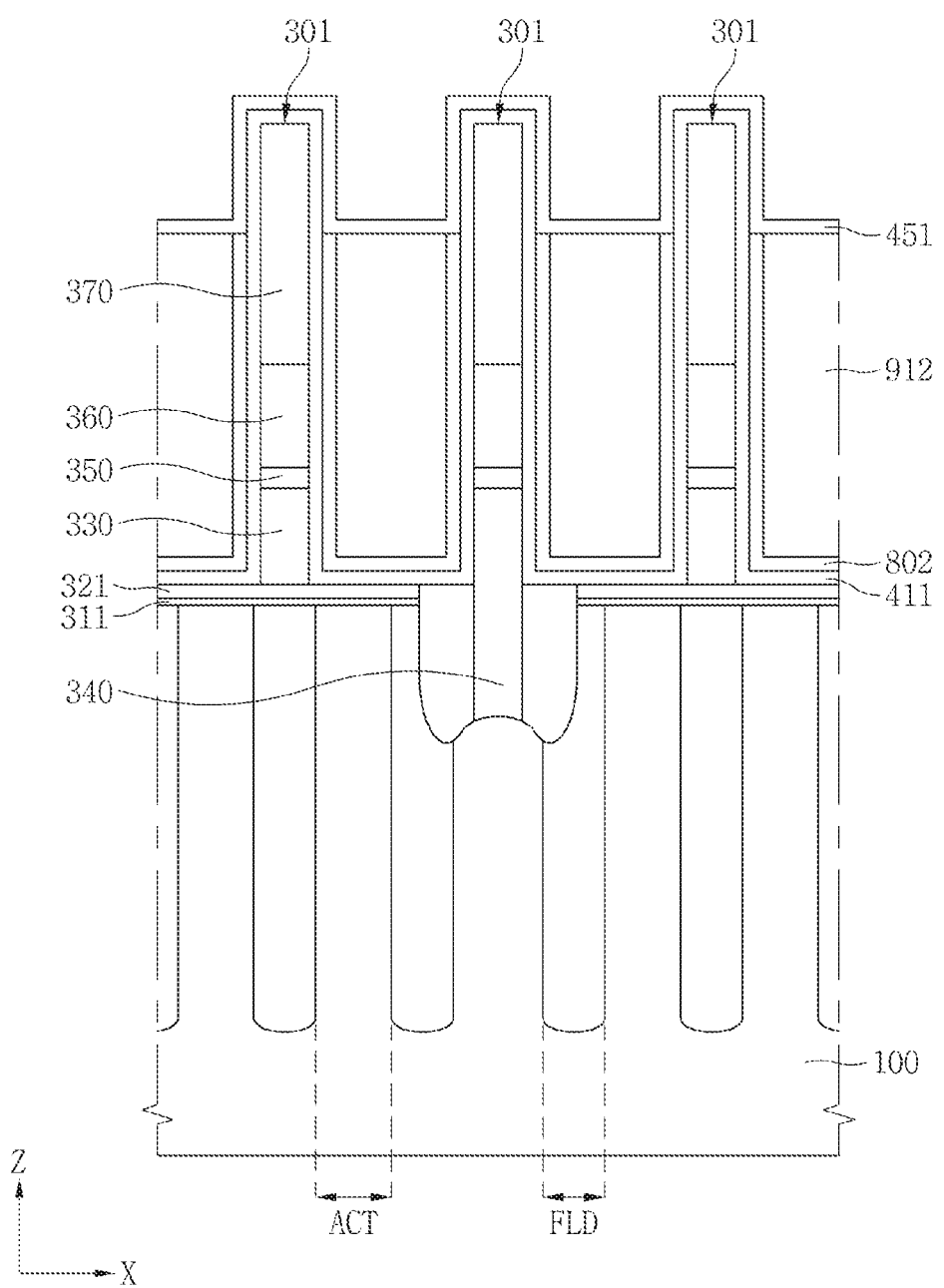
Figure 33B:
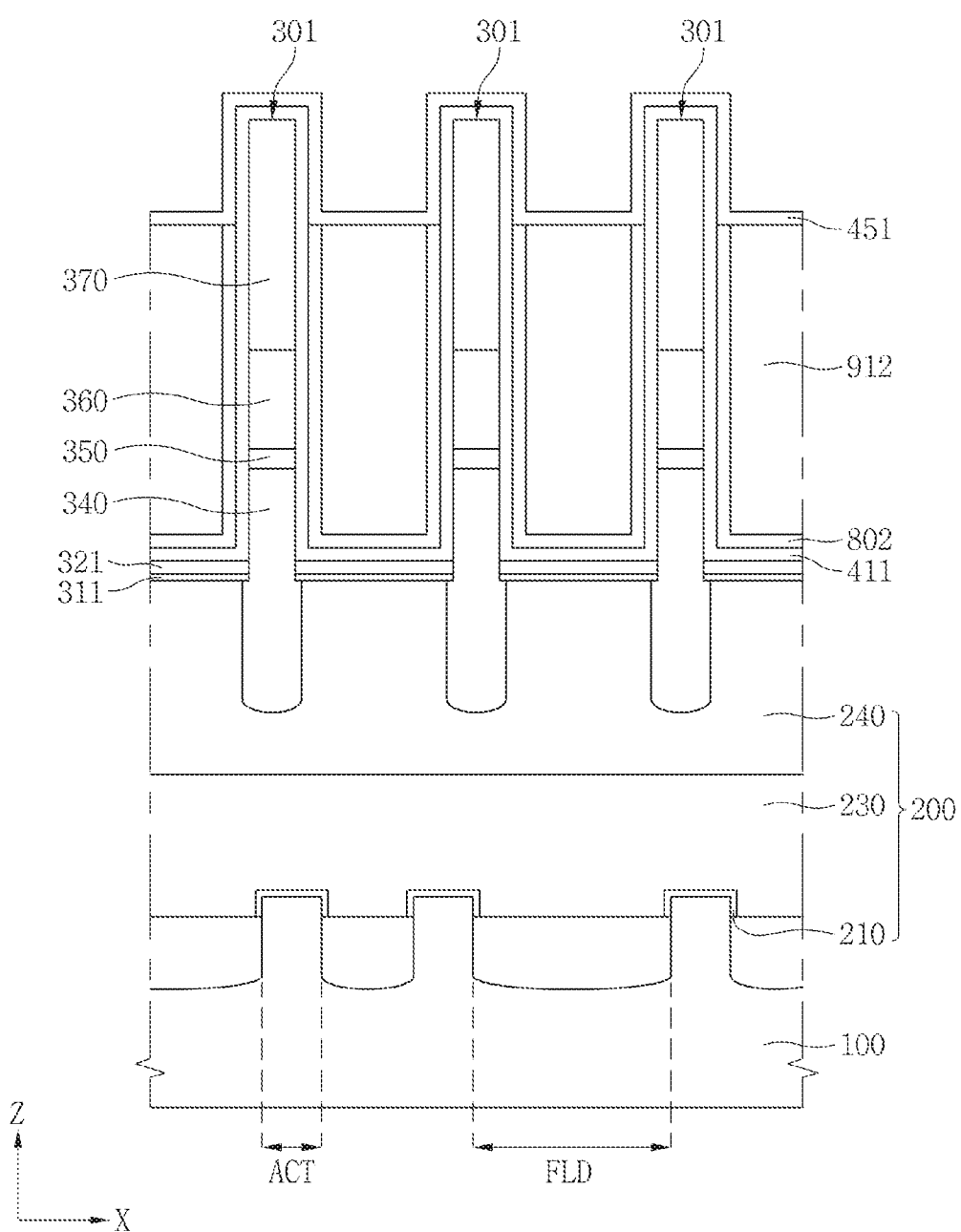

Referring to FIGS. 32A and 32B, the method of forming a semiconductor device in accordance with the embodiment of the inventive concept may include a process of forming a preliminary upper interlayer insulating layer 721 on the preliminary lower interlayer insulating layer 711.

The process of forming the preliminary upper interlayer insulating layer 721 may include a process of depositing an insulating material on the preliminary lower interlayer insulating layer 711. The process of forming the preliminary upper interlayer insulating layer 721 may include a process of filling between vertical regions of the preliminary lower interlayer insulating layer 711 with an insulating material. The process of forming the preliminary upper interlayer insulating layer 721 may include a process of depositing an insulating material having better gap-fill characteristics than the preliminary lower interlayer insulating layer 711.

Referring to FIG. 2A to 2C, the method of forming a semiconductor device in accordance with the embodiment of the inventive concept may include a process of forming an interlayer insulating layer 700 on the semiconductor substrate 100 including the storage contact plugs 600.

The process of forming the interlayer insulating layer 700 may include a process of forming an upper interlayer insulating layer 720 and a process of forming a lower interlayer insulating layer 710. The process of forming the upper interlayer insulating layer 720 may be performed in the same chamber as the process of forming the lower interlayer insulating layer 710. For example, the process of forming the interlayer insulating layer 700 may include a process of planarizing the preliminary upper interlayer insulating layer 721 and the preliminary lower interlayer insulating layer 711 to expose an upper surface of the storage contact plug 600.

FIGS. 33A to 43A and FIGS. 33B to 43B are cross-sectional views sequentially showing a method of forming a semiconductor device in accordance with the embodiment of the inventive concept.

A method of forming a semiconductor device in accordance with an embodiment of the inventive concept will be described with reference to FIGS. 3A, 3B, 33A to 43A, and 33B to 43B. First, referring to FIGS. 33A and 33B, the method of forming a semiconductor device in accordance with the embodiment of the inventive concept may include preparing a semiconductor substrate 100 including an active region ACT and a field region FLD, forming a gate structure 200 in the semiconductor substrate 100, forming first preliminary bit line structures 301 on the semiconductor substrate 100, forming an inner spacer insulating layer 411 on the first preliminary bit line structures 301, forming first sacrificial insulating patterns 802 on the inner spacer insulating layer 411, forming first molding insulating patterns 912 between the first sacrificial insulating patterns 802, and forming an upper spacer insulating layer 451 on the inner spacer insulating layer 411, the first sacrificial insulating patterns 802, and the first molding insulating patterns 912.

The formation of the gate structure 200 may include forming a gate insulating layer 210, forming a gate electrode 230, and forming a gate capping layer 240.

The formation of the first preliminary bit line structures 301 may include forming a lower bit line barrier layer 311, forming an upper bit line barrier layer 321, forming lower bit line electrodes 330, forming DC plugs 340, forming intermediate bit line patterns 350, forming upper bit line electrodes 360, and forming bit line capping patterns 370.

The formation of the upper spacer insulating layer 451 may include depositing an insulating material on the semiconductor substrate 100 including the first sacrificial insulating patterns 802 and the first molding insulating patterns 912. The formation of the upper spacer insulating layer 451 may include depositing an insulating material having an etch selectivity with respect to the first sacrificial insulating patterns 802. For example, the formation of the upper spacer insulating layer 451 may include depositing silicon nitride on the semiconductor substrate 100 including the first sacrificial insulating patterns 802 and the first molding insulating patterns 912.

Figure 34A:
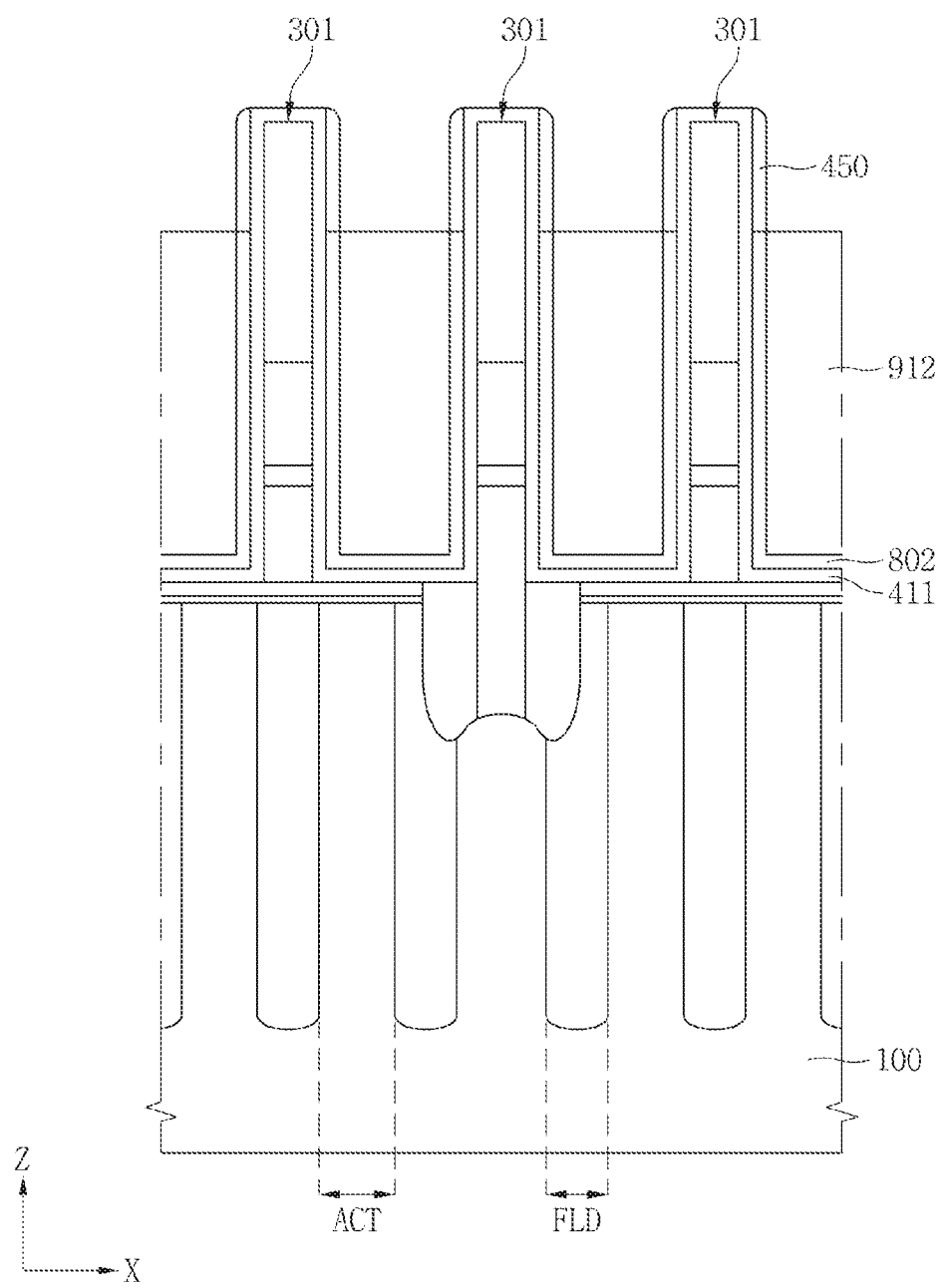
Figure 34B:
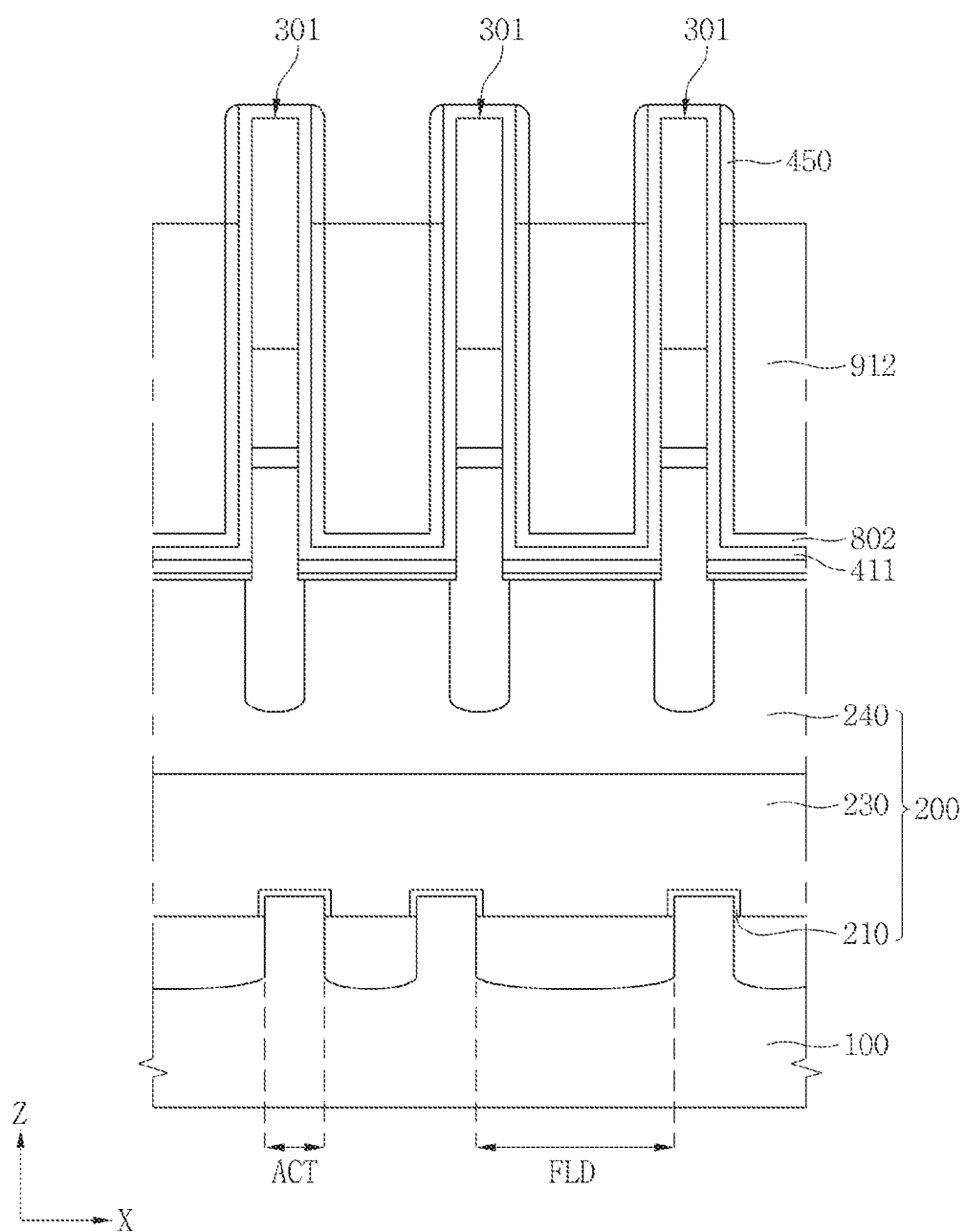

Referring to FIGS. 34A and 34B, the method of forming a semiconductor device in accordance with the embodiment of the inventive concept may include forming upper bit line spacers 450 by dry-etching the upper spacer insulating layer 451.

Figure 35A:
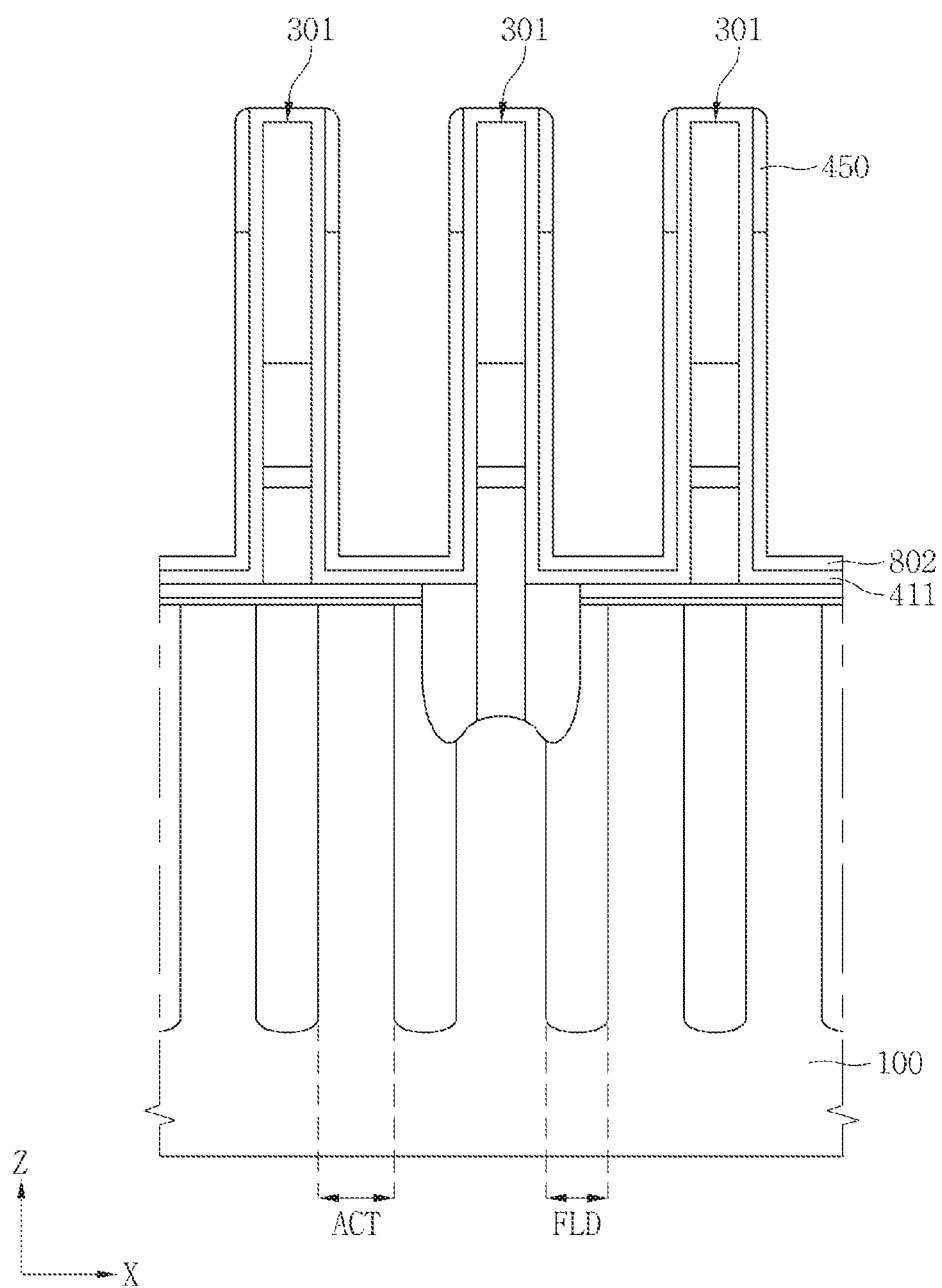
Figure 35B:
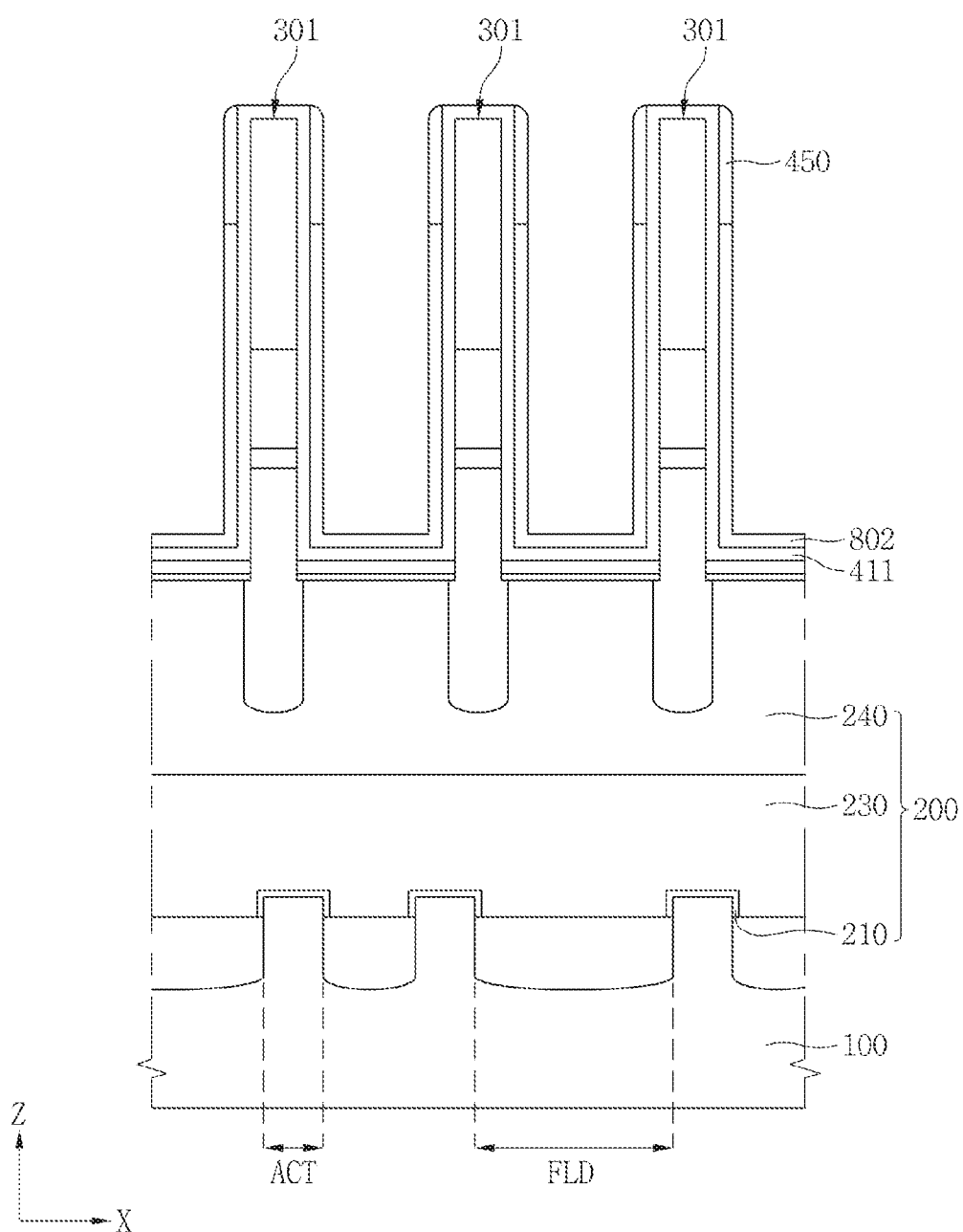

Referring to FIGS. 35A and 35B, the method of forming a semiconductor device in accordance with the embodiment of the inventive concept may include removing the first molding insulating patterns 912.

Figure 36A:
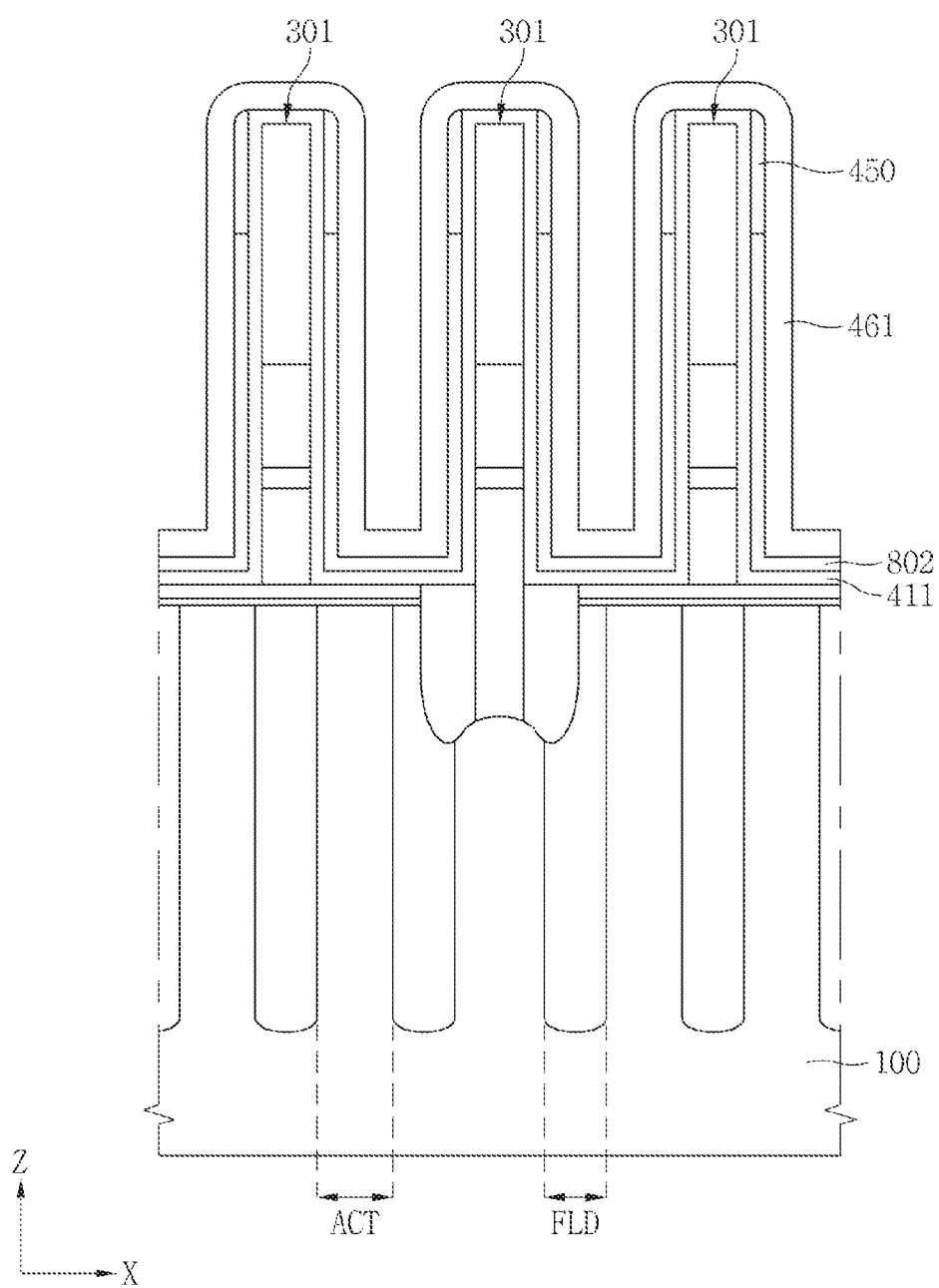
Figure 36B:
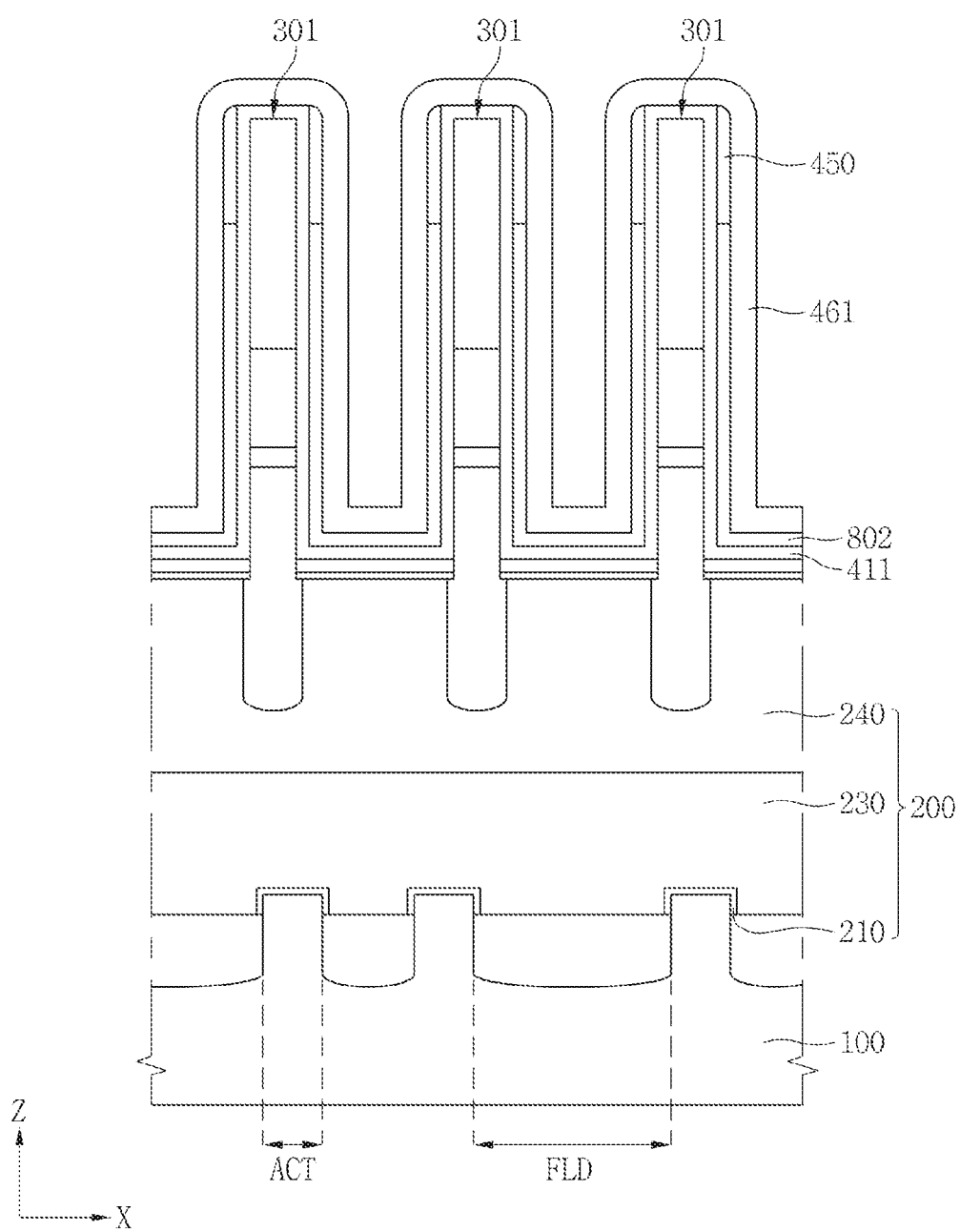

Referring to FIGS. 36A and 36B, the method of forming a semiconductor device in accordance with the embodiment of the inventive concept may include forming an outer spacer insulating layer 461 on the first sacrificial insulating patterns 802 and the upper bit line spacers 450.

The formation of the outer spacer insulating layer 461 may include depositing an insulating material on the semiconductor substrate 100 including the first sacrificial insulating patterns 802 and the upper bit line spacers 450. The formation of the outer spacer insulating layer 461 may include depositing an insulating material having an etch selectivity with respect to the first sacrificial insulating patterns 802. For example, the formation of the outer spacer insulating layer 461 may include depositing silicon nitride on the semiconductor substrate 100 including the first sacrificial insulating patterns 802 and the upper bit line spacers 450.

Figure 37A:
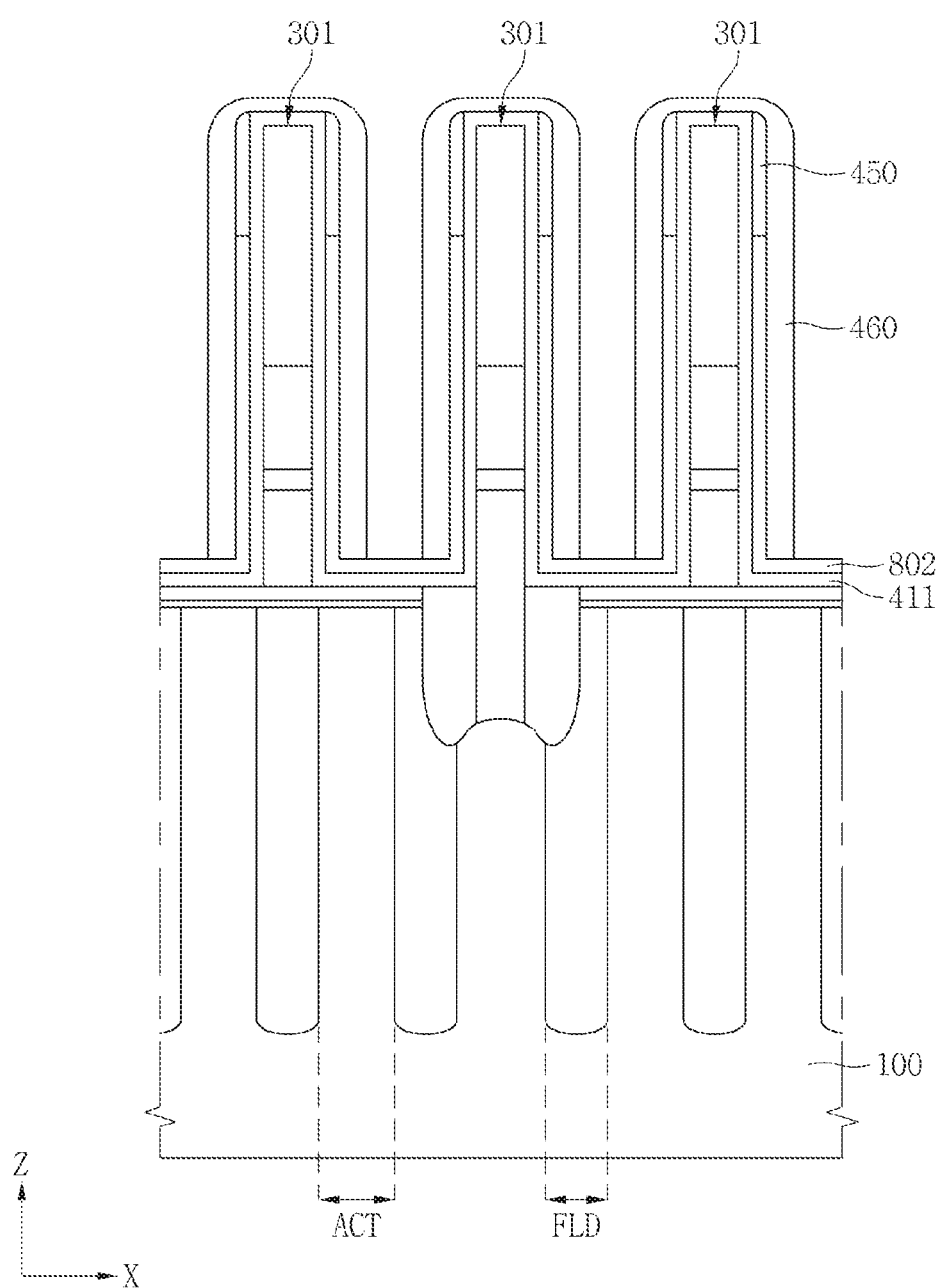
Figure 37B:
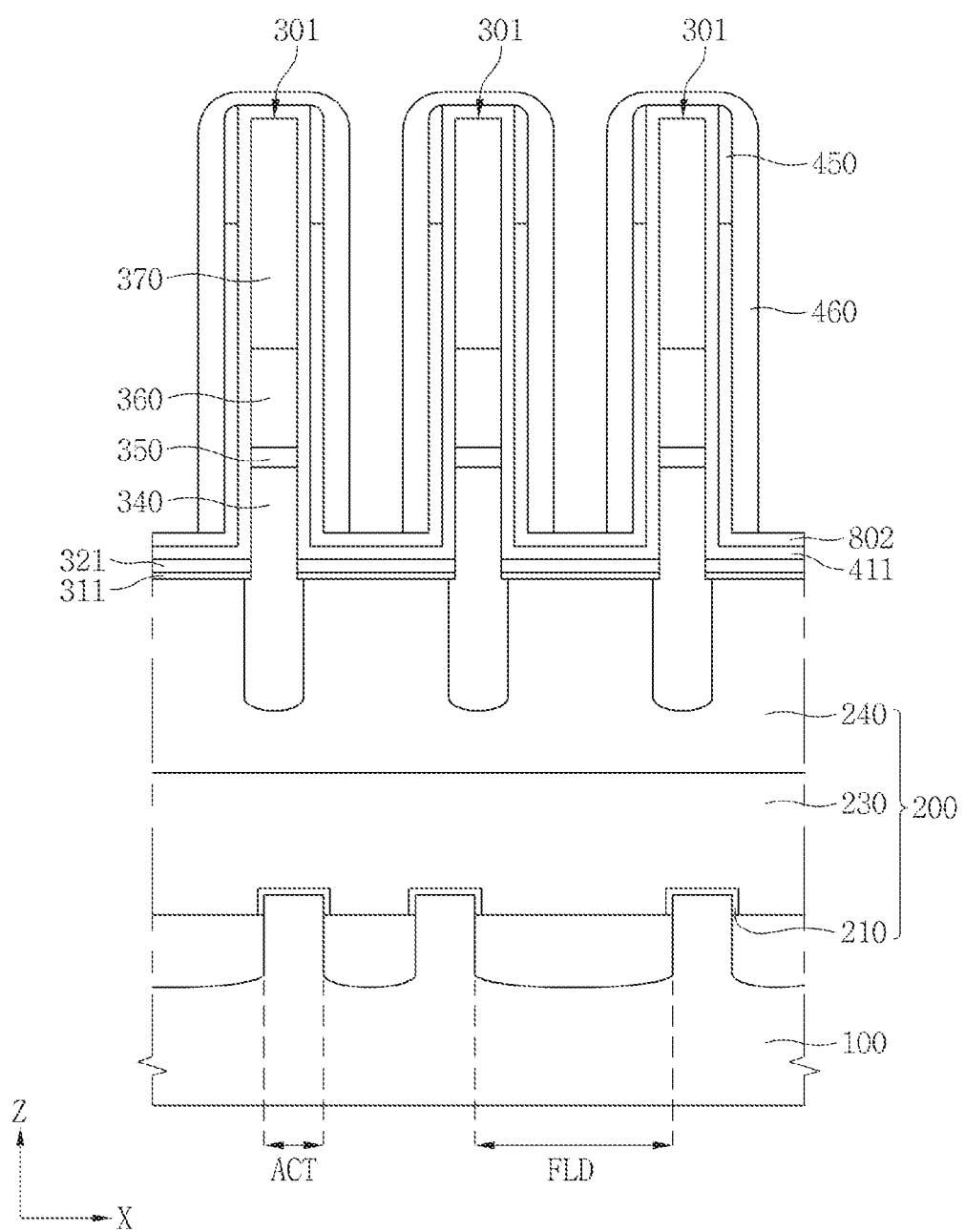

Referring to FIGS. 37A and 37B, the method of forming a semiconductor device in accordance with the embodiment of the inventive concept may include forming outer bit line spacers 460 by dry-etching the outer spacer insulating layer 461.

Figure 38A:
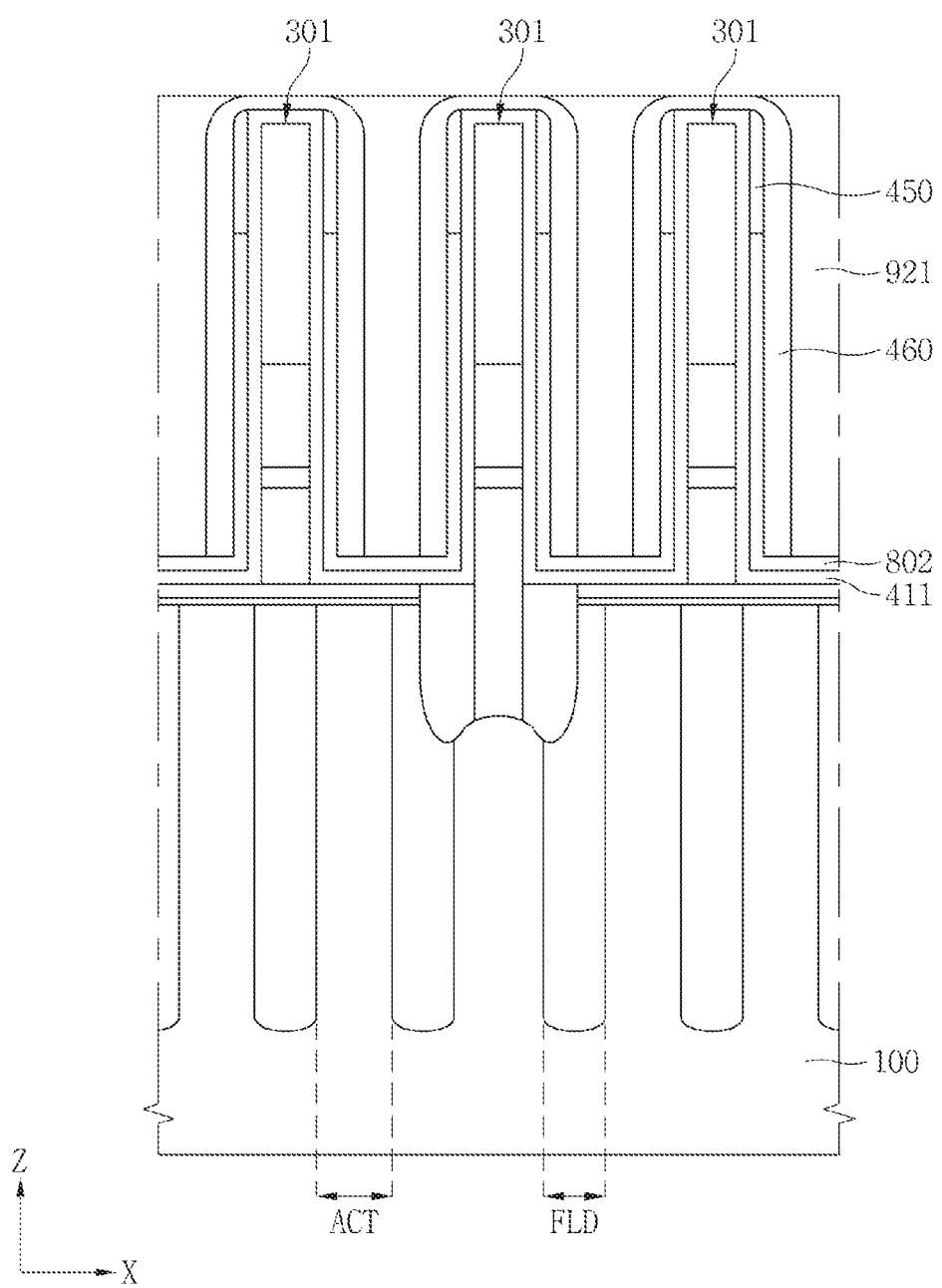
Figure 38B:
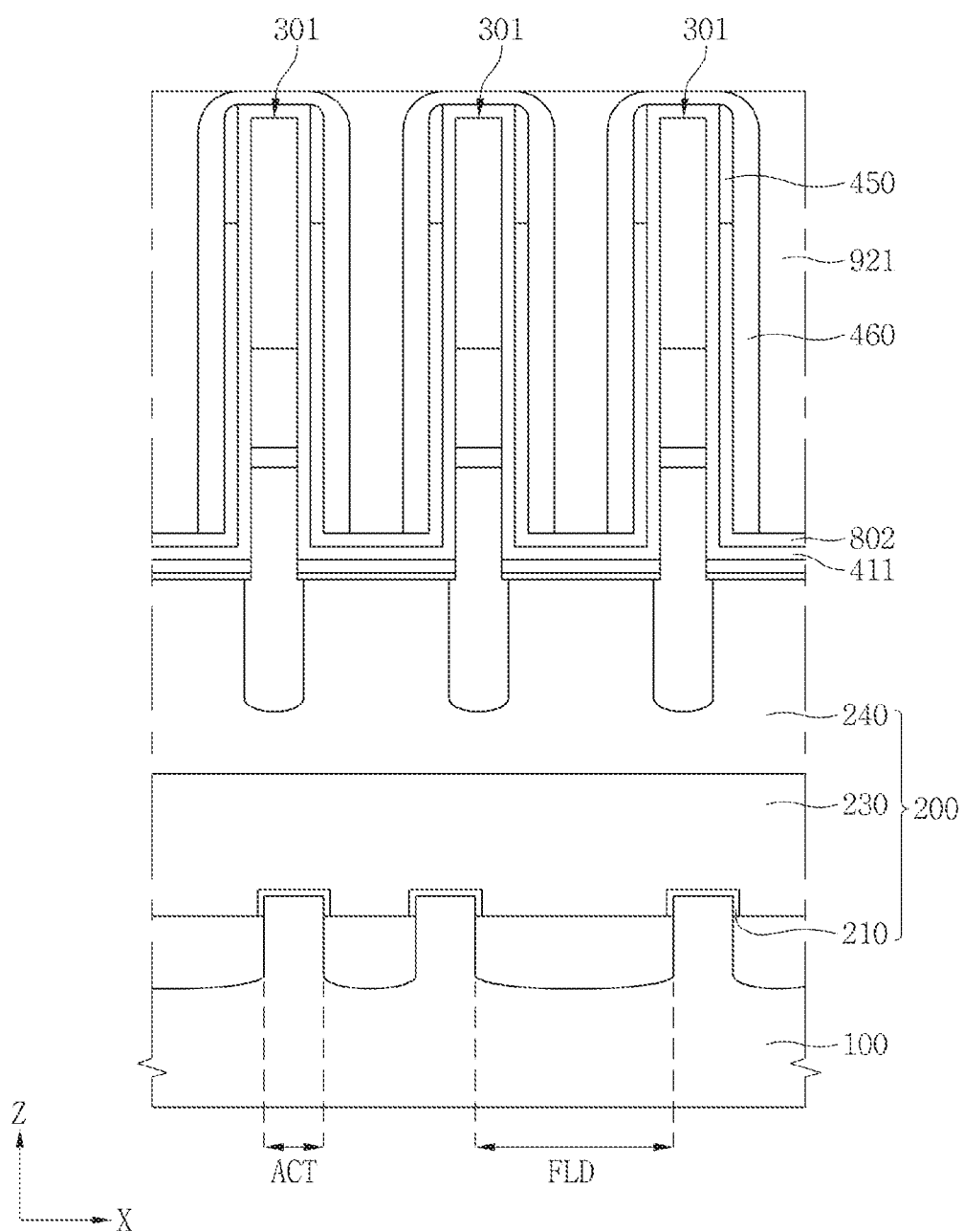

Referring to FIGS. 38A and 38B, the method of forming a semiconductor device in accordance with the embodiment of the inventive concept may include forming second molding insulating patterns 921 between the outer bit line spacers 460.

Figure 39A:
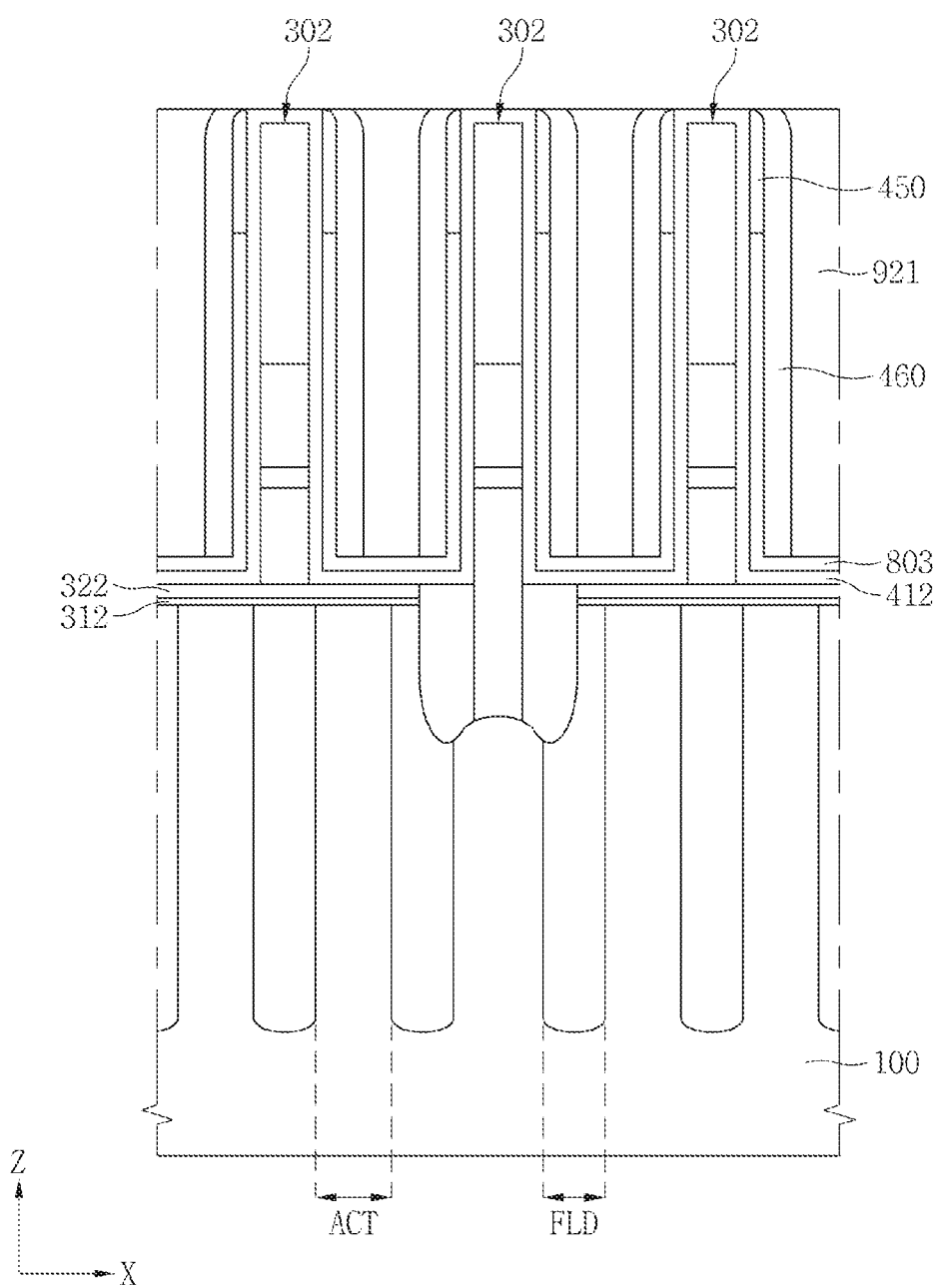
Figure 39B:
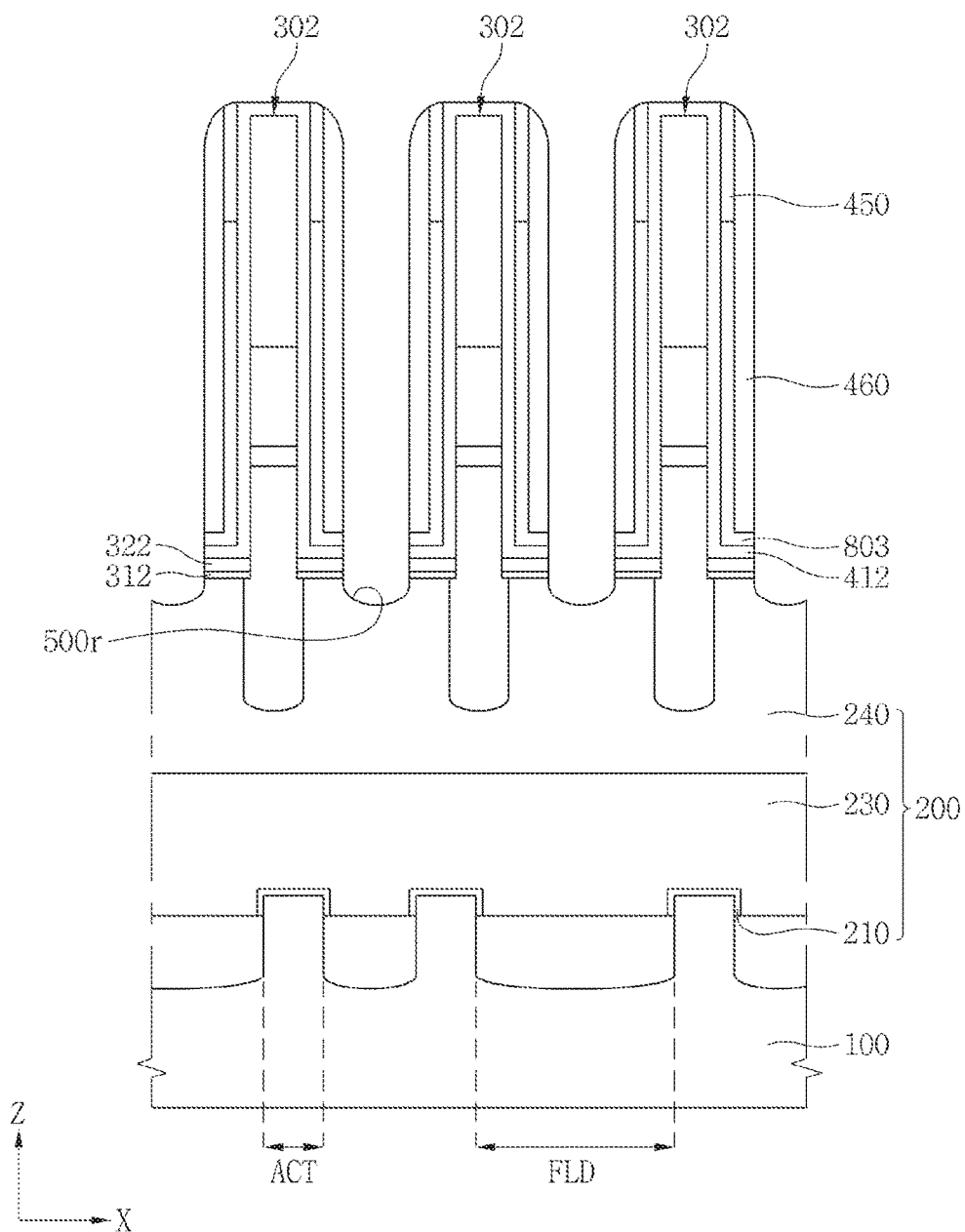

Referring to FIGS. 39A and 39B, the method of forming a semiconductor device in accordance with the embodiment of the inventive concept may include forming first recesses 500r in the gate capping layer 240.

The formation of the first recesses 500r may include removing the second molding insulating patterns 921 located on the gate structure 200, forming second sacrificial insulating patterns 803 by dry-etching the first sacrificial insulating patterns 802, forming an inner spacer pattern 412 by dry-etching the inner spacer insulating layer 411, forming a preliminary upper bit line barrier pattern 322 by dry-etching the upper bit line barrier layer 321, forming a preliminary lower bit line barrier pattern 312 by dry-etching the lower bit line barrier layer 311, and recessing the gate capping layer 240.

In the method of forming a semiconductor device in accordance with the embodiment of the inventive concept, second preliminary bit line structures 302 may be formed by forming the preliminary upper bit line barrier pattern 322 and forming the preliminary lower bit line barrier pattern 312.

Figure 40A:
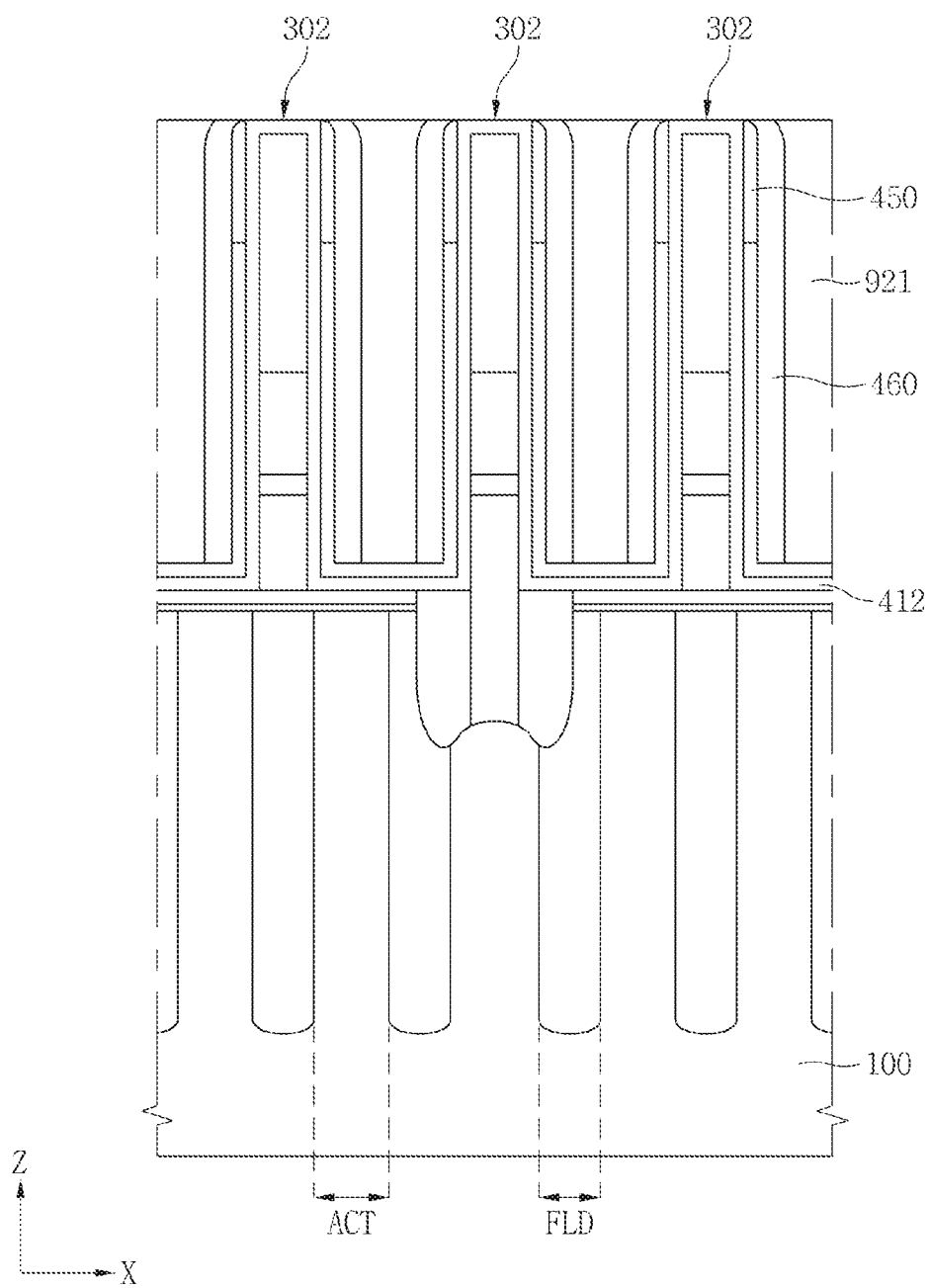
Figure 40B:
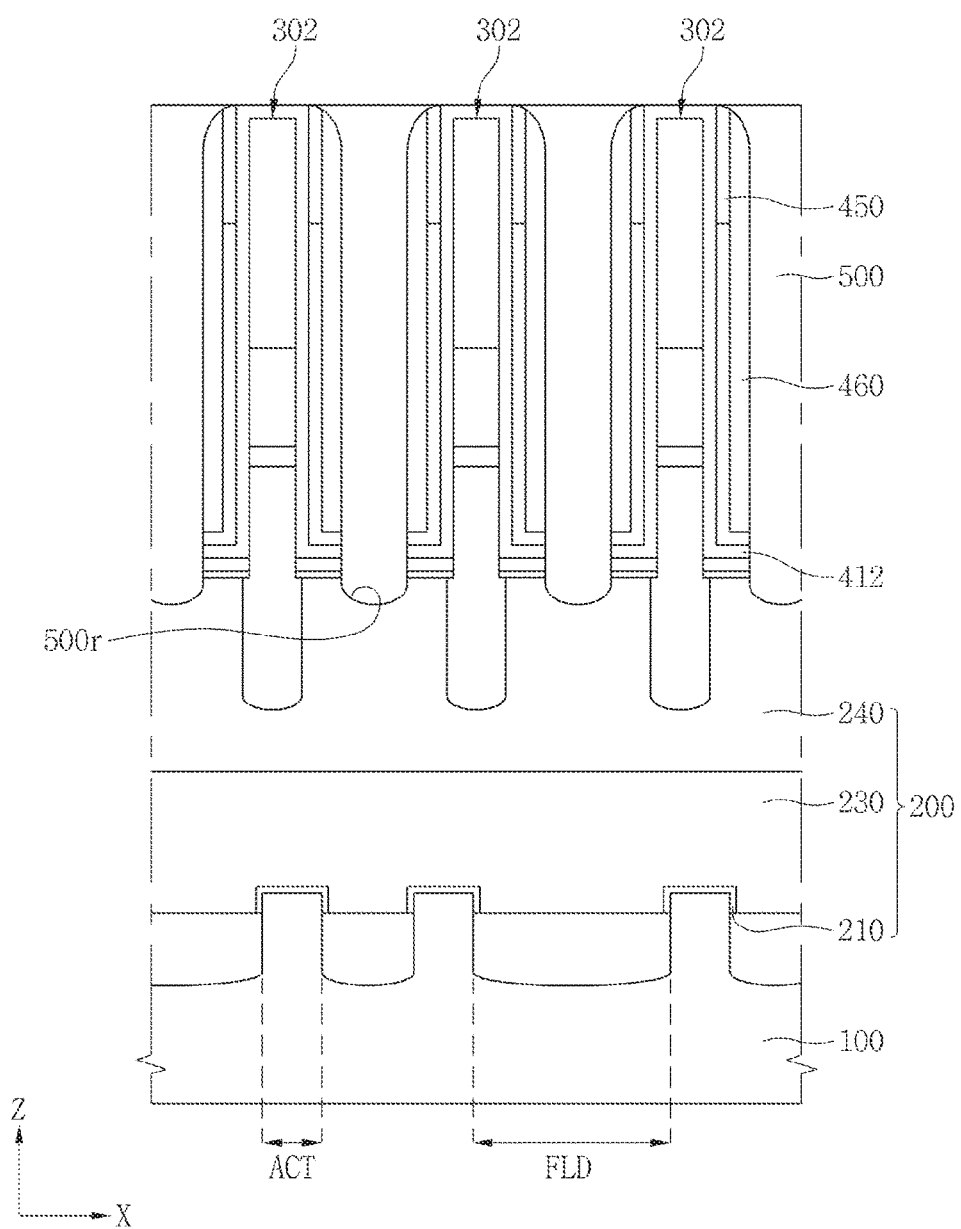

Referring to FIGS. 40A and 40B, the method of forming a semiconductor device in accordance with the embodiment of the inventive concept may include forming plug isolation patterns 500 filling the first recesses 500r.

Figure 41A:
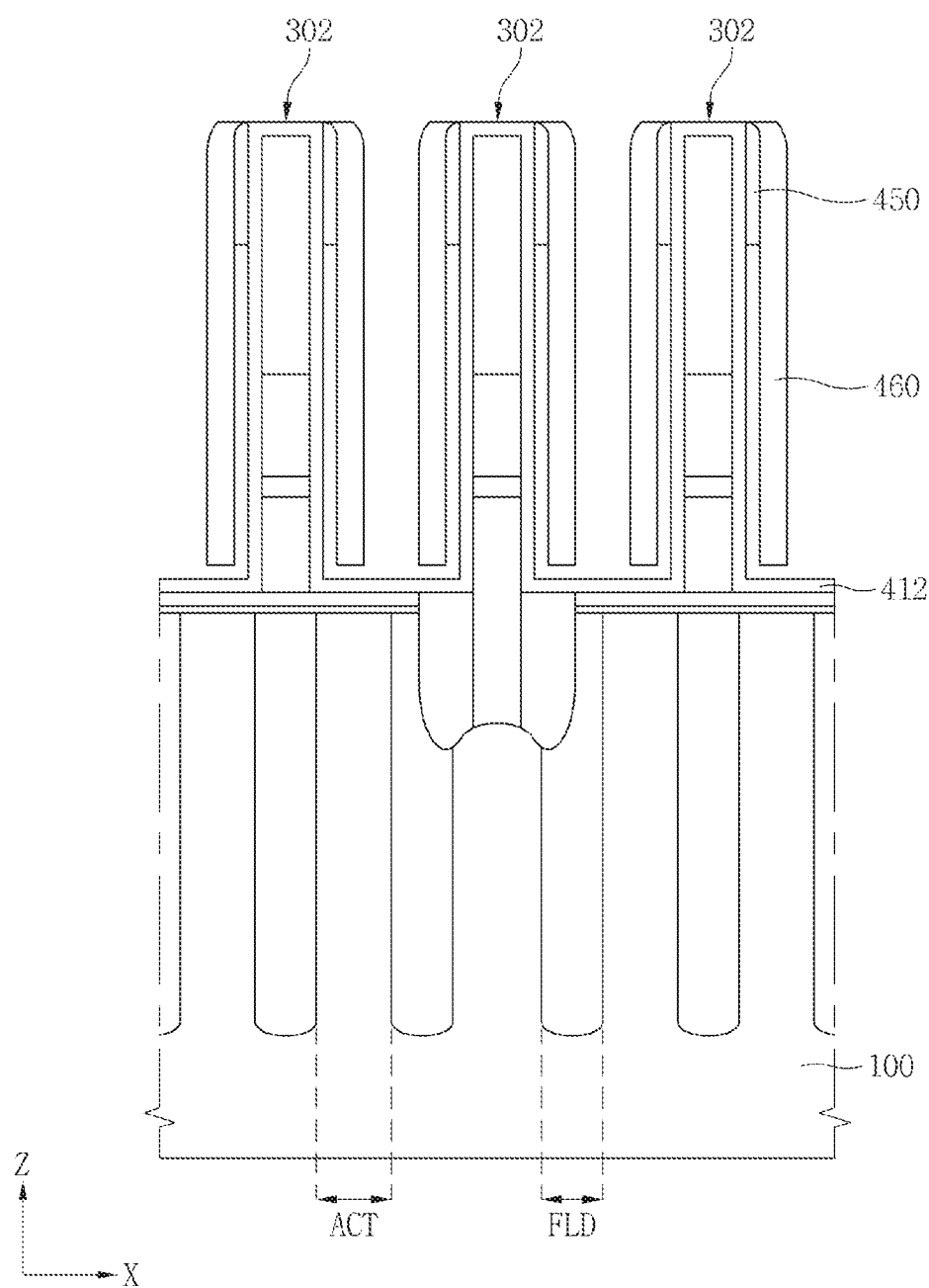
Figure 41B:
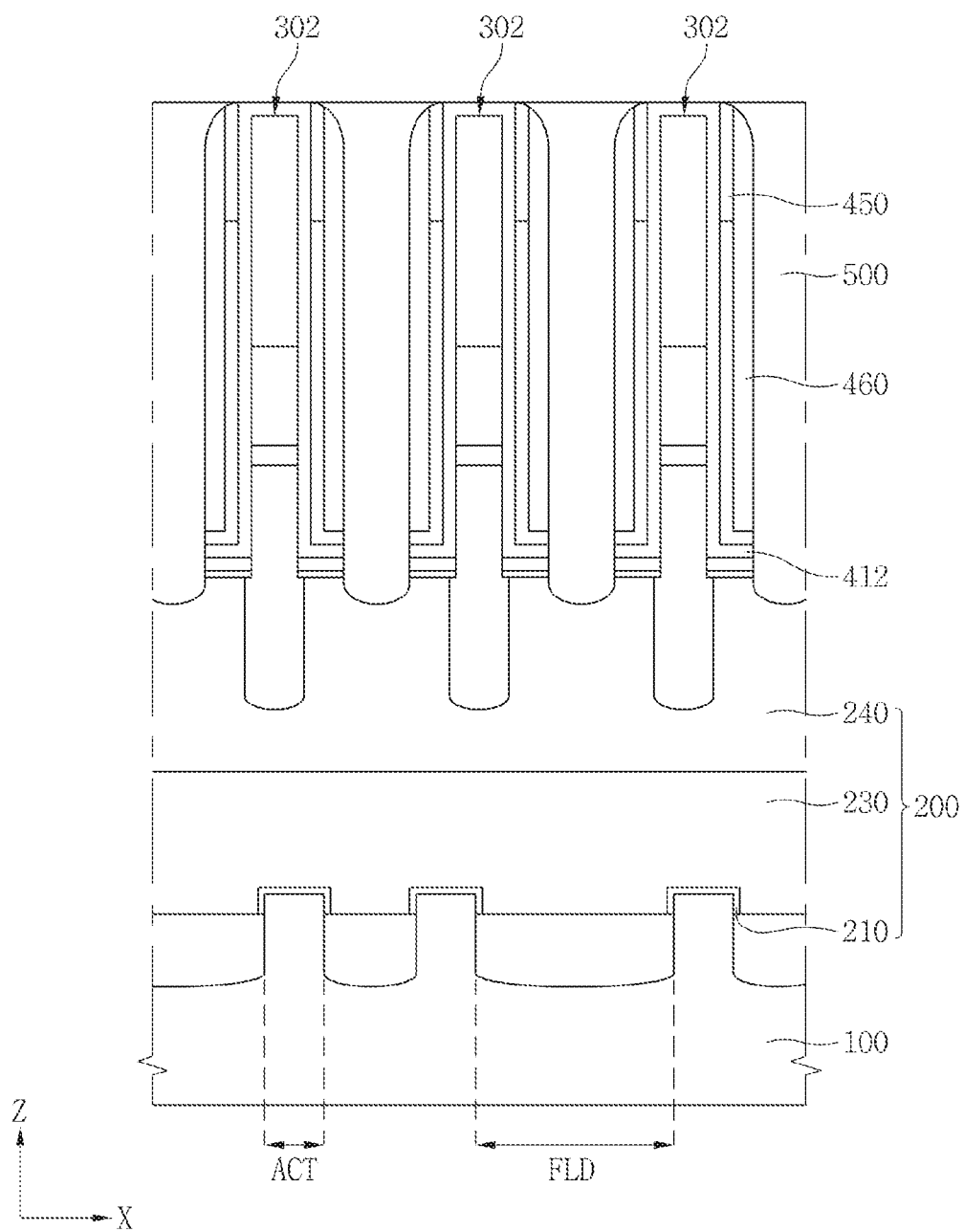

Referring to FIGS. 41A and 41B, the method of forming a semiconductor device in accordance with the embodiment of the inventive concept may include removing the second sacrificial insulating patterns 803 and the second molding insulating patterns 921.

Figure 42A:
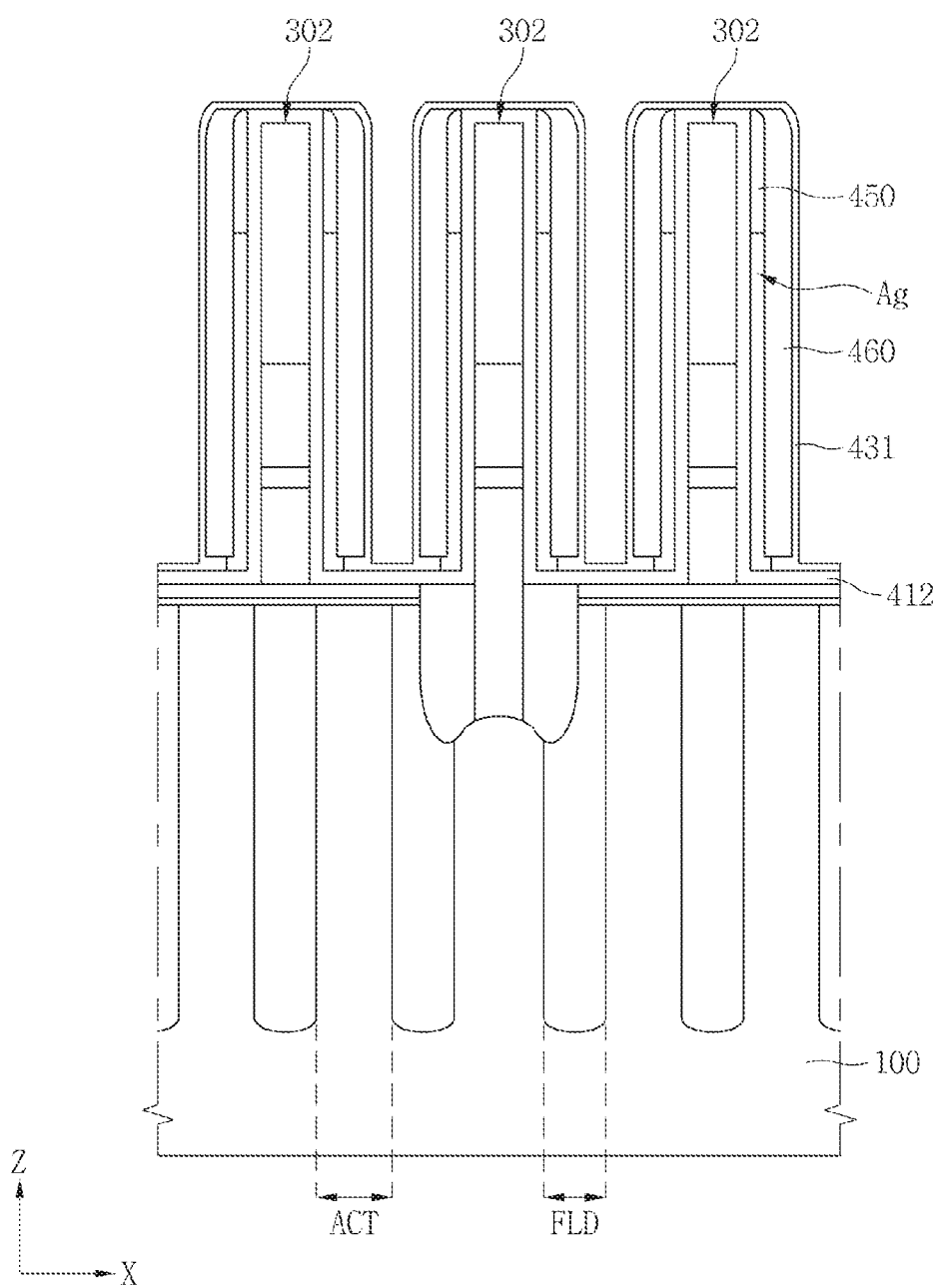
Figure 42B:
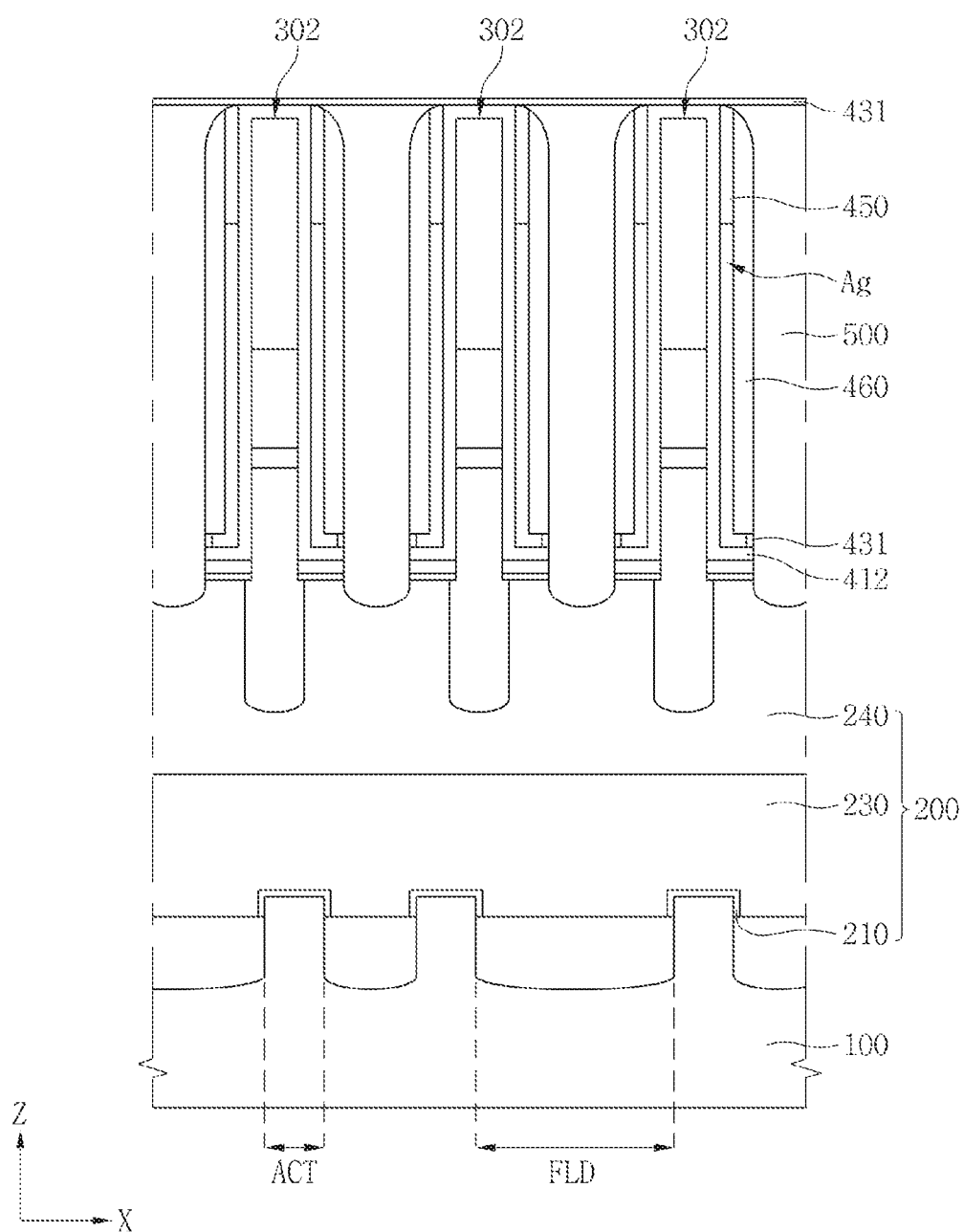

Referring to FIGS. 42A and 42B, the method of forming a semiconductor device in accordance with the embodiment of the inventive concept may include forming a block spacer insulating layer 431 on the semiconductor substrate 100 on which the second sacrificial insulating patterns 803 and the second molding insulating patterns 921 are removed.

In the method of forming a semiconductor device in accordance with the embodiment of the inventive concept, air-gaps Ag may be formed on side surfaces of each second preliminary bit line structure 302 by forming the block spacer insulating layer 431. The air-gaps Ag may be formed under the upper bit line spacers 450. Accordingly, in the method of forming a semiconductor device in accordance with the embodiment of the inventive concept, inflow of a component to be formed by a subsequent process into the air-gaps Ag may be prevented.

Figure 43A:
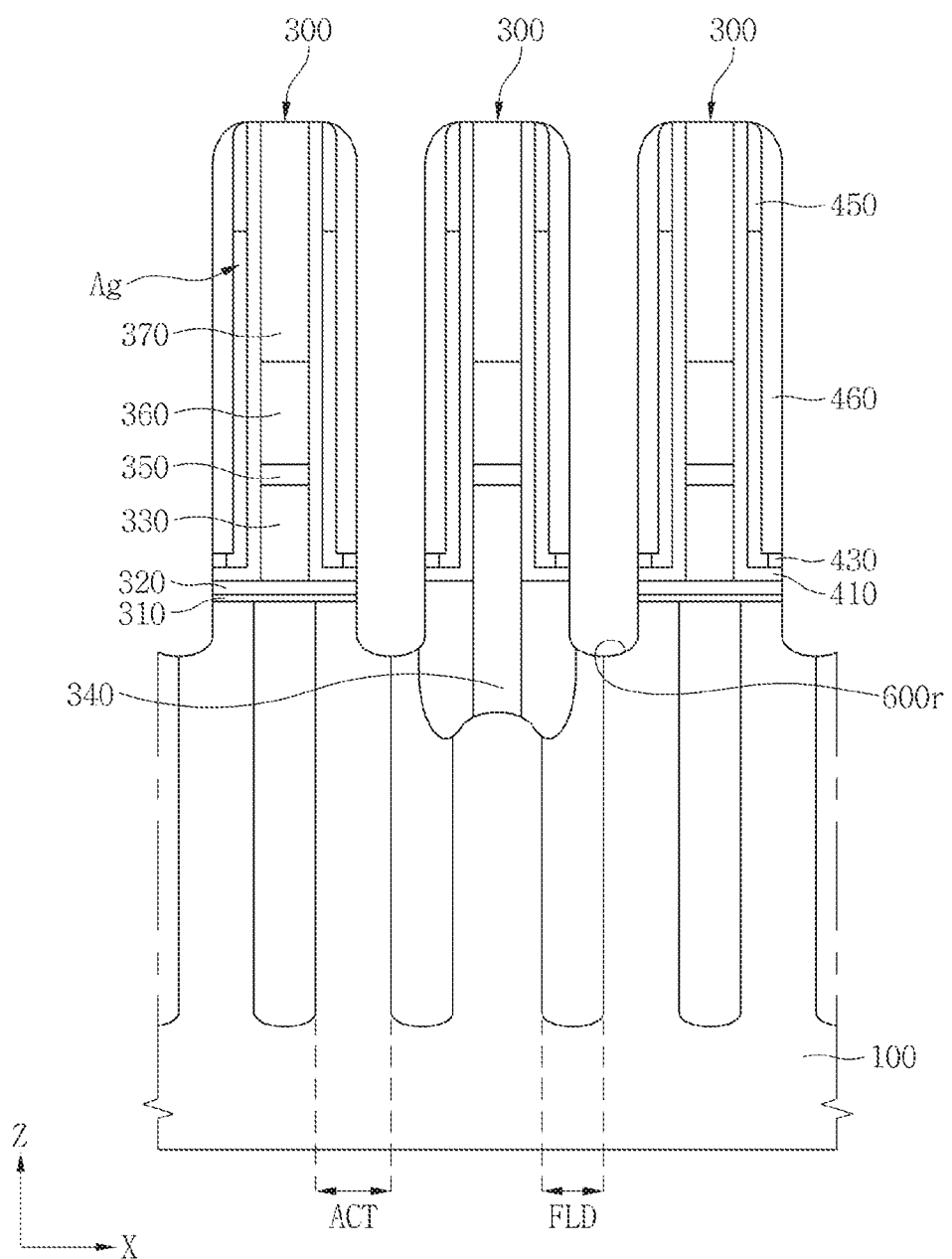
Figure 43B:
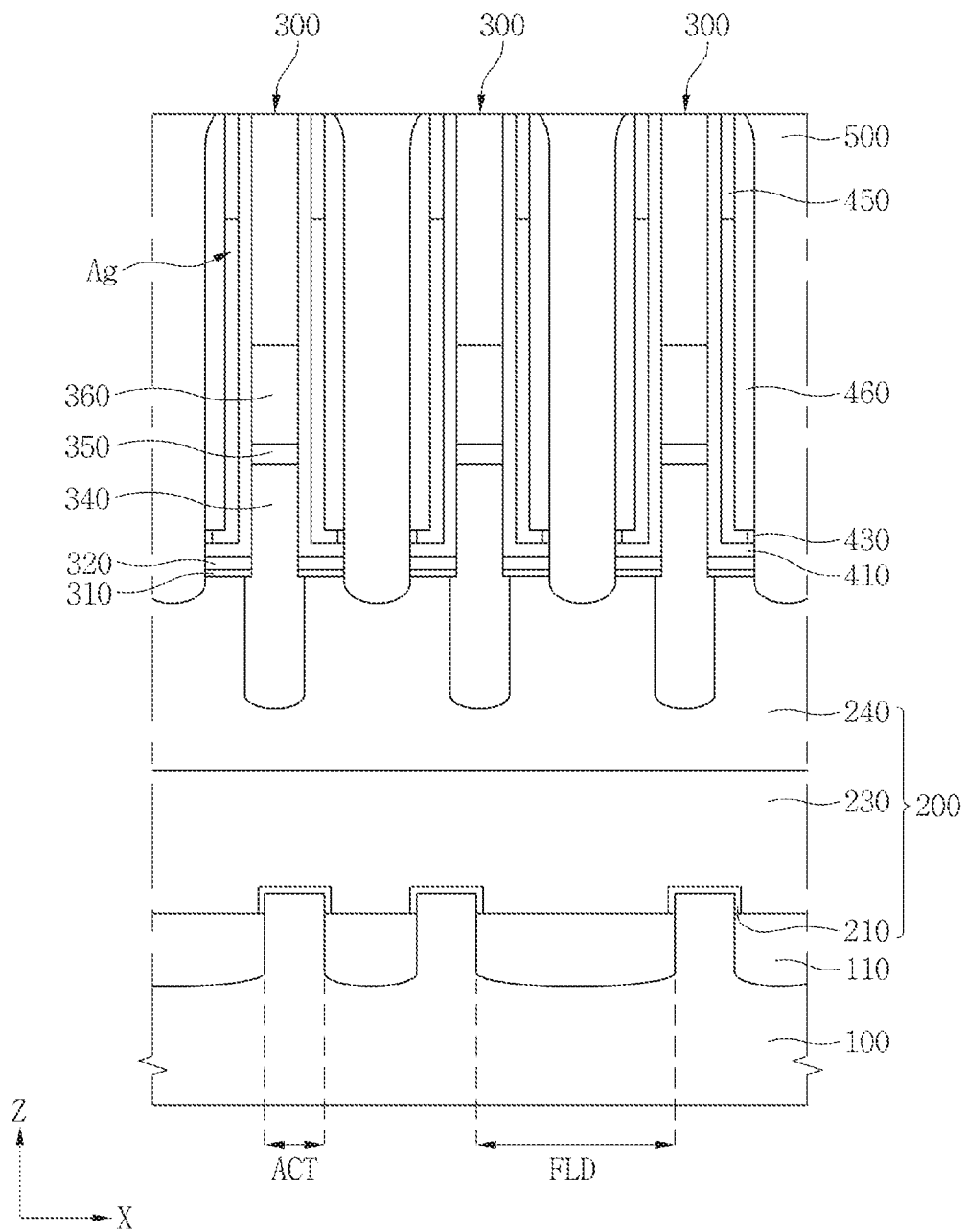

Referring to FIGS. 43A and 43B, the method of forming a semiconductor device in accordance with the embodiment of the inventive concept may include forming second recesses 600r in the semiconductor substrate 100.

The formation of the second recesses 600r may include forming block bit line spacers 430 by dry-etching the block spacer insulating layer 431, forming an upper bit line barrier pattern 320 by dry-etching the preliminary upper bit line barrier pattern 322, forming a lower bit line barrier pattern 310 by dry-etching the preliminary lower bit line barrier pattern 312, and recessing the semiconductor substrate 100.

In the method of forming a semiconductor device in accordance with the embodiment of the inventive concept, bit line structures 300 may be formed by forming the upper bit line barrier pattern 320 and forming the lower bit line barrier pattern 310.

Referring to FIGS. 3A and 3B, the method of forming a semiconductor device in accordance with the embodiment of the inventive concept may include forming storage contact plugs 600 between the bit line structures 300 and the plug isolation patterns 500, forming cover bit line spacers 440 on the bit line structures 300, and forming an interlayer insulating layer 700 between the storage contact plugs 600.

The formation of the storage contact plugs 600 may include forming lower plug pads 610, forming intermediate plug patterns 620, forming plug barrier patterns 630, and forming upper contact plugs 640.

In the method of forming a semiconductor device in accordance with the embodiment of the inventive concept, bit line spacers 400 may be formed by forming the cover bit line spacers 440.

The formation of the interlayer insulating layer 700 may include forming a lower interlayer insulating layer 710 and forming an upper interlayer insulating layer 720.

In the method of forming a semiconductor device in accordance with the embodiment of the inventive concept, the air-gaps Ag may be formed before the storage contact plugs 600 are formed. In the method of forming a semiconductor device in accordance with the embodiment of the inventive concept, the air-gaps Ag may be formed with no damage to the storage contact plugs 600. Accordingly, in the method of forming a semiconductor device in accordance with the embodiment of the inventive concept, reliability can be improved.

Figure 44:
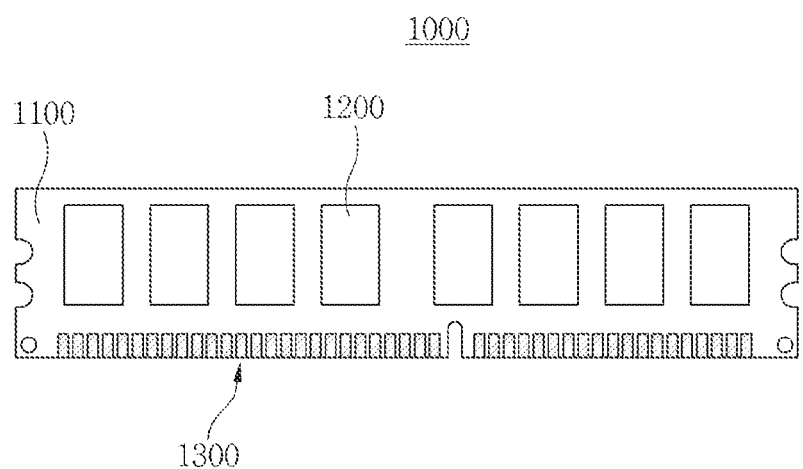
FIG. 44 is a configuration diagram showing a memory module including a semiconductor device in accordance with an embodiment of the inventive concept.

FIG. 44 is a configuration diagram showing a memory module including a semiconductor device in accordance with an embodiment of the inventive concept.

Referring to FIG. 44, the memory module 1000 may include a module substrate 1100, semiconductor packages 1200, and module contact terminals 1300. The module substrate 1100 may be a system board. The semiconductor packages 1200 may be disposed side by side on the module substrate 1100. The semiconductor packages 1200 may be disposed at both sides of the module substrate 1100. The module contact terminals 1300 may be formed side by side on an edge of the module substrate 1100. The module contact terminals 1300 may be electrically connected to the semiconductor packages 1200.

The semiconductor packages 1200 may include a semiconductor device in accordance with various embodiments of the inventive concept. Accordingly, reliability of the semiconductor packages 1200 can be improved in the memory module 1000.

Figure 45:
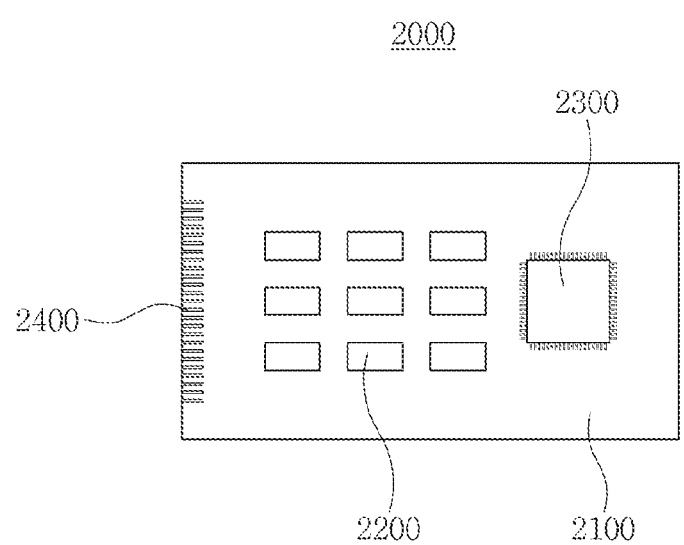
FIG. 45 is a configuration diagram showing a semiconductor module including a semiconductor device in accordance with an embodiment of the inventive concept.

FIG. 45 is a configuration diagram showing a semiconductor module including a semiconductor device in accordance with an embodiment of the inventive concept.

Referring to FIG. 45, the semiconductor module 2000 may include a module substrate 2100, memories 2200, a microprocessor 2300, and input/output terminals 2400. The memories 2200, the microprocessor 2300, and the input/output terminals 2400 may be mounted on the module substrate 2100. The semiconductor module 2000 may include a memory card or a card package.

The memories 2200 and the microprocessor 2300 may include a semiconductor device in accordance with various embodiments of the inventive concept. Accordingly, in the semiconductor module 2000 in accordance with the embodiments of the inventive concept, reliability of the memories 2200 and the microprocessor 2300 can be improved.

Figure 46:
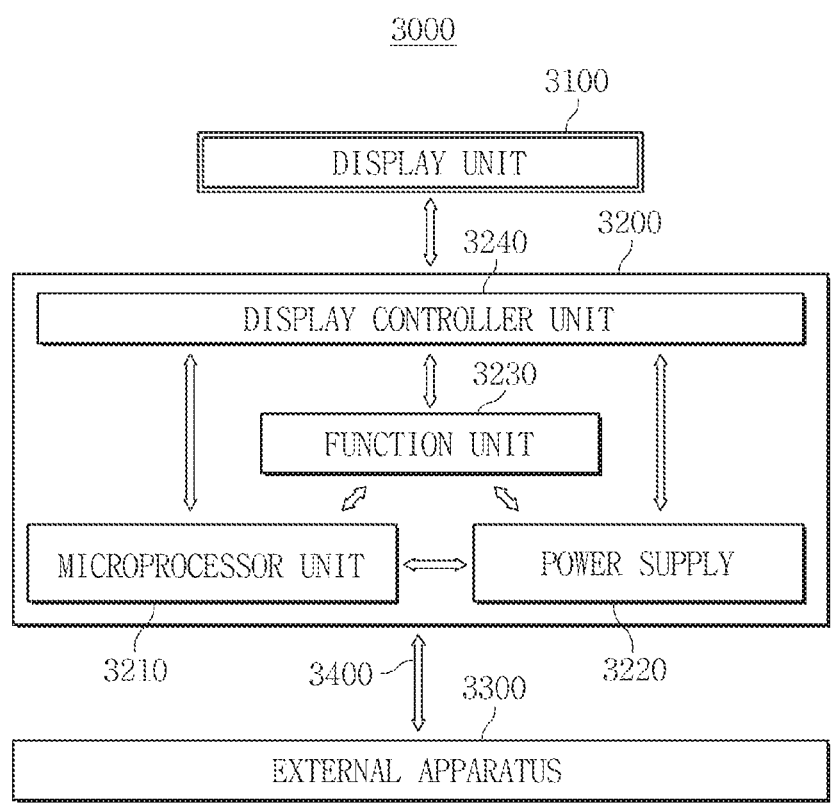
FIG. 46 is a configuration diagram showing a mobile system including a semiconductor device in accordance with an embodiment of the inventive concept.

FIG. 46 is a configuration diagram showing a mobile system including a semiconductor device in accordance with an embodiment of the inventive concept.

Referring to FIG. 46, the mobile system 3000 may include a display unit 3100, a body unit 3200, and an external apparatus 3300. The body unit 3200 may include a microprocessor 3210, a power supply 3220, a function unit 3230, and a display controller 3240.

The display unit 3100 may be electrically connected to the body unit 3200. The display unit 3100 may be electrically connected to the display controller 3240 of the body unit 3200. The display unit 3100 may display an image processed by the display controller 3240 of the body unit 3200.

The body unit 3200 may be a system board or a motherboard including a printed circuit board (PCB). The microprocessor 3210, the power supply 3220, the function unit 3230, and the display controller 3240 may be mounted or installed on the body unit 3200.

The microprocessor 3210 may receive a voltage from the power supply 3220 to control the function unit 3230 and the display controller 3240. The power supply 3220 may receive a constant voltage from an external power source, etc., divide the voltage into various voltage levels, and supply those voltages to the microprocessor 3210, the function unit 3230, the display controller 3240, etc.

The power supply 3220 may include a power management IC (PMIC). The PMIC may effectively supply a voltage to the microprocessor 3210, the function unit 3230, the display controller 3240, etc.

The function unit 3230 may perform various functions in the mobile system 3000. For example, the function unit 3230 may have several components which can perform functions in wireless communication such as dialing, video output to the display unit 3100 through communication with an external apparatus 3300, and sound output to a speaker, etc. For example, the function unit 3230 may function as an image processor of a camera.

When the mobile system 3000 is connected to a memory card, etc. in order to expand capacity, the function unit 3230 may function as a memory card controller. When the mobile system 3000 further includes a universal serial bus (USB), etc. in order to expand functionality, the function unit 3230 may function as an interface controller.

The microprocessor 3210, the power supply 3220, and the function unit 3230 may include a semiconductor device in accordance with various embodiments of the inventive concept. Accordingly, reliability can be improved in the mobile system 3000 in accordance with the embodiments of the inventive concept.

Figure 47:
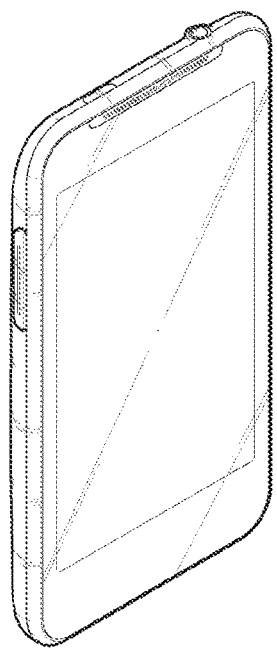
FIG. 47 is a schematic diagram showing a mobile apparatus including a semiconductor device in accordance with an embodiment of the inventive concept.

FIG. 47 is a schematic diagram showing a mobile apparatus including a semiconductor device in accordance with an embodiment of the inventive concept.

Referring to FIG. 47, the mobile apparatus 4000 may be a mobile wireless phone. The mobile apparatus 4000 may be interpreted as a tablet PC. The mobile apparatus 4000 may include a semiconductor device in accordance with various embodiments of the inventive concept. Accordingly, reliability can be improved in the mobile apparatus 4000 in accordance with the embodiments of the inventive concept.

Figure 48:
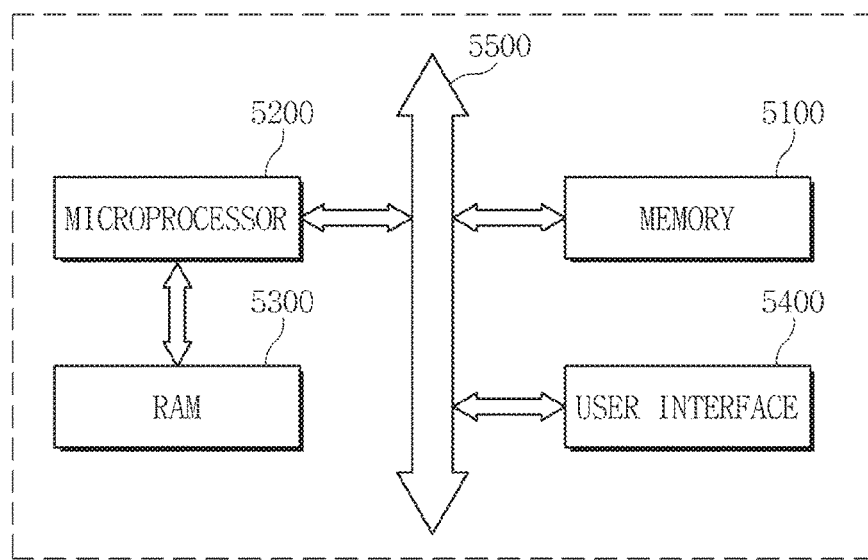
FIG. 48 is a configuration diagram showing an electronic system including a semiconductor device in accordance with an embodiment of the inventive concept.

FIG. 48 is a configuration diagram showing an electronic system including a semiconductor device in accordance with an embodiment of the inventive concept.

Referring to FIG. 48, the electronic system 5000 may include a memory 5100, a microprocessor 5200, a random access memory (RAM) 5300, and a user interface 5400. The electronic system 5000 may be a system of an LED illumination apparatus, a refrigerator, an air conditioner, an industrial cutting machine, a welding machine, an automobile, a ship, an aircraft, a satellite, etc.

The memory 5100 may store codes for booting the microprocessor 5200, data processed by the microprocessor 5200, or external input data. The memory 5100 may include a controller and a memory.

The microprocessor 5200 may program and control the electronic system 5000. The RAM 5300 may be used as an operational memory of the microprocessor 5200.

The user interface 5400 may perform data communication using a bus 5500. The user interface 5400 may be used to input data to, or output data from the electronic system 5000.

The memory 5100, a microprocessor 5200, and the RAM may include a semiconductor device in accordance with various embodiments of the inventive concept. Accordingly, reliability of the memory 5100, the microprocessor 5200, and the RAM can be improved in the electronic system 5000 in accordance with the embodiments of the inventive concept.

In a semiconductor device in accordance with the embodiment of the inventive concept, air-gaps located on side surfaces of the bit line structure may be surrounded by bit line spacers. Accordingly, in the semiconductor device in accordance with the embodiment of the inventive concept, air-gaps can be formed with no damage to a storage contact plug. In addition, in the semiconductor device in accordance with the embodiment of the inventive concept, inflow or penetration of a material of another component into air-gaps can be prevented. Accordingly, reliability can be improved in the semiconductor device in accordance with the embodiment of the inventive concept.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device, comprising:
   a bit line structure extending in a first direction;
   an inner bit line spacer extending in the first direction, the inner bit line spacer disposed on a side surface of the bit line structure;
   a block bit line spacer extending in the first direction, the block bit line spacer spaced apart from the inner bit line spacer in a second direction perpendicular to the first direction, and a region interposed in the second direction between the block bit line spacer and the inner bit line spacer being unoccupied such that an air-gap exists in the region between the inner bit line spacer and the block bit line spacer,
   wherein a profile of a first side surface of the block bit line spacer facing the inner bit line spacer is different from a profile of a second side surface of the block bit line spacer opposite the first side surface of the block bit line spacer.

2. The semiconductor device of claim 1, wherein the second side surface of the block bit line spacer is parallel to a side surface of the inner bit line spacer facing the first side surface of the block bit line spacer.

3. The semiconductor device of claim 1, further comprising:
   a storage contact plug disposed on the second side surface of the block bit line spacer; and
   a plug isolation pattern disposed on the second side surface of the block bit line spacer, the plug isolation pattern aligned with the storage contact plug in the first direction,
   wherein a horizontal length of a first part of the block bit line spacer disposed between the air-gap and the storage contact plug in the second direction is greater than a horizontal length of a second part of the block bit line spacer disposed between the air-gap and the plug isolation pattern in the second direction.

4. The semiconductor device of claim 3, wherein a horizontal length of the air-gap disposed between the inner bit line spacer and the first part of the block bit line spacer in the second direction is smaller than a horizontal length of the air-gap disposed between the inner bit line spacer and the second part of the block bit line spacer in the second direction.

5. The semiconductor device of claim 3, wherein the horizontal length of the first part of the block bit line spacer in the second direction is smaller than the horizontal length of the air-gap disposed between the inner bit line spacer and the first part of the block bit line spacer in the second direction.

6. The semiconductor device of claim 1, wherein the bit line structure includes a lower bit line barrier pattern, an upper bit line barrier pattern, a lower bit line electrode, a DC plug, an intermediate bit line pattern, an upper bit line electrode and a bit line capping pattern.

7. The semiconductor device of claim 1, wherein the block bit line spacer has a planar horizontal upper surface, and a planar horizontal lower surface such that the upper and lower surfaces of the block bit line spacer are parallel.

8. A semiconductor device, comprising:
   a bit line structure extending in a first direction;
   an inner bit line spacer extending in the first direction, the inner bit line spacer disposed on a side surface of the bit line structure, the inner bit line spacer having an inner side surface facing the bit line structure and an outer side surface opposite the inner side surface; and
   a block bit line spacer extending in the first direction, the block bit line spacer having a first side surface facing the inner bit line spacer in a second direction perpendicular to the first direction and a second side surface opposite the first side surface, and the first side surface of the block bit line spacer being spaced apart from the outer surface of the inner bit line spacer in the second direction, and
   wherein an air-gap is present, as extending in the first direction, between the outer side surface of the inner bit line spacer and the first side surface of the block bit line spacer, and
   wherein a profile of the first side surface of the block bit line spacer facing the inner bit line spacer is different from a profile of the second side surface of the block bit line spacer opposite the first side surface of the block bit line spacer.

9. The semiconductor device of claim 8, wherein the second side surface of the block bit line spacer is parallel to a side surface of the inner bit line spacer facing the first side surface of the block bit line spacer.

10. The semiconductor device of claim 8, further comprising:
    a storage contact plug disposed on the second side surface of the block bit line spacer; and
    a plug isolation pattern disposed on the second side surface of the block bit line spacer, the plug isolation pattern aligned with the storage contact plug in the first direction,
    wherein a horizontal length of a first part of the block bit line spacer disposed between the air-gap and the storage contact plug in the second direction is greater than a horizontal length of a second part of the block bit line spacer disposed between the air-gap and the plug isolation pattern in the second direction.

11. The semiconductor device of claim 10, wherein a horizontal length of the air-gap disposed between the inner bit line spacer and the first part of the block bit line spacer in the second direction is smaller than a horizontal length of the air-gap disposed between the inner bit line spacer and the second part of the block bit line spacer in the second direction.

12. The semiconductor device of claim 10, wherein the horizontal length of the first part of the block bit line spacer in the second direction is smaller than the horizontal length of the air-gap disposed between the inner bit line spacer and the first part of the block bit line spacer in the second direction.

13. The semiconductor device of claim 8, wherein the bit line structure includes a lower bit line barrier pattern, an upper bit line barrier pattern, a lower bit line electrode, a DC plug, an intermediate bit line pattern, an upper bit line electrode and a bit line capping pattern.

14. The semiconductor device of claim 8, wherein the block bit line spacer has a planar horizontal upper surface, and a planar horizontal lower surface such that the upper and lower surfaces of the block bit line spacer are parallel.

* * * * *